United States Patent
Oomori et al.

(10) Patent No.: US 11,495,527 B2
(45) Date of Patent: Nov. 8, 2022

(54) SEMICONDUCTOR MODULE

(71) Applicant: SUMITOMO ELECTRIC INDUSTRIES, LTD., Osaka (JP)

(72) Inventors: Hirotaka Oomori, Osaka (JP); Satoshi Hatsukawa, Osaka (JP); Takashi Tsuno, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 131 days.

(21) Appl. No.: 17/264,934

(22) PCT Filed: Aug. 16, 2018

(86) PCT No.: PCT/JP2018/030445
§ 371 (c)(1),
(2) Date: Feb. 1, 2021

(87) PCT Pub. No.: WO2020/035931
PCT Pub. Date: Feb. 20, 2020

(65) Prior Publication Data
US 2021/0320055 A1 Oct. 14, 2021

(51) Int. Cl.
*H01L 23/057* (2006.01)
*H01L 23/498* (2006.01)
*H01L 23/31* (2006.01)
*H01L 25/07* (2006.01)
*H01L 25/18* (2006.01)

(52) U.S. Cl.
CPC ...... *H01L 23/49811* (2013.01); *H01L 23/057* (2013.01); *H01L 23/3121* (2013.01); *H01L 25/072* (2013.01); *H01L 25/18* (2013.01)

(58) Field of Classification Search
CPC .......... H01L 21/6835; H01L 21/02274; H01L 21/3065; H01L 21/67353; H01L 21/68707; H01L 21/67363; H05H 1/00
See application file for complete search history.

(56) References Cited

U.S. PATENT DOCUMENTS

| | | |
|---|---|---|
| 5,471,089 A | 11/1995 | Nagatomo et al. |
| 8,035,982 B2 | 10/2011 | Kontani et al. |
| 9,147,666 B2 | 9/2015 | Yoshihara et al. |

FOREIGN PATENT DOCUMENTS

| | | |
|---|---|---|
| JP | H06-021323 | 1/1994 |
| JP | 2004-214452 | 7/2004 |
| JP | 2007-312523 | 11/2007 |
| JP | 2009-213268 | 9/2009 |
| JP | 2015-035627 | 2/2015 |

*Primary Examiner* — Elias Ullah
(74) *Attorney, Agent, or Firm* — IPUSA, PLLC

(57) ABSTRACT

A semiconductor module includes a base member including a circuit board on which a positive electrode pad and a negative electrode pad are provided and on which a semiconductor device is mounted to be electrically coupled to the positive electrode pad and the negative electrode pad, a housing that is attached to the base member so as to surround the positive electrode pad and the negative electrode pad, the housing being formed in a frame shape, a first electrode plate that is electrically coupled to the positive electrode pad, the first electrode plate having a flat plate portion, and a second electrode plate that is electrically coupled to the negative electrode pad, the second electrode plate having a flat plate portion. The flat plate portion of the first electrode plate and the flat plate portion of the second electrode plate are arranged in a parallel-plate configuration within the housing.

13 Claims, 44 Drawing Sheets

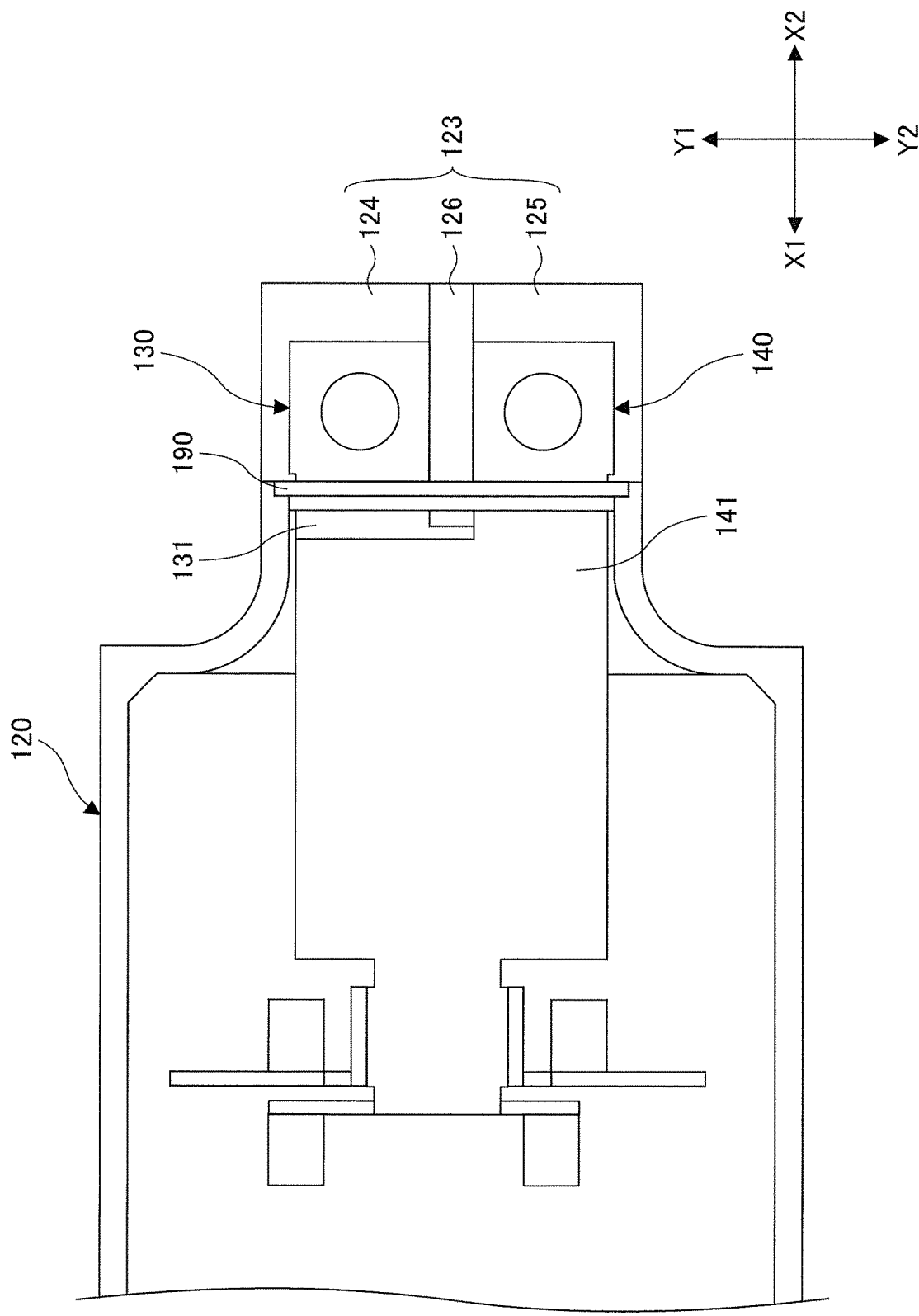

SEMICONDUCTOR MODULE

TECHNICAL FIELD

The present disclosure relates to a semiconductor module.

BACKGROUND ART

A semiconductor module is a device that obtains an output from between a pair of semiconductor devices by connecting the pair of semiconductor devices in series to a power supply and causing the pair of semiconductor devices to be switched on or off. The semiconductor module including semiconductor devices in which a great current flows is used in an electric vehicle, a power application, and the like. In such a semiconductor module, it is known that when a transistor, which is a semiconductor device, is turned on or turned off, a surge voltage is generated between a positive input terminal and a negative input terminal of a power conversion circuit.

RELATED ART DOCUMENTS

Patent Documents

[Patent Document 1] Japanese Laid-open Patent Publication No. 2015-35627

SUMMARY OF THE INVENTION

According to one aspect of the present embodiment, a semiconductor module includes a base member including a circuit board on which a positive electrode pad and a negative electrode pad are provided and on which a semiconductor device is mounted to be electrically coupled to the positive electrode pad and the negative electrode pad, and a housing that is attached to the base member so as to surround the positive electrode pad and the negative electrode pad, the housing being formed in a frame shape. The semiconductor module further includes a first electrode plate that is electrically coupled to the positive electrode pad, the first electrode plate having a flat plate portion, and a second electrode plate that is electrically coupled to the negative electrode pad, the second electrode plate having a flat plate portion. The flat plate portion of the first electrode plate and the flat plate portion of the second electrode plate are arranged in a parallel-plate configuration within the housing.

BRIEF DESCRIPTION OF THE DRAWINGS

FIG. 51 is an explanatory drawing of a positional relation between the P electrode and the N electrode of the second embodiment of the present disclosure.

EMBODIMENT FOR CARRYING OUT THE INVENTION

Figure 1:
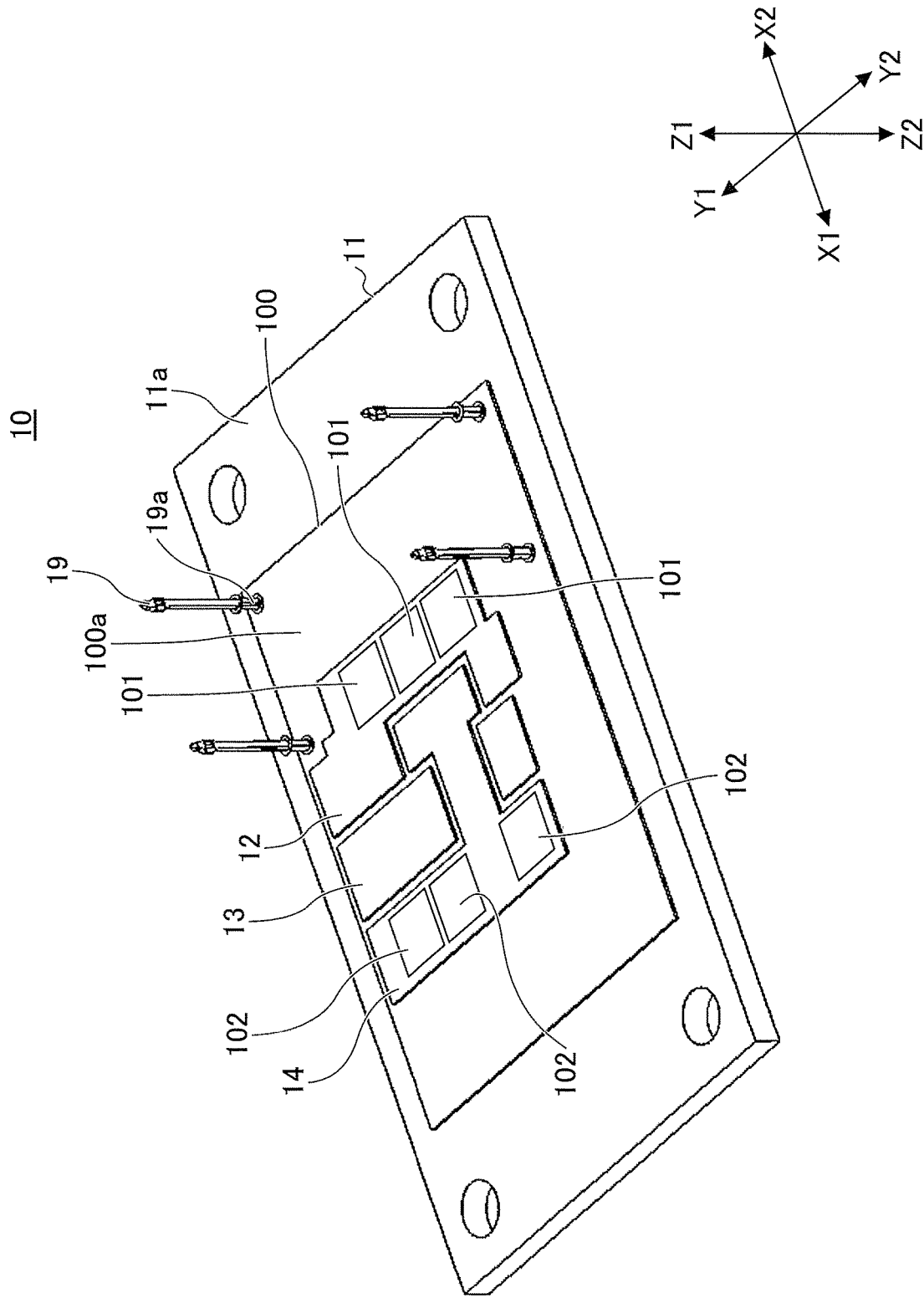
FIG. 1 is a perspective view of a base member of the present disclosure.

Embodiments will be described below.

[Description of Embodiments of the Present Disclosure]

First, the embodiments of the present disclosure will be described by listing. In the following description, the same or corresponding elements are referenced by the same reference numerals and the same description is not repeated for the same or corresponding elements.

[1] A semiconductor module according to one embodiment of the present disclosure includes a base member including a circuit board on which a positive electrode pad and a negative electrode pad are provided and on which a semiconductor device is mounted to be electrically coupled to the positive electrode pad and the negative electrode pad, a housing that is attached to the base member so as to surround the positive electrode pad and the negative electrode pad, the housing being formed in a frame shape, a first electrode plate that is electrically coupled to the positive electrode pad, the first electrode plate having a flat plate portion, and a second electrode plate that is electrically coupled to the negative electrode pad, the second electrode plate having a flat plate portion. The flat plate portion of the first electrode plate and the flat plate portion of the second electrode plate are arranged in a parallel-plate configuration within the housing.

In a semiconductor module, it is known that when a transistor, which is a semiconductor device, is turned on or turned off, a surge voltage is generated between a positive input terminal and a negative input terminal of a power conversion circuit. In such a semiconductor module, reducing the surge voltage is a problem to be solved. The inventors have found that a first electrode plate that is a positive electrode, and a second electrode plate that is a negative electrode, are arranged in a parallel-plate configuration so as to generate mutual inductance between the first electrode plate and the second first electrode plate. By generating the mutual inductance in such a manner, the inductance of the semiconductor module can be reduced, and thereby reducing the surge voltage.

[2] A flat plate portion of the first electrode plate and a flat plate portion of the second electrode plate extend outside of the housing, and the flat plate portion of the first electrode plate and the flat plate portion of the second electrode plate are also arranged in a parallel-plate configuration outside the housing.

[3] A spacer formed of an insulator is provided between the flat plate portion of the first electrode plate and the flat plate portion of the second electrode plate outside the housing.

[4] The flat plate portion of the first electrode plate and the flat plate portion of the second electrode plate extend to the outside of the housing, and the flat plate portion of the first electrode plate and the flat plate portion of the second electrode plate do not overlap outside the housing in a top view.

[5] The housing is filled with an insulating resin material. A cutout portion is provided in the housing, the first electrode plate and the second electrode plate extend to the outside of the housing through the cutout portion, and a blocking member is attached to the housing. The blocking member covers the cutout portion into which the first electrode plate and the second electrode plate are inserted and blocks the flow of the resin material supplied into the housing.

[6] An insulating member is provided between the flat plate portion of the first electrode plate and the flat plate portion of the second electrode plate within the housing.

[7] The semiconductor device is formed of a material including silicon carbide.

[8] A semiconductor module according to one embodiment of the present disclosure includes a base member including a circuit board on which a positive electrode pad and a negative electrode pad are provided and on which a semiconductor device is mounted to be electrically coupled to the positive electrode pad and the negative electrode pad, and a housing that is attached to the base member so as to surround the positive electrode pad and the negative electrode pad, the housing being formed in a frame shape. The semiconductor module further includes a first electrode plate that is electrically coupled to the positive electrode pad, the first electrode plate having a flat plate portion, and a second electrode plate that is electrically coupled to the negative electrode pad, the second electrode plate having a flat plate portion. The flat plate portion of the first electrode plate and the flat plate portion of the second electrode plate are arranged in a parallel-plate configuration within the housing.

The flat plate portion of the first electrode plate and the flat plate portion of the second electrode plate extend outside of the housing, and the flat plate portion of the first electrode plate and the flat plate portion of the second electrode plate are also arranged in a parallel-plate configuration outside the housing. An insulating spacer is provided between the flat plate portion of the first electrode plate and the flat plate portion of the second electrode plate outside the housing. An insulating member is provided between the flat plate portion of the first electrode plate and the flat plate portion of the second electrode plate within the housing.

[9] A semiconductor module according to one embodiment of the present disclosure includes a base member including a circuit board on which a positive electrode pad and a negative electrode pad are provided and on which a semiconductor device is mounted to be electrically coupled to the positive electrode pad and the negative electrode pad, and a housing that is attached to the base member so as to surround the positive electrode pad and the negative electrode pad, the housing being formed in a frame shape. The semiconductor module further includes a first electrode plate that is electrically coupled to the positive electrode pad, the first electrode plate having a flat plate portion, and a second electrode plate that is electrically coupled to the negative electrode pad, the second electrode plate having a flat plate portion. The flat plate portion of the first electrode plate and the flat plate portion of the second electrode plate are arranged in a parallel-plate configuration within the housing. The flat plate portion of the first electrode plate and the flat plate portion of the second electrode plate extend outside of the housing, and the flat plate portion of the first electrode plate and the flat plate portion of the second electrode plate do not overlap outside the housing in a top view. The housing is filled with an insulating resin material. A cutout portion is provided in the housing. The first electrode plate and the second electrode plate extend to the outside of the housing through the cutout portion. A blocking member is attached to the housing. The blocking member covers the cutout portion into which the first electrode plate and the second electrode plate are inserted and blocks the flow of the resin material supplied into the housing. An insulating member is provided between the flat plate portion of the first electrode plate and the flat plate portion of the second electrode plate within the housing.

[Detailed Description of Embodiment of the Present Disclosure]

Although one embodiment of the present disclosure will be described in detail, the embodiment is not limited to this. In the present disclosure, the X1-X2 direction, the Y1-Y2 direction, and the Z1-Z2 direction are orthogonal to each other. Additionally, a surface including the X1-X2 direction and the Y1-Y2 direction is described as an XY plane, a surface including the Y1-Y2 direction and the Z1-Z2 direction is described as a YZ plane, and a surface including the Z1-Z2 direction and the X1-X2 direction is described as the ZX plane.

First, a semiconductor module including a semiconductor device in which a great current flows will be described. In the semiconductor module that is a power module, a semiconductor device formed of silicon (Si) has been used for a switching device in which a great current flows. However, further improvements in the characteristics of the switching device have been required.

Because a semiconductor device formed of silicon carbide (SiC) can perform switching at a high speed, on/off operations can be performed at a high speed, so that the flow of current is rapidly reduced upon the off operation, thereby reducing switching loss.

However, high speed switching of the semiconductor device formed of SiC causes a new problem of an increased surge voltage upon switching. Specifically, the surge voltage V magnitude is calculated by V=L×di/dt where i is a current and L is an inductance. The value of di/dt depends on the switching speed of the transistor, which is a semiconductor device, and the value of di/dt increases as the switching speed increases. Because a semiconductor device formed of SiC can perform switching at a higher speed than a semiconductor device formed of the Si, the value of di/dt increases, and consequently, the surge voltage V increases. It is undesirable to have the surge voltage V exceed the withstand voltage of the semiconductor device, because the semiconductor device may be destroyed.

The purpose of the present disclosure is to reduce a surge voltage in a semiconductor module using a semiconductor device formed of SiC, without decreasing a switching speed.

Specifically, as described above, the surge voltage V is obtained by V=L×di/dt. However, because the value of di/dt cannot be reduced when high speed switching is maintained, the surge voltage V is reduced by decreasing the value of the inductance L.

First Embodiment

Figure 2:
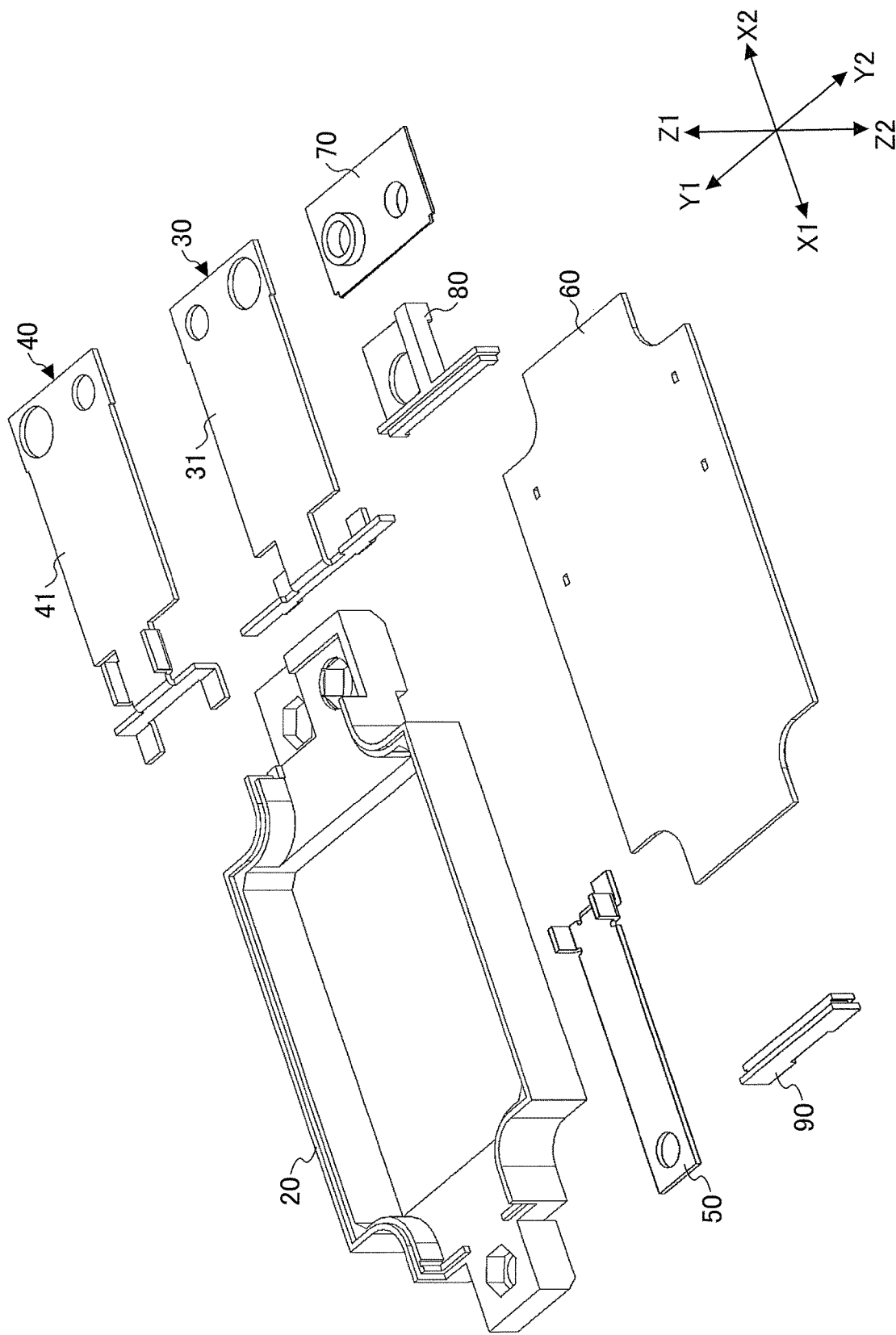
FIG. 2 is an explanatory drawing of members constituting a semiconductor module of a first embodiment of the present disclosure.
Figure 3:
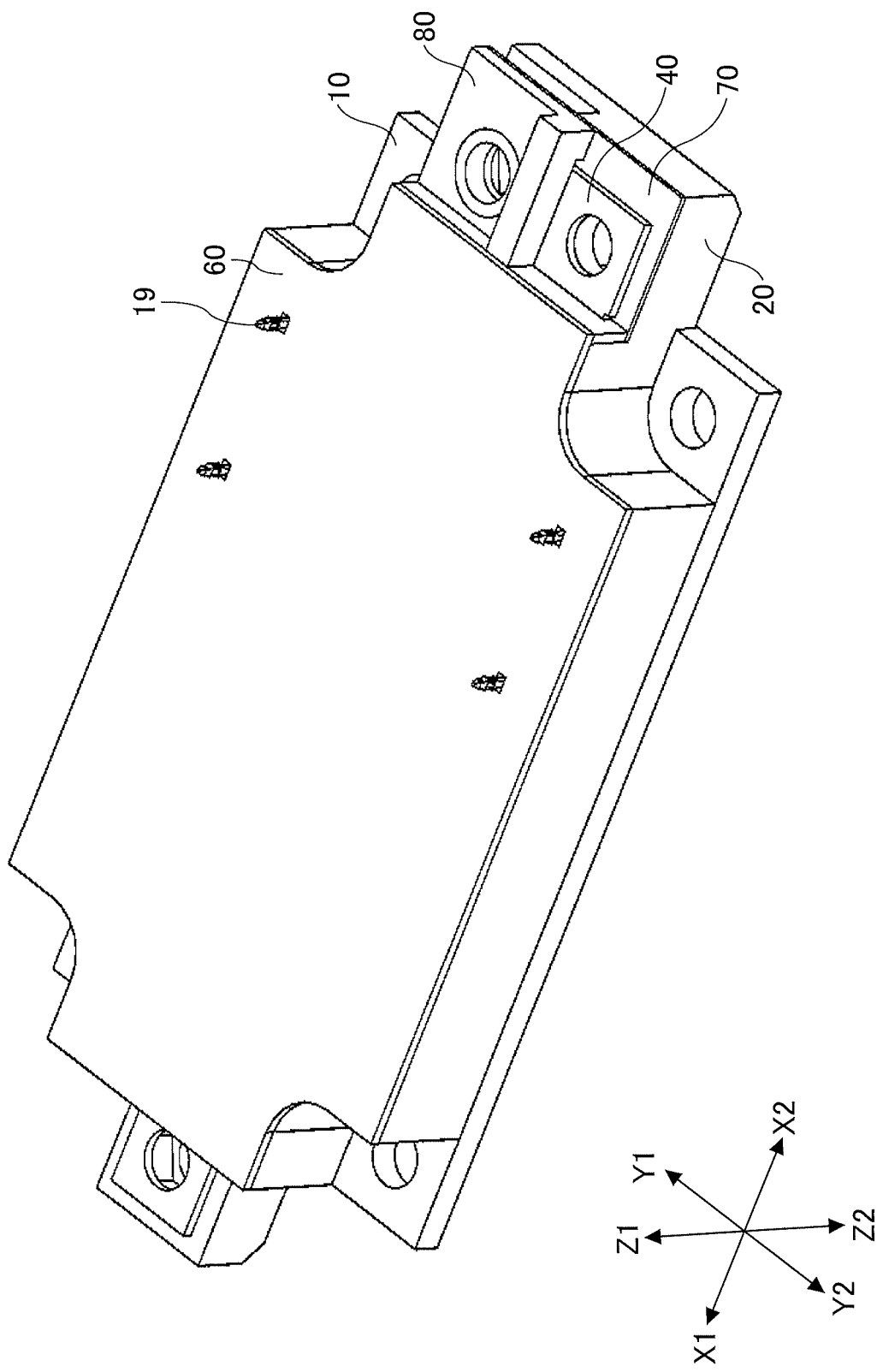
FIG. 3 is a perspective view of the semiconductor module of the first embodiment of the present disclosure.
Figure 4:
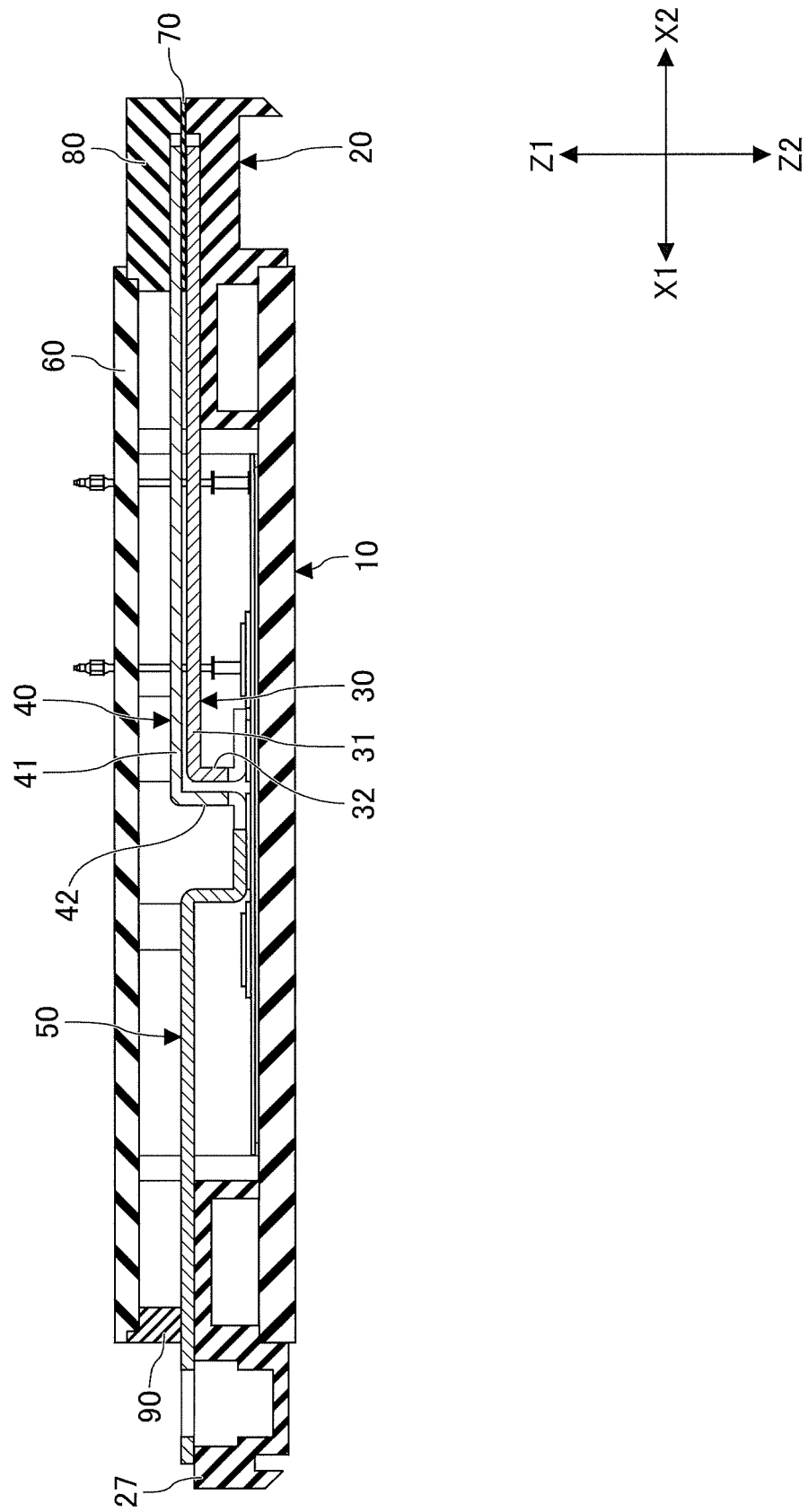
FIG. 4 is an explanatory drawing of an internal structure of the semiconductor module of the first embodiment of the present disclosure.
Figure 5:
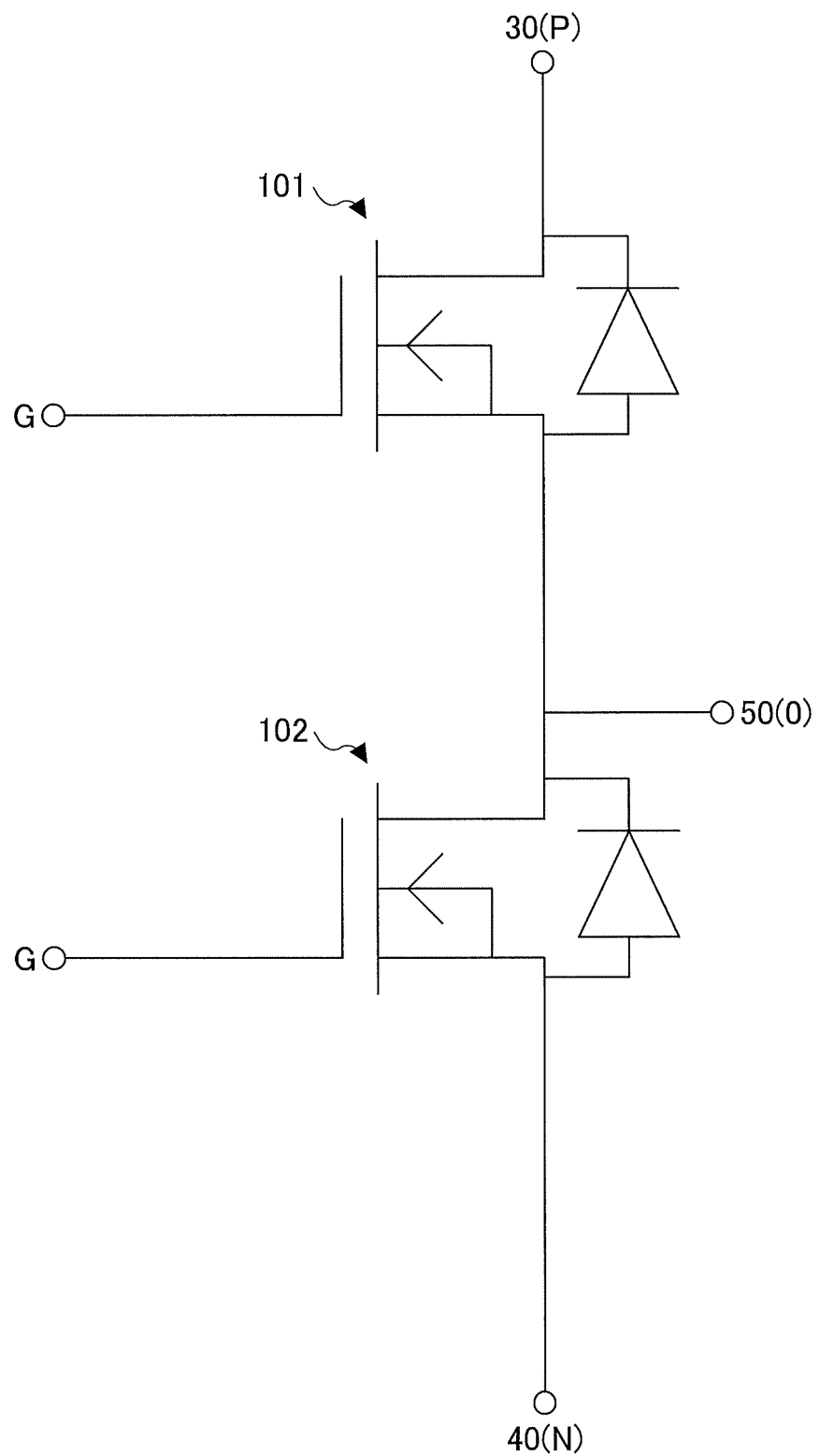
FIG. 5 is an equivalent circuit diagram of a main part of the semiconductor module of the present disclosure.

A semiconductor module according to a first embodiment will be described. The semiconductor module according to the present embodiment includes a base member 10 illustrated in FIG. 1, and a housing 20, a P electrode plate 30, an N electrode plate 40, an O electrode plate 50, a lid 60, a spacer 70, a cover 80, a blocking member 90, and the like illustrated in FIG. 2. The semiconductor module according to the present embodiment is formed of these components. FIG. 3 is a perspective view of the semiconductor module according to the present embodiment, FIG. 4 is a cross-sectional view illustrating an internal structure, and FIG. 5 is an equivalent circuit diagram of a main part.

The semiconductor module according to the present embodiment is used, for example, in an inverter circuit constituting a driving circuit for driving an electric motor. The electric motor is used as a power source for, for example, electric vehicles (including hybrid vehicles), electric trains, industrial robots, and the like. The semiconductor module is also applicable to an inverter circuit that converts power generated by solar cells, wind power generators, and other generators (particularly private power generators) to match power of a commercial power supply.

As illustrated in FIG. 1, the base member 10 includes a base plate 11 and a circuit board 100. The base plate 11 has a rectangular shape and is formed of a metal such as copper. The circuit board 100 is disposed on a front surface 11a of the base plate 11. The circuit board 100 includes an insulating ceramic and copper foils provided on both sides of the ceramic. A P electrode pad 12, an N electrode pad 13, an O electrode pad 14, and an interconnect pattern are formed on a front surface 100a of the circuit board 100. Multiple first transistors 101 are mounted to be electrically coupled to the P electrode pad 12, and multiple second transistors 102 are mounted to be electrically coupled to the O electrode pad 14.

The first transistor 101 and the second transistor 102 are vertical transistors formed of SiC, and the chip size is, for example, a square of 6 mm per side. In the present embodiment, the first transistor 101 and the second transistor 102 are metal-oxide-semiconductor field-effect transistors having the same structure. The first transistor 101 and the second transistor 102 may be insulated gate bipolar transistors (IGBTs), or the like. The first transistor 101 and the second transistor 102 may be formed of a wide band gap semiconductor such as GaN or Si, but are preferably formed of SiC.

A drain electrode on a back surface of the first transistor 101 is mounted on the P electrode pad 12 and the first transistor 101 is electrically coupled through solder or a sintered material. A gate electrode on a front surface of the first transistor 101 is electrically coupled to control wiring of the first transistor 101 through a bonding wire, and a source electrode is electrically coupled to the O electrode pad 14 through a bonding wire.

A drain electrode on a back surface of the second transistor 102 is mounted on the O electrode pad 14 and the second transistor 102 is electrically coupled through solder or a sintered material. A gate electrode on a front surface of the second transistor 102 is electrically coupled to control wiring of the second transistor 102 through a bonding wire, and a source electrode is electrically coupled to the N electrode pad 13 through a bonding wire. In the drawings of the present disclosure, for convenience, bonding wires, bonding pads, interconnects, and the like are omitted.

The base member 10 is also provided with multiple press-fit pins 19 for electrically coupling the interconnects in the circuit board 100 to the outside. Each press-fit pin 19 is inserted in a press-fit pin holder 19a that is joined to the interconnect of the circuit board 100 by solder or the like, and is electrically coupled to a corresponding interconnect.

In the semiconductor module according to the present embodiment, as described later, the P electrode plate 30 is coupled to the P electrode pad 12, the N electrode plate 40 is coupled to the N electrode pad 13, and the O electrode plate 50 is coupled to the O electrode pad 14. A positive voltage is applied to the P electrode plate 30, a negative voltage is applied to the N electrode plate 40, and an output is obtained from the O electrode plate 50 by alternately applying a predetermined gate voltage to the gates of the first transistor 101 and the second transistor 102. As illustrated in FIG. 4, a flat plate portion 31 parallel to the XY plane of the P electrode plate 30 and a flat plate portion 41 parallel to the XY plane of the N electrode plate 40 are arranged so that surfaces parallel to the respective XY planes face each other to be parallel plates. Additionally, a state in which the flat plate portion 31 of the P electrode plate 30 and the flat plate portion 41 of the N electrode plate 40 are parallel plates continues from the inside of the housing 20 to the outside on an X2 side. In the present disclosure, an area surrounded by a frame of the housing 20, a blocking portion 81 of the cover 80, which will be described later, and the blocking member 90 is described as the inside of the housing 20, and the outside of the frame of the housing 20, the blocking portion 81 of the cover 80, and the blocking member 90 is described as the outside of the housing 20.

Figure 6:
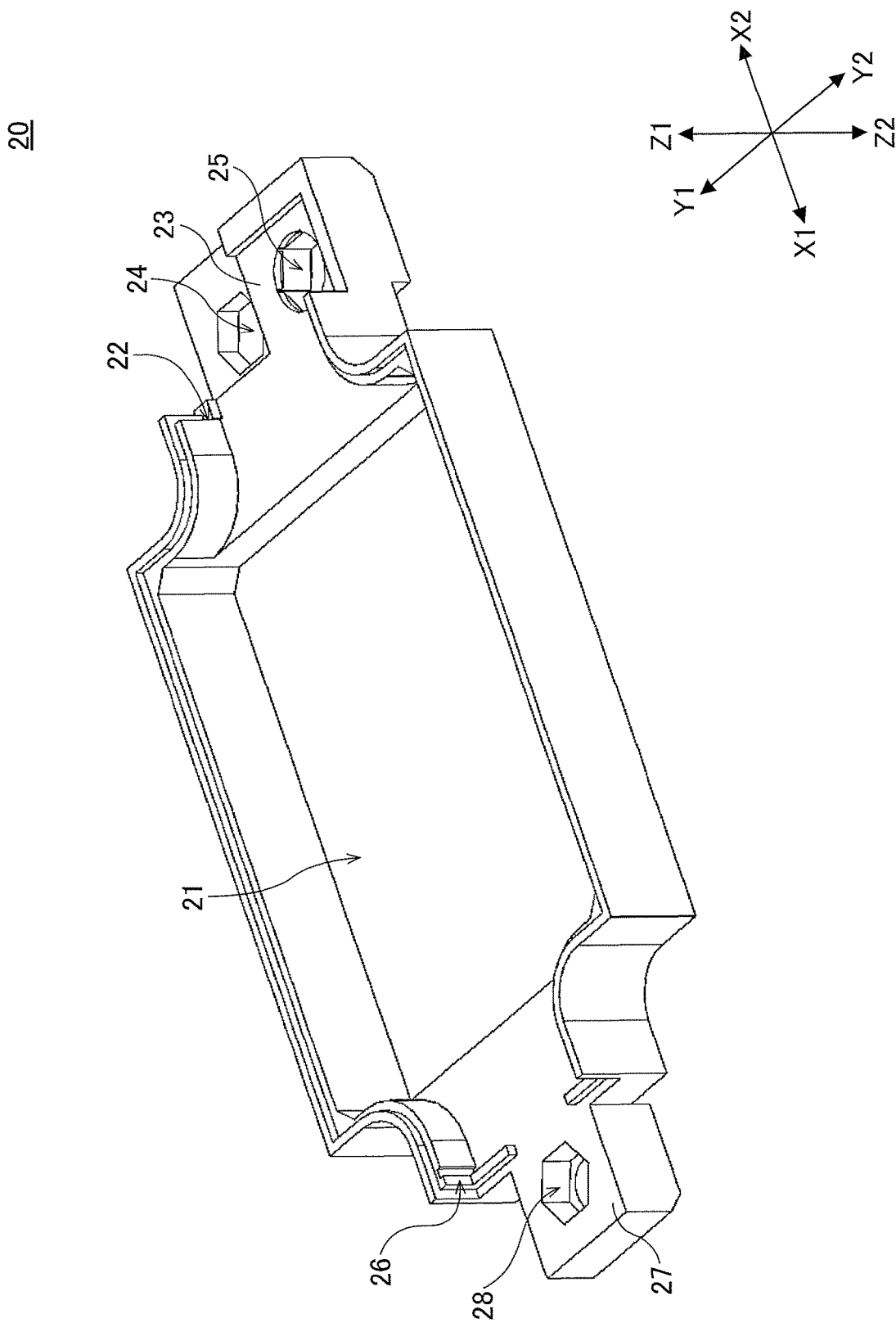
FIG. 6 is a perspective view of a housing of the first embodiment of the present disclosure.

As illustrated in FIG. 6, the housing 20 has a frame shape with an opening 21 passing through a central portion in the Z1-Z2 direction and is enclosed in the Y1-Y2 direction and the X1-X2 direction. A cutout portion 22 is formed on the X2 direction side of the housing 20 by cutting out a portion of the frame, and a supporting portion 23 extending in the X2 direction is provided on the X2 side from the cutout portion 22. A hexagonal hole 24 into which a nut (which is not illustrated) is to be inserted is provided in the supporting portion 23 on the Y1 side, and a hexagonal hole 25 into which a nut (which is not illustrated) is to be inserted is provided in the supporting portion 23 on the Y2 side. On the X1 side, a cutout portion 26 is formed by cutting out a portion of the frame. A supporting portion 27 extending in the X1 direction is provided on the X1 direction side from the cutout portion 26, and a hexagonal hole 28 into which a nut (which is not illustrated) is to be inserted is provided in the supporting portion 27.

Figure 7:
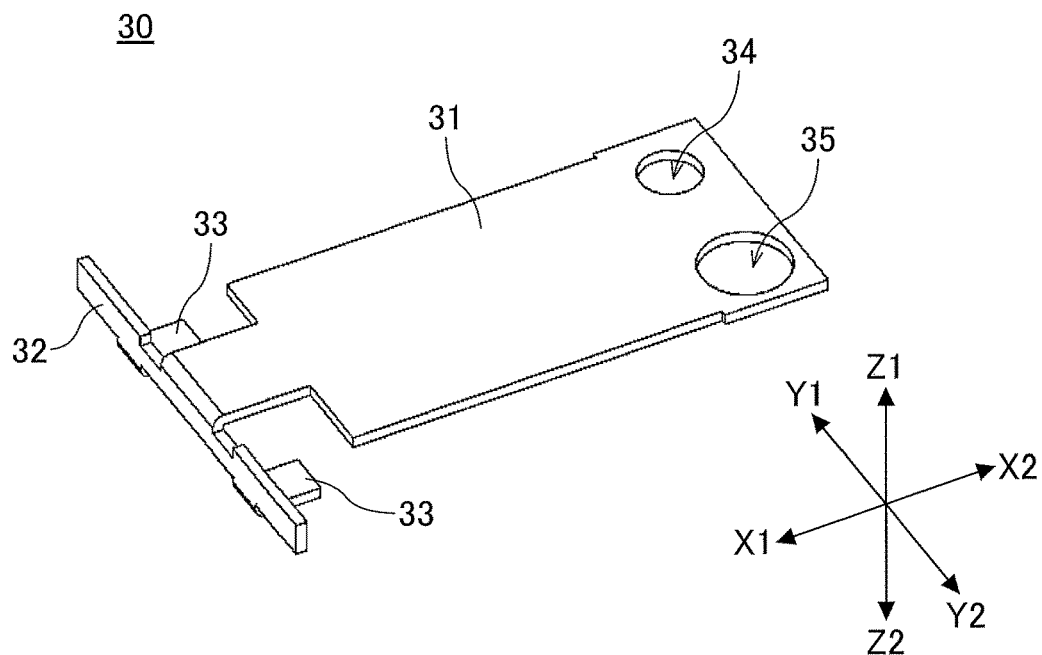
FIG. 7 is a perspective view of a P electrode of the first embodiment of the present disclosure.
Figure 8:
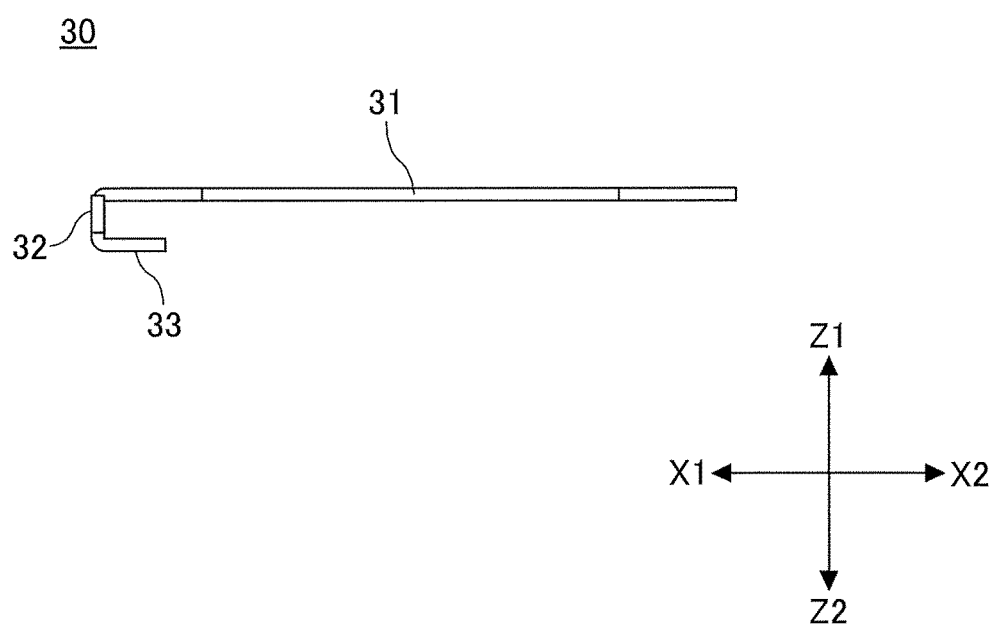
FIG. 8 is a side view of the P electrode of the first embodiment of the present disclosure.

As illustrated in FIG. 7 and FIG. 8, the P electrode plate 30 is formed by machining a metal plate such as copper having a thickness of approximately 1 mm, and the X1-X2 direction is a longitudinal direction of the P electrode plate 30. FIG. 7 is a perspective view of the P electrode plate 30 and FIG. 8 is a side view of the P electrode plate 30. The P electrode plate 30 has the flat plate portion 31 parallel to the XY plane, and an end portion of the P electrode plate 30 on the X1 direction side is bent twice substantially at a right angle along the Y1-Y2 direction, so that a vertical portion 32 and connecting portions 33 are formed in this order. The connecting portions 33 are regions to be connected to the P electrode pad 12, are formed by surfaces parallel to the XY plane, and are substantially parallel to the flat plate portion 31. The vertical portion 32 is formed between the flat plate portion 31 and the connecting portions 33 and has a surface parallel to the YZ plane. The connecting portion 33, which is an electrode terminal, may be formed, for example, in a shape of a square of 3 mm per side or a square of 4 mm per side. In the P electrode plate 30, a direction in which the vertical portion 32 is bent with respect to the flat plate portion 31 and a direction in which the connecting portion 33 is bent with respect to the vertical portion 32 are the same. In the flat plate portion 31 on the X2 direction side, a first through-hole 34 is provided on the Y1 side, and a second through-hole 35 is provided on the Y2 side. The first through-hole 34 and the second through-hole 35 are through-holes passing through the flat plate portion 31 in the Z1-Z2 direction and are both circular, but the second through-hole 35 is formed larger than the first through-hole 34, because an insulation separating portion of the spacer 70, which will be described later, is to be inserted.

Figure 9:
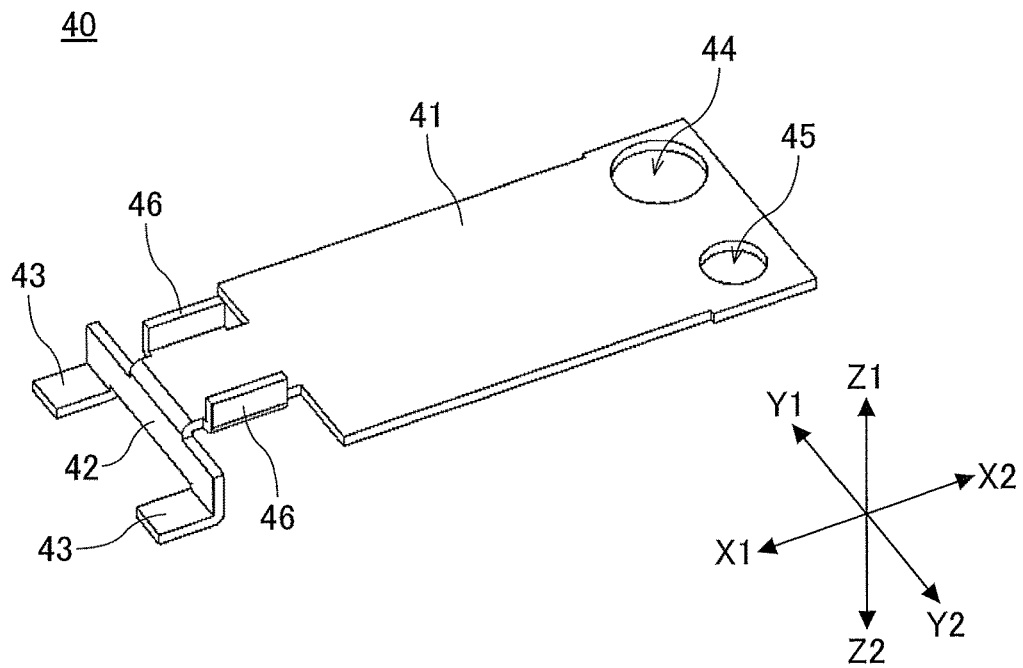
FIG. 9 is a perspective view of a N electrode of the first embodiment of the present disclosure.
Figure 10:
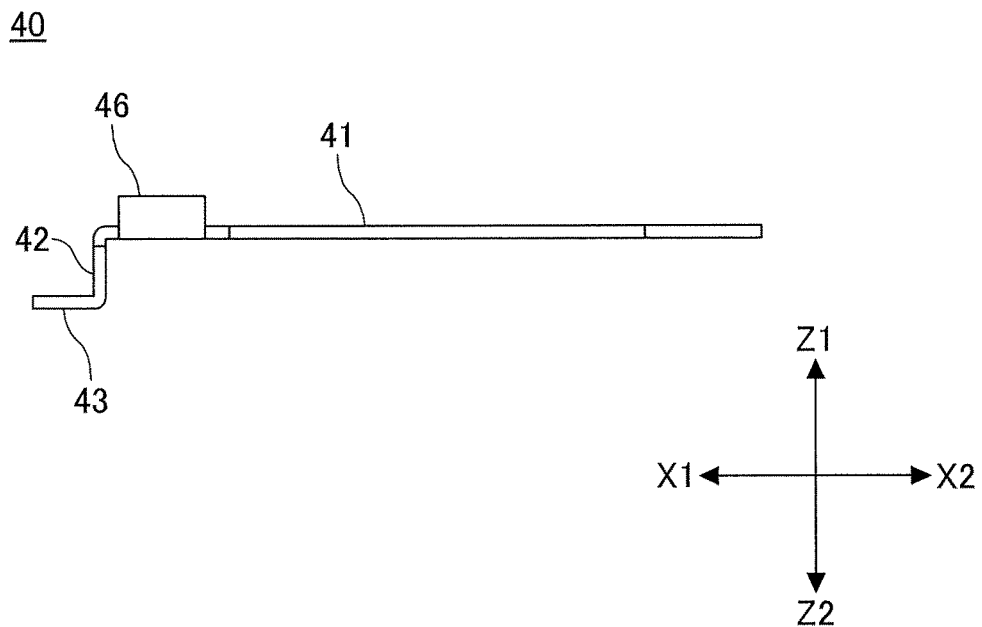
FIG. 10 is a side view of the N electrode of the first embodiment of the present disclosure.

As illustrated in FIG. 9 and FIG. 10, the N electrode plate 40 is formed by machining a metal plate such as copper having a thickness of approximately 1 mm, and the X1-X2 direction is a longitudinal direction of the N electrode plate 40. FIG. 9 is a perspective view of the N electrode plate 40 and FIG. 10 is a side view of the N electrode plate 40. The N electrode plate 40 has a flat plate portion 41 parallel to the XY plane, and an end portion of the N electrode plate 40 in the X1 direction is bent twice substantially at a right angle along the Y1-Y2 direction, so that a vertical portion 42 and connecting portions 43 are formed in this order. The connecting portions 43 are regions to be connected to the N electrode pad 13, are formed by surfaces parallel to the XY plane, and are substantially parallel to the flat plate portion 41. The vertical portion 42 is formed between the flat plate portion 41 and the connecting portions 43 and has a surface parallel to the YZ plane. The connecting portion 43, which is an electrode terminal, is formed, for example, in a shape of a square of 3 mm per side or a square of 4 mm per side. In the N electrode plate 40, a direction in which the vertical portion 42 is bent with respect to the flat plate portion 41 and a direction in which the connecting portion 43 is bent with respect to the vertical portion 42 are opposite. In the flat plate portion 41 on the X2 direction side, a first through-hole 44 is provided on the Y1 side, and a second through-hole 45 is provided on the Y2 side. The first through-hole 44 and the second through-hole 45 are through-holes passing through the flat plate portion 41 in the Z1-Z2 direction and are both circular, but the first through-hole 44 is formed larger than the second through-hole 45 because an insulation separating portion of the spacer 70, which will be described later, is to be inserted. In the flat plate portion 41 of the N electrode plate 40, bent portions 46 bent in the Z1 direction along the X1-X2 direction are formed on the Y1 direction side and the Y2 direction side in the proximity of the vertical portion 42. As the bent portions 46 can be held when the N electrode plate 40 is being attached, providing the bent portions 46 can facilitate an operation.

Figure 11:
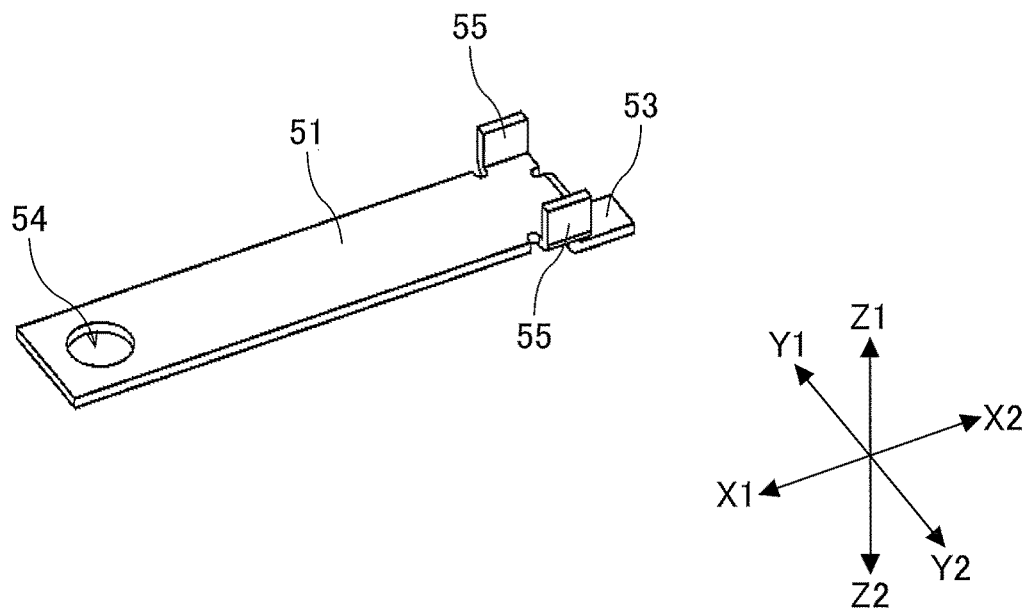
FIG. 11 is a perspective view of an O electrode of the present disclosure.
Figure 12:
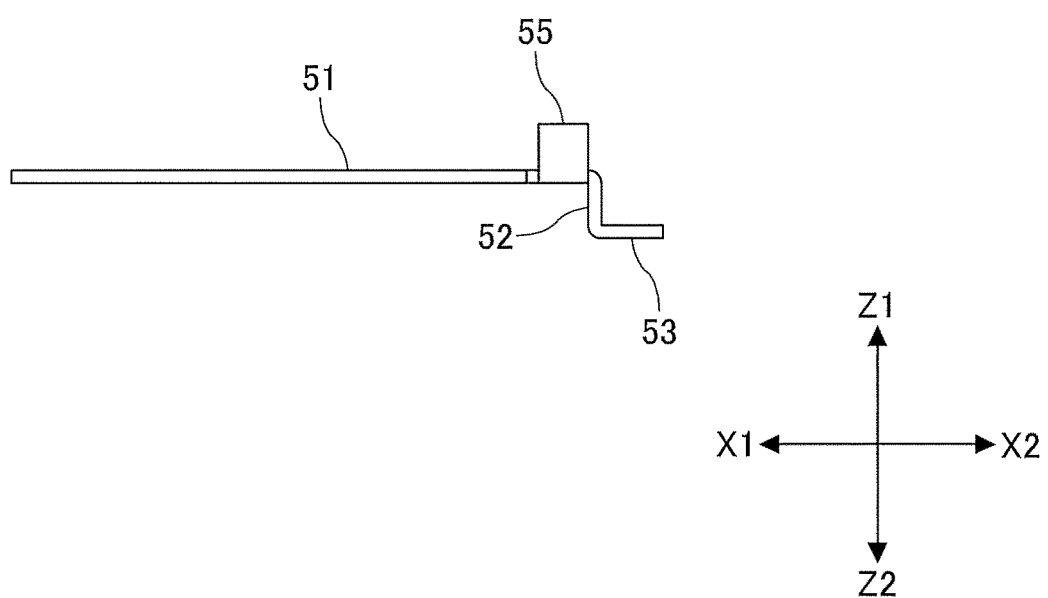
FIG. 12 is a side view of the O electrode of the present disclosure.

As illustrated in FIG. 11 and FIG. 12, the O electrode plate 50 is formed by machining a metal plate such as copper having a thickness of approximately 1 mm, and the X1-X2 direction is a longitudinal direction of the O electrode plate 50. FIG. 11 is a perspective view of the O electrode plate 50, and FIG. 12 is a side view of the O electrode plate 50. The O electrode plate 50 has a flat plate portion 51 parallel to the XY plane, and an end portion of the O electrode plate 50 on the X2 direction side is bent twice substantially at a right angle along the Y1-Y2 direction, so that a vertical portion 52 and a connecting portion 53 are formed in this order. The connecting portion 53 is a region for connecting to the O electrode pad 14, is formed by a surface parallel to the XY-plane, and is substantially parallel to the flat plate portion 51. The vertical portion 52 is formed between the flat plate portion 51 and the connecting portion 53 and has a surface parallel to the YZ plane. In the flat plate portion 51 on the X1 direction side, a circular through-hole 54 passing through the flat plate portion 51 in the Z1-Z2 direction is provided. The connecting portion 53, which is an electrode terminal, is formed, for example, in a shape of a square of 3 mm per side or a square of 4 mm per side. In the O electrode plate 50, a direction in which the vertical portion 52 is bent with respect to the flat plate portion 51 and a direction in which the connecting portion 53 is bent with respect to the vertical portion 52 are opposite. In the flat plate portion 51 of the O electrode plate 50, bent portions 55 bent in the Z1 direction along the X1-X2 direction are formed on the Y1 direction side and the Y2 direction side in the proximity of the vertical portion 52. As the bent portions 55 can be held when the O electrode plate 50 is being attached, providing the bent portions 55 can facilitate an operation.

Figure 13:
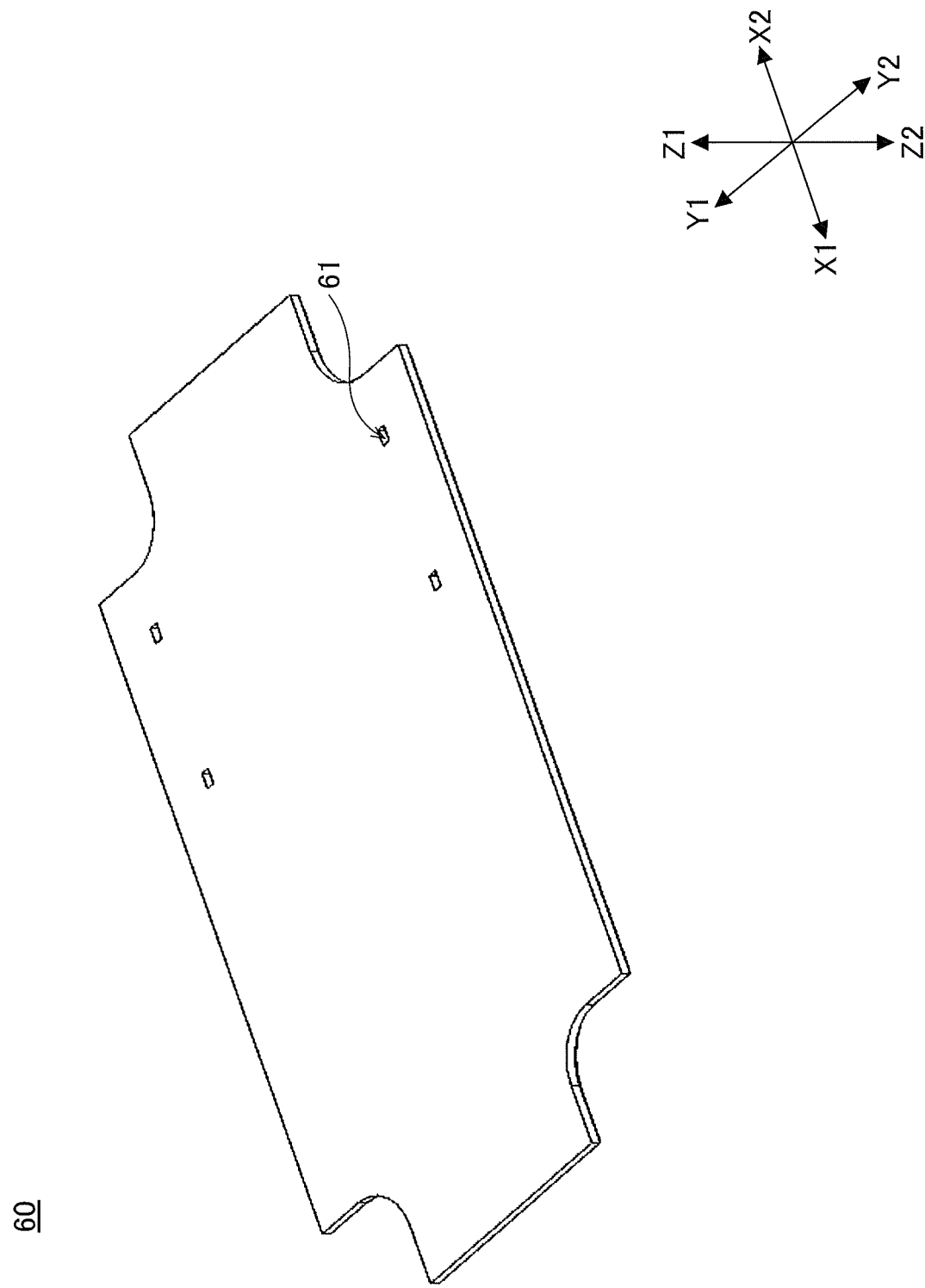
FIG. 13 is a perspective view of a lid of the present disclosure.

As illustrated in FIG. 13, the lid 60 is a flat plate and is provided with multiple through-holes 61 for inserting press-fit pins 19 provided on the base member 10.

Figure 14:
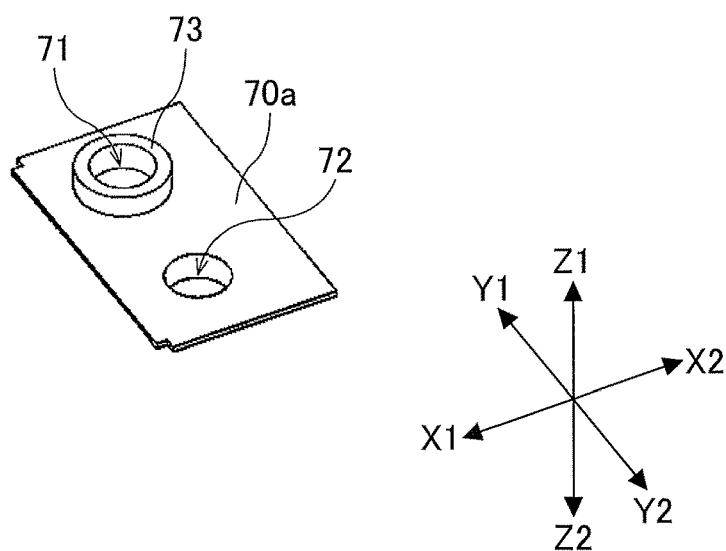
FIG. 14 is a first perspective view of a spacer of the first embodiment of the present disclosure.
Figure 15:
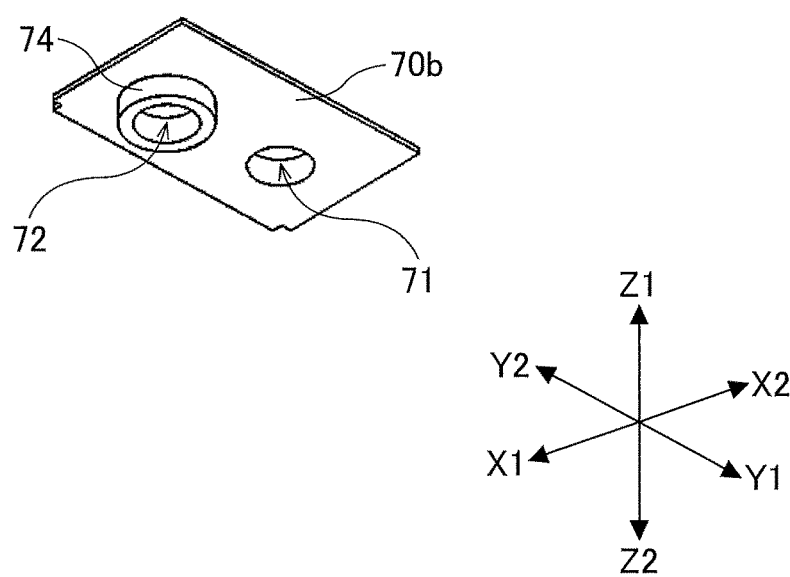
FIG. 15 is a second perspective view of the spacer of the first embodiment of the present disclosure.
Figure 16:
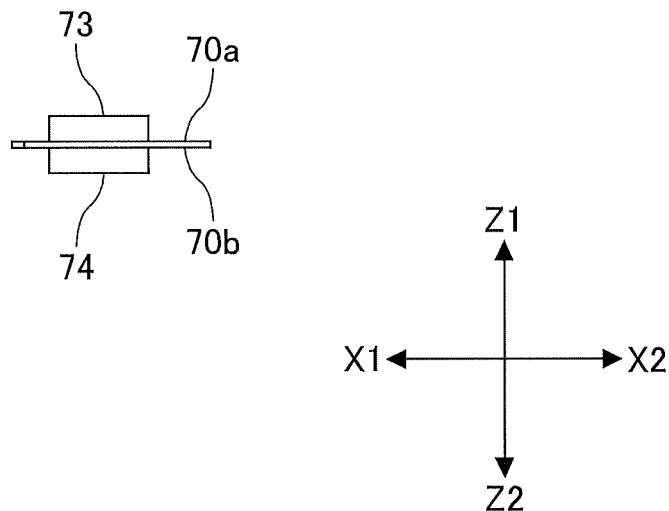
FIG. 16 is a side view of the spacer of the first embodiment of the present disclosure.

As illustrated in FIGS. 14 to 16, the spacer 70 is formed of an insulating resin material and the entirety of the spacer 70 is formed in a substantially flat plate shape so that the spacer 70 is provided between the P electrode plate 30 and the N electrode plate 40. FIG. 14 is a perspective view of the spacer 70 viewed from the Z1 side, FIG. 15 is a perspective view of the spacer 70 viewed from the Z2 side, and FIG. 16 is a side view of the spacer 70. A first through-hole 71 is provided in the spacer 70 on the Y1 direction side, and a second through-hole 72 is provided in the spacer 70 on the Y2 side. On the surface 70a of the spacer 70 having a substantially flat plate shape on the Z1 side, an edge around the first through-hole 71 protrudes to the Z1 side and an insulation separating portion 73 is formed. On the surface 70b of the spacer 70 on the Z2 side, an edge around the second through-hole 72 protrudes to the Z2 side and an insulation separating portion 74 is formed.

Figure 17:
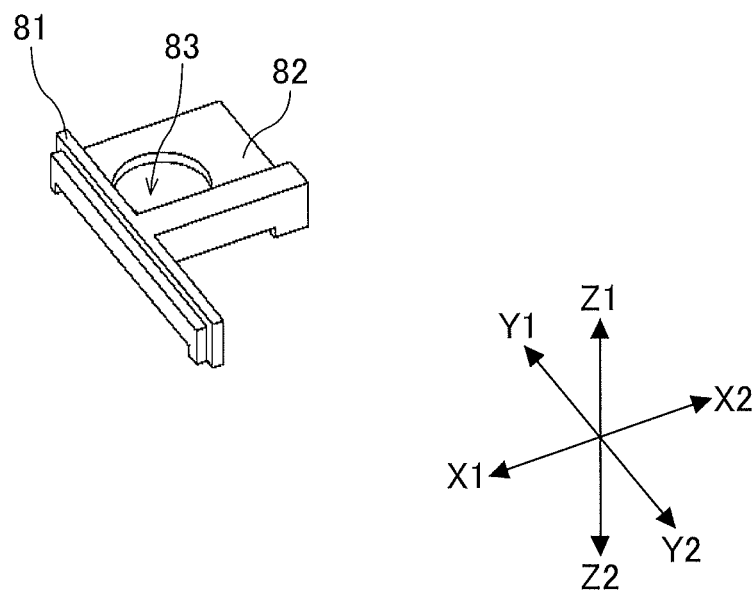
FIG. 17 is a side view of a cover of the first embodiment of the present disclosure.

As illustrated in FIG. 17, the cover 80 is formed of an insulating resin material, and has a rod-shaped blocking portion 81 extending in the Y1-Y2 direction and a cover portion 82 that is located on the X2 side from the blocking portion 81 and covers the surrounding of the first through-hole 44 of the N electrode plate 40. In the cover portion 82, a through-hole 83 passing through the cover portion 82 in the Z1-Z2 direction is provided.

(Manufacturing Process)

The semiconductor module according to the present embodiment will be described based on a process of manufacturing the semiconductor module illustrated in FIGS. 18 to 31.

Figure 18:
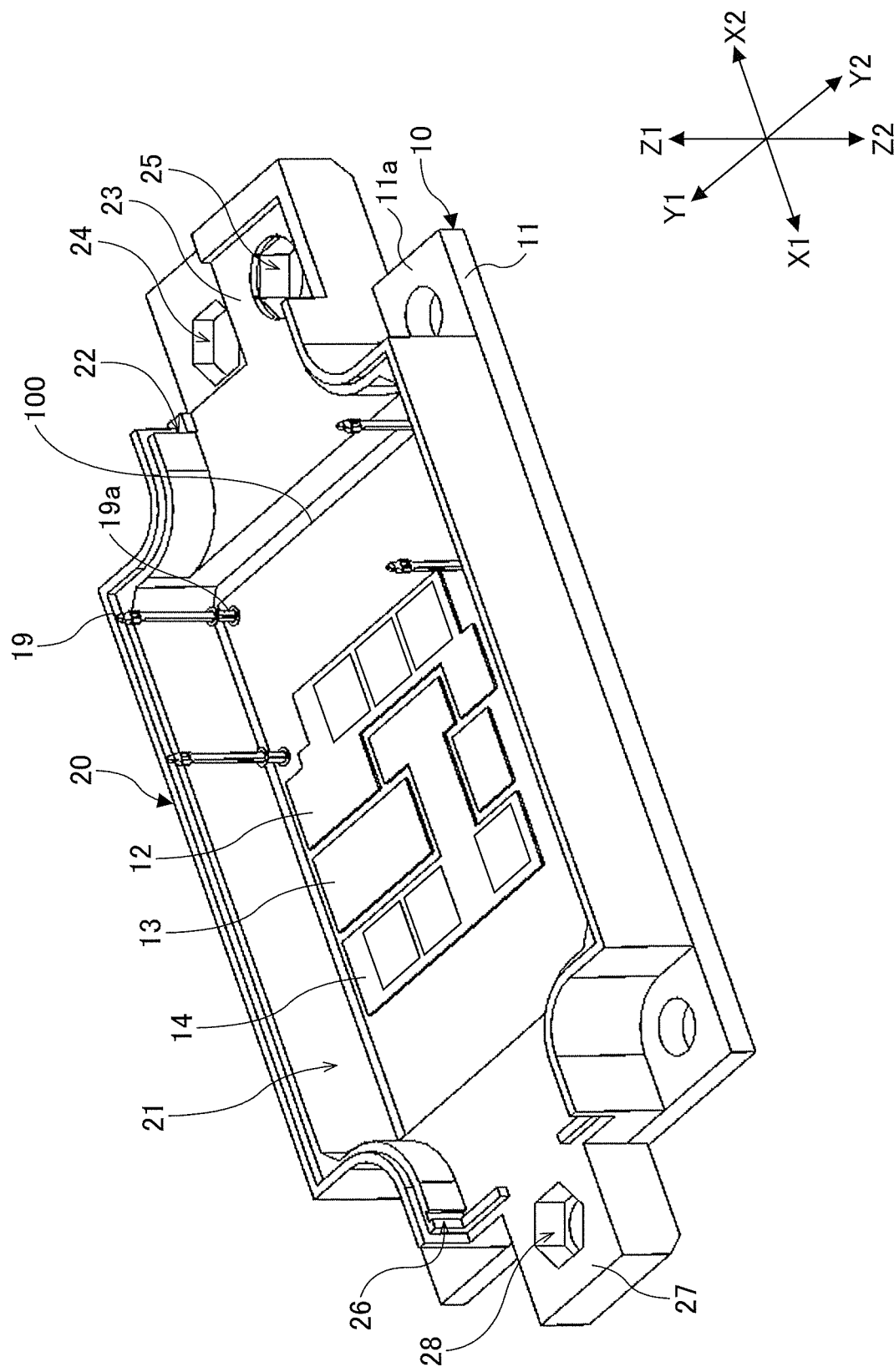
FIG. 18 is an explanatory drawing (1) of a process of manufacturing the semiconductor module of the first embodiment of the present disclosure.
Figure 19:
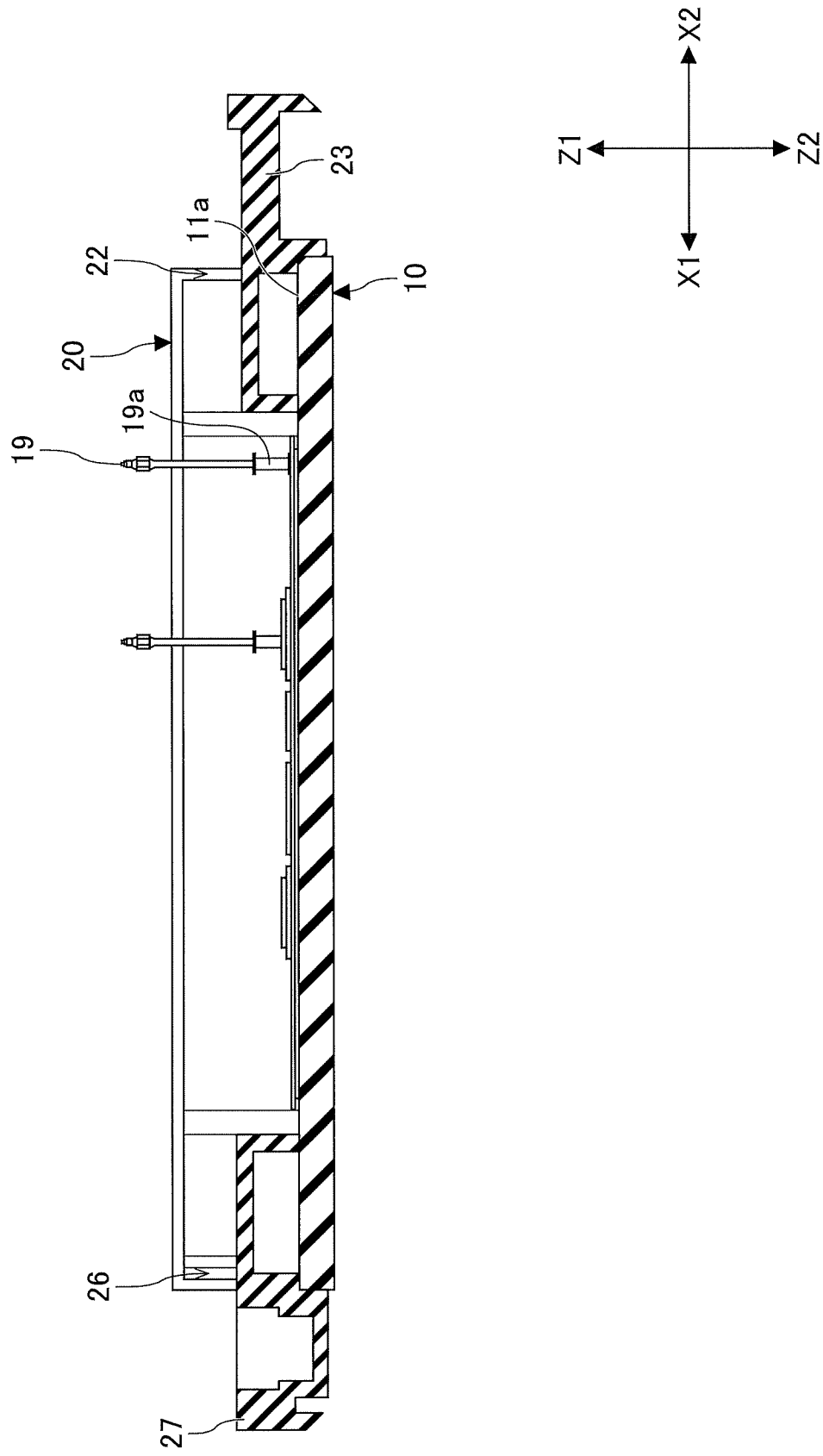
FIG. 19 is an explanatory drawing (2) of the process of manufacturing the semiconductor module of the first embodiment of the present disclosure.

First, as illustrated in FIG. 18 and FIG. 19, the housing 20 is bonded to the front surface 11a of the base plate 11 with an adhesive. FIG. 18 is a perspective view and FIG. 19 is a cross-sectional view in this process. The base member 10 is parallel to the XY plane and is disposed such that the longitudinal direction is the X1-X2 direction and the transverse direction is the Y1-Y2 direction. The housing 20 is bonded to a surface on the Z1 side, which is the front surface 11a of the base plate 11. The housing 20 is bonded to the front surface 11a of the base plate 11 such that the P electrode pad 12, the N electrode pad 13, the O electrode pad 14, the interconnect pattern, the press-fit pin 19, and the like formed in the circuit board 100 are inside the opening 21 of the housing 20.

Figure 20:
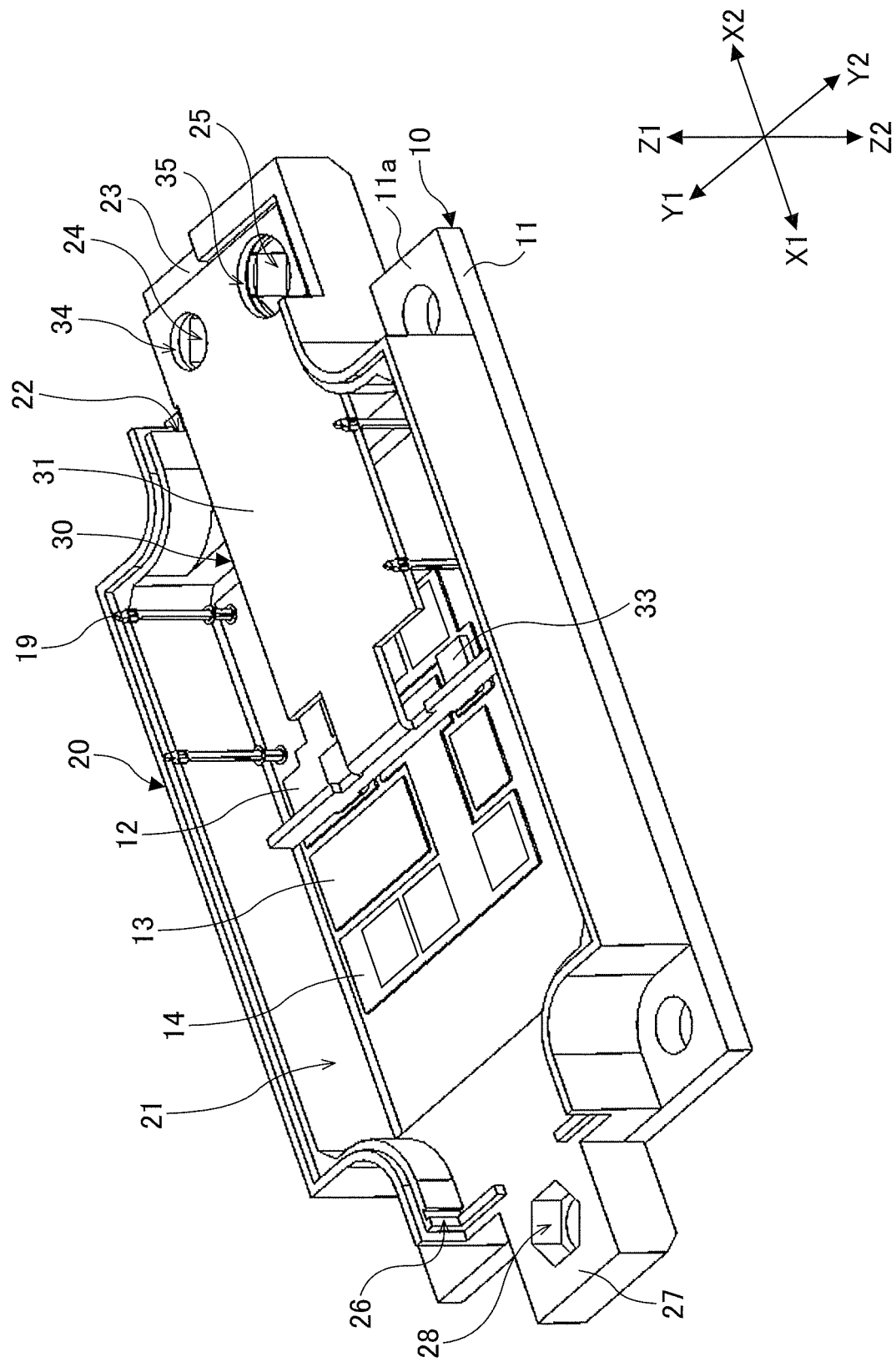
FIG. 20 is an explanatory drawing (3) of the process of manufacturing the semiconductor module of the first embodiment of the present disclosure.
Figure 21:
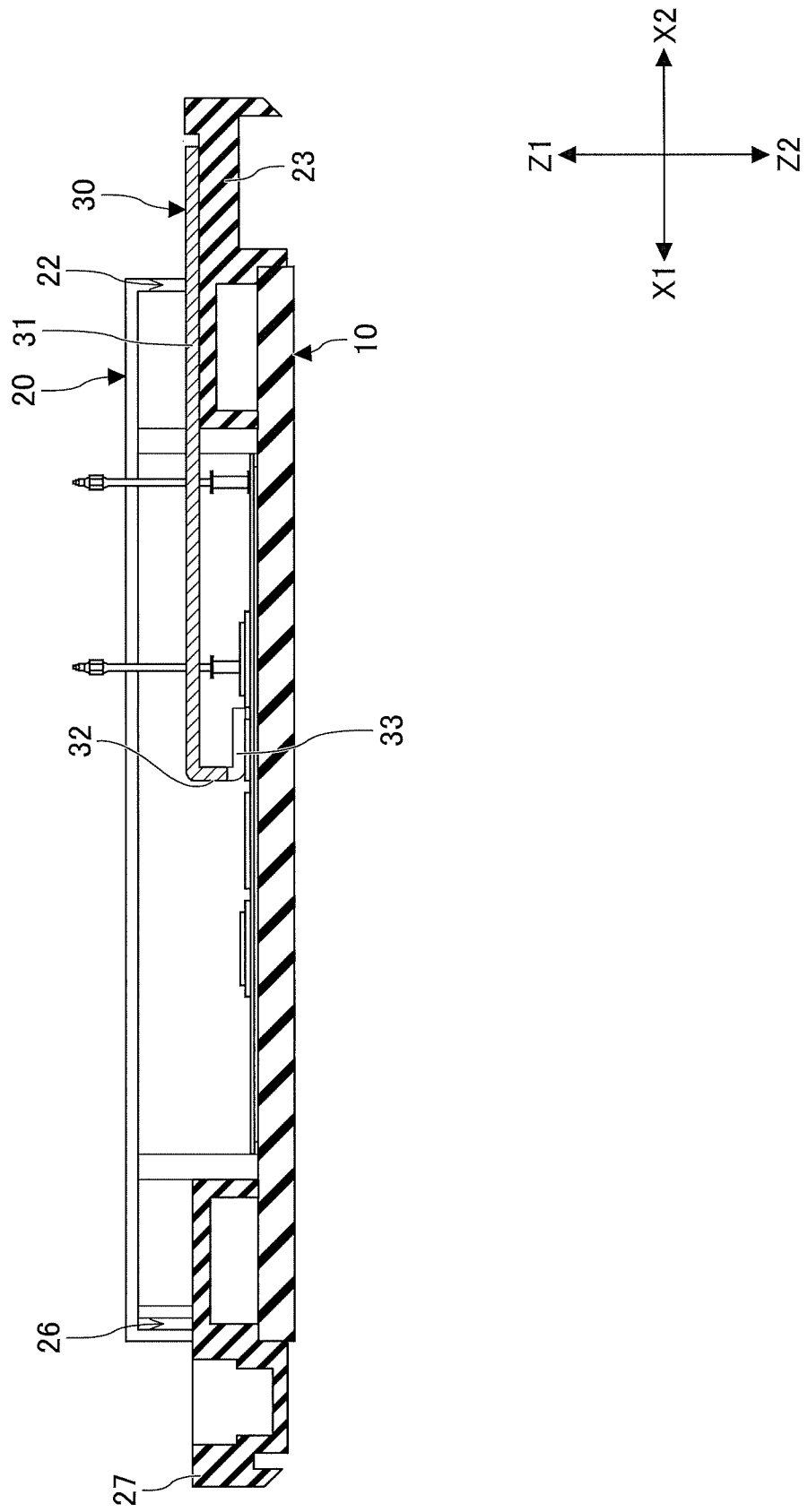
FIG. 21 is an explanatory drawing (4) of the process of manufacturing the semiconductor module of the first embodiment of the present disclosure.

Next, as illustrated in FIG. 20 and FIG. 21, the connecting portions 33 of the P electrode plate 30 are joined to the P electrode pad 12 by ultrasonic welding. FIG. 20 is a perspective view and FIG. 21 is a cross-sectional view in this process. The flat plate portion 31 of the P electrode plate 30 is provided so as to extend from the inside of the housing 20 to the outside in the X2 direction through the cutout portion 22 of the housing 20, and a portion of the flat plate portion 31 on the X2 direction side is attached to the supporting portion 23, that is, to the Z1 side of the supporting portion 23. The P electrode plate 30 has the first through-hole 34 and the second through-hole 35 positioned outside the housing 20, the center of the hole 24 of the supporting portion 23 is aligned with the center of the first through-hole 34, and the center of the hole 25 of the supporting portion 23 is aligned with the center of the second through-hole 35.

Figure 22:
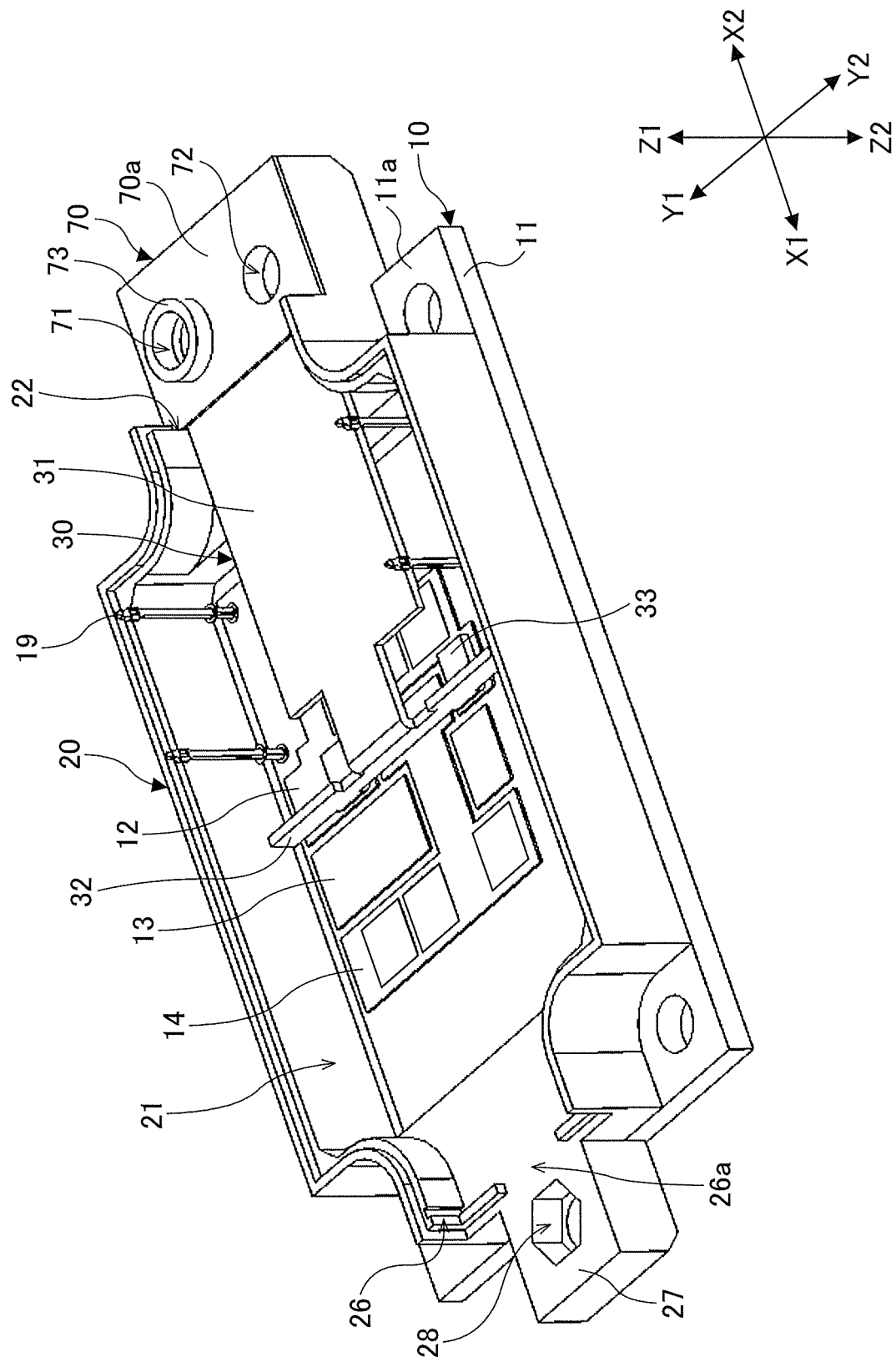
FIG. 22 is an explanatory drawing (5) of the process of manufacturing the semiconductor module of the first embodiment of the present disclosure.
Figure 23:
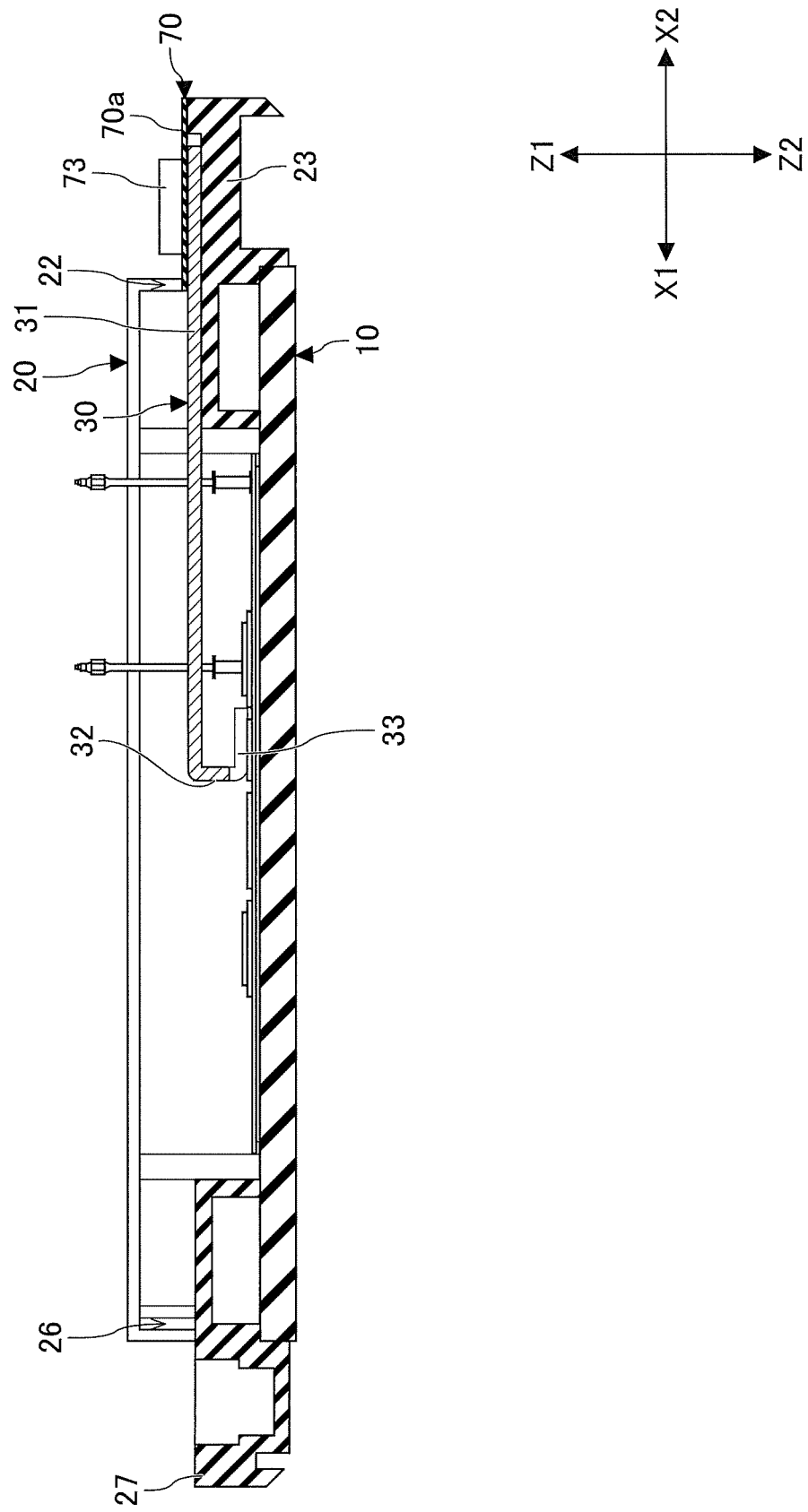
FIG. 23 is an explanatory drawing (6) of the process of manufacturing the semiconductor module of the first embodiment of the present disclosure.

Next, as illustrated in FIG. 22 and FIG. 23, the spacer 70 is bonded to a surface of the P electrode plate 30 on the Z1 side. FIG. 22 is a perspective view and FIG. 23 is a cross-sectional view in this process. The insulation separating portion 74 provided on the surface 70b of the spacer 70 on the Z2 side is inserted into the second through-hole 35 provided on the flat plate portion 31 of the P electrode plate 30, and the spacer 70 is bonded in a state in which the center of the first through-hole 34 of the flat plate portion 31 is aligned with the center of the first through-hole 71 of the spacer 70.

Figure 24:
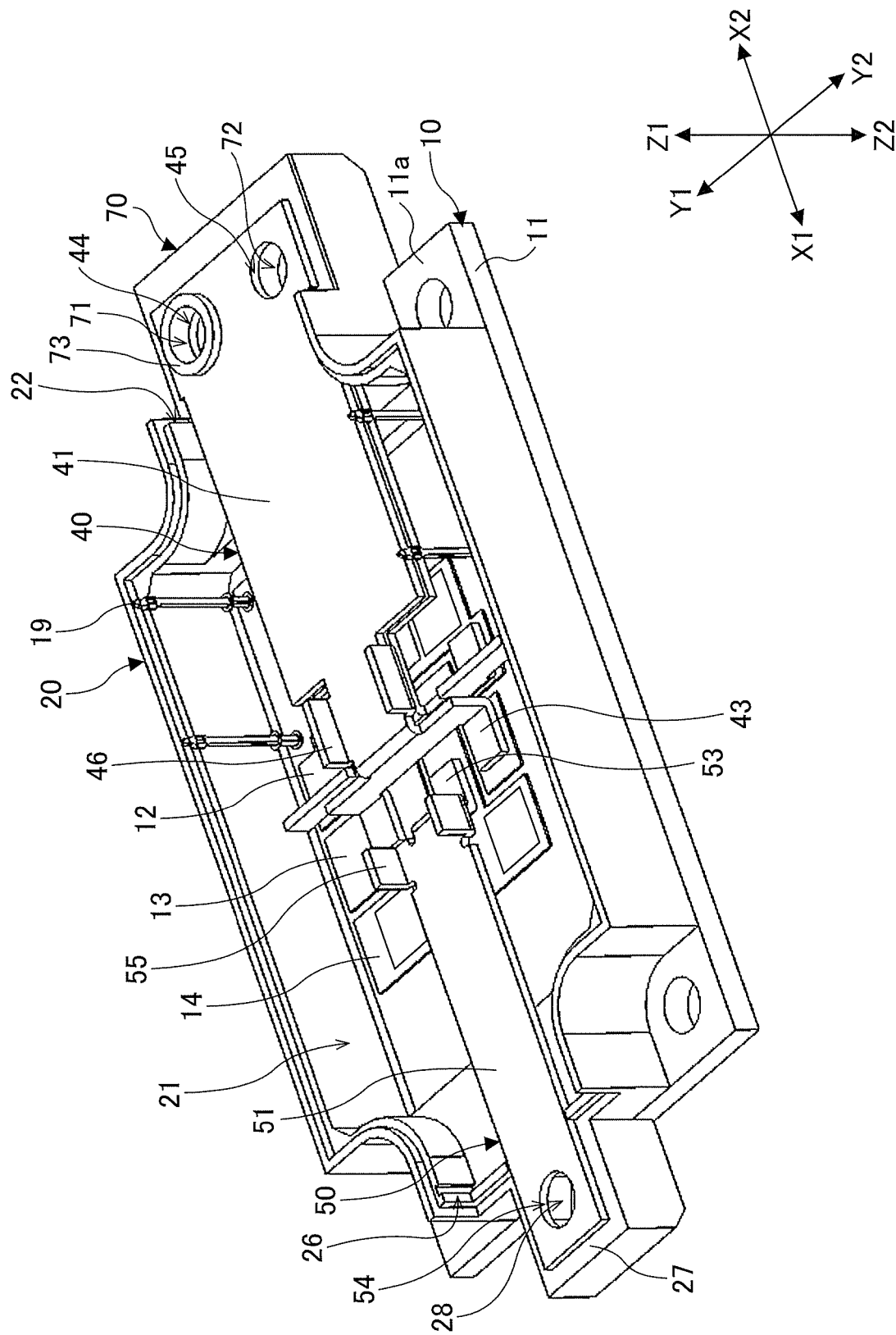
FIG. 24 is an explanatory drawing (7) of the process of manufacturing the semiconductor module of the first embodiment of the present disclosure.
Figure 25:
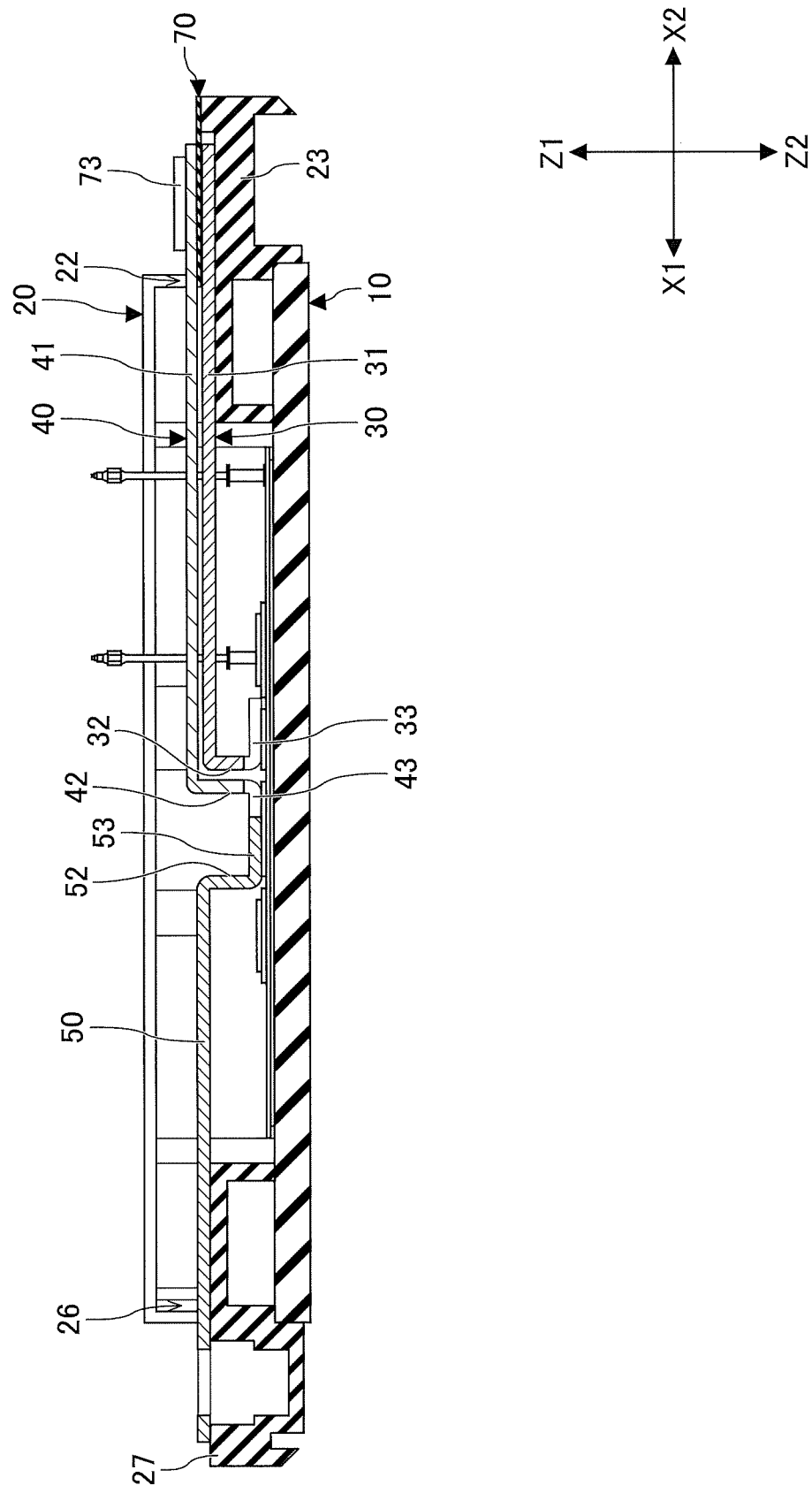
FIG. 25 is an explanatory drawing (8) of the process of manufacturing the semiconductor module of the first embodiment of the present disclosure.

Next, as illustrated in FIG. 24 and FIG. 25, the connecting portions 43 of the N electrode plate 40 are joined to the N electrode pad 13 by ultrasonic welding, and the connecting portion 53 of the O electrode plate 50 is joined to the O electrode pad 14 by ultrasonic welding. FIG. 24 is a perspective view and FIG. 25 is a cross-sectional view in this process.

The flat plate portion 41 of the N electrode plate 40 is provided so as to extend from the inside of the housing 20 to the outside in the X2 direction through the cutout portion 22 of the housing 20, and a portion of the flat plate portion 41 on the X2 direction is attached to the spacer 70, that is, to the Z1 side of the spacer 70. The N electrode plate 40 has the first through-hole 44 and the second through-hole 45 positioned outside the housing 20, and the insulation separating portion 73 at the edge of the first through-hole 71 of the spacer 70 is inserted into the first through-hole 44 of the N electrode plate 40. In this state, the center of the second through-hole 35 of the P electrode plate 30 is aligned with the center of the second through-hole 45 of the N electrode plate 40.

The flat plate portion 51 of the O electrode plate 50 is provided so as to extend from the inside of the housing 20 to the outside in the X1 direction through the cutout portion 26 of the housing 20, and a portion of the flat plate portion 51 on the X1 direction is attached to the supporting portion 27, that is, to the Z1 side of the supporting portion 27. In the cutout portion 26, as illustrated in FIG. 22, a recess 26a recessed to the Z2 side is formed, and the flat plate portion 51 of the O electrode plate 50 is fitted and bonded to the recess 26a of the cutout portion 26. The O electrode plate 50 has the through-hole 54 positioned outside of the housing 20 and the center of the through-hole 54 of the O electrode plate 50 is aligned with the center of the hole 28 in the supporting portion 27.

Figure 26:
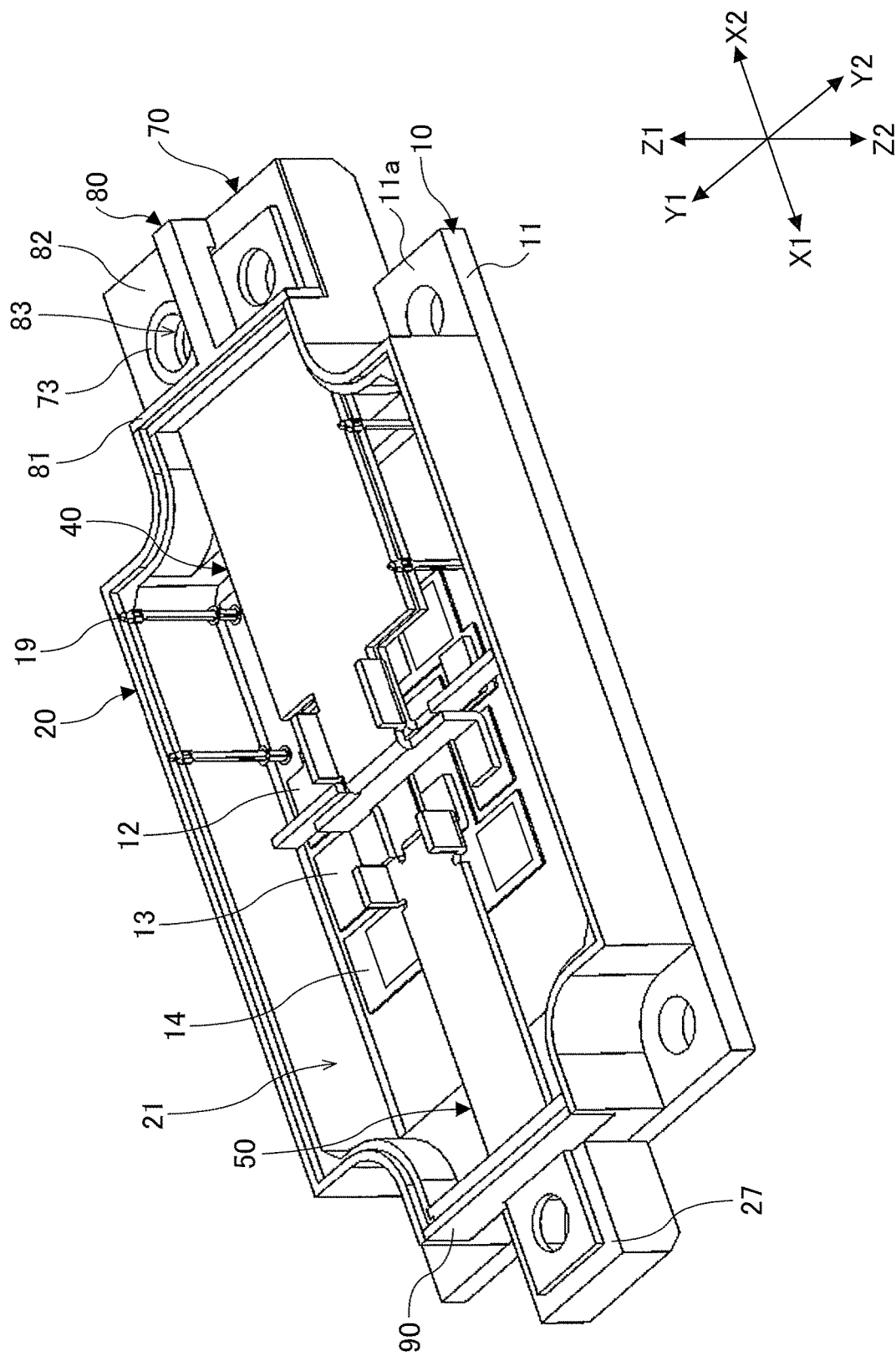
FIG. 26 is an explanatory drawing (9) of the process of manufacturing the semiconductor module of the first embodiment of the present disclosure.
Figure 27:
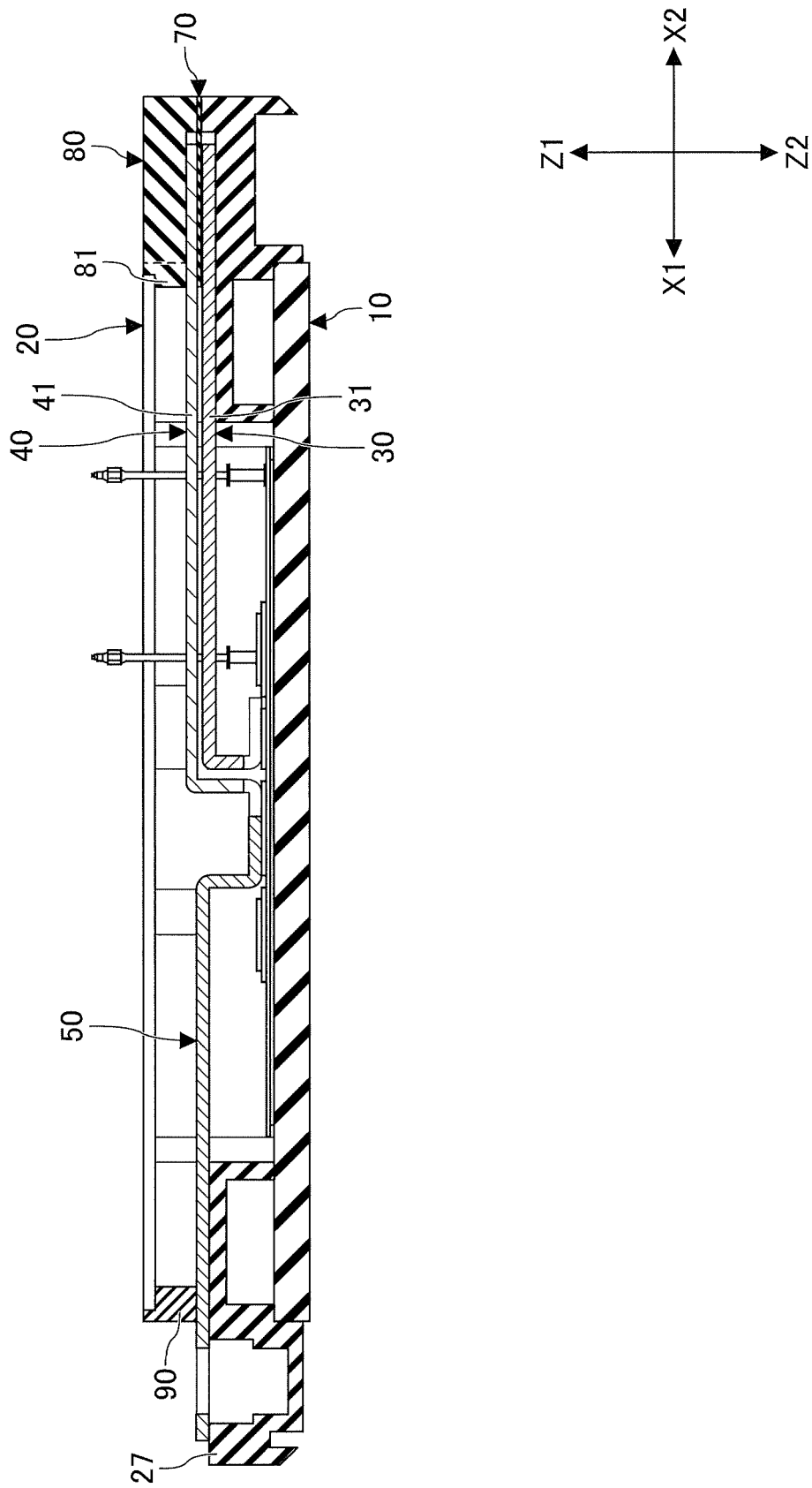
FIG. 27 is an explanatory drawing (10) of the process of manufacturing the semiconductor module of the first embodiment of the present disclosure.

Next, as illustrated in FIG. 26 and FIG. 27, the cover 80 is attached on the N electrode plate 40 at the cutout portion 22 of the housing 20 in which the P electrode plate 30 and the N electrode plate 40 are inserted, and the blocking member 90 is attached on the O electrode plate 50 at the cutout portion 22 of the housing 20. FIG. 26 is a perspective view and FIG. 27 is a cross-sectional view in this process.

The cover 80 is bonded to the housing 20 by an adhesive and is in contact with the N electrode plate 40, so that the cutout portion 22 of the housing 20 in which the O electrode plate 50 is inserted is blocked by the blocking portion 81 of the cover 80. In this state, the surrounding of the first through-hole 44 of the N electrode plate 40 is covered by the cover portion 82, and the insulation separating portion 73 around the first through-hole 71 of the spacer 70 is inserted into the through-hole 83 of the cover 80.

The blocking member 90 has a rod shape extending in the Y1-Y2 direction and is famed of an insulating resin material. The blocking member 90 is bonded to the housing 20 by an adhesive so as to cover the cutout portion 26 of the housing 20 and is in contact with the O electrode plate 50.

Figure 28:
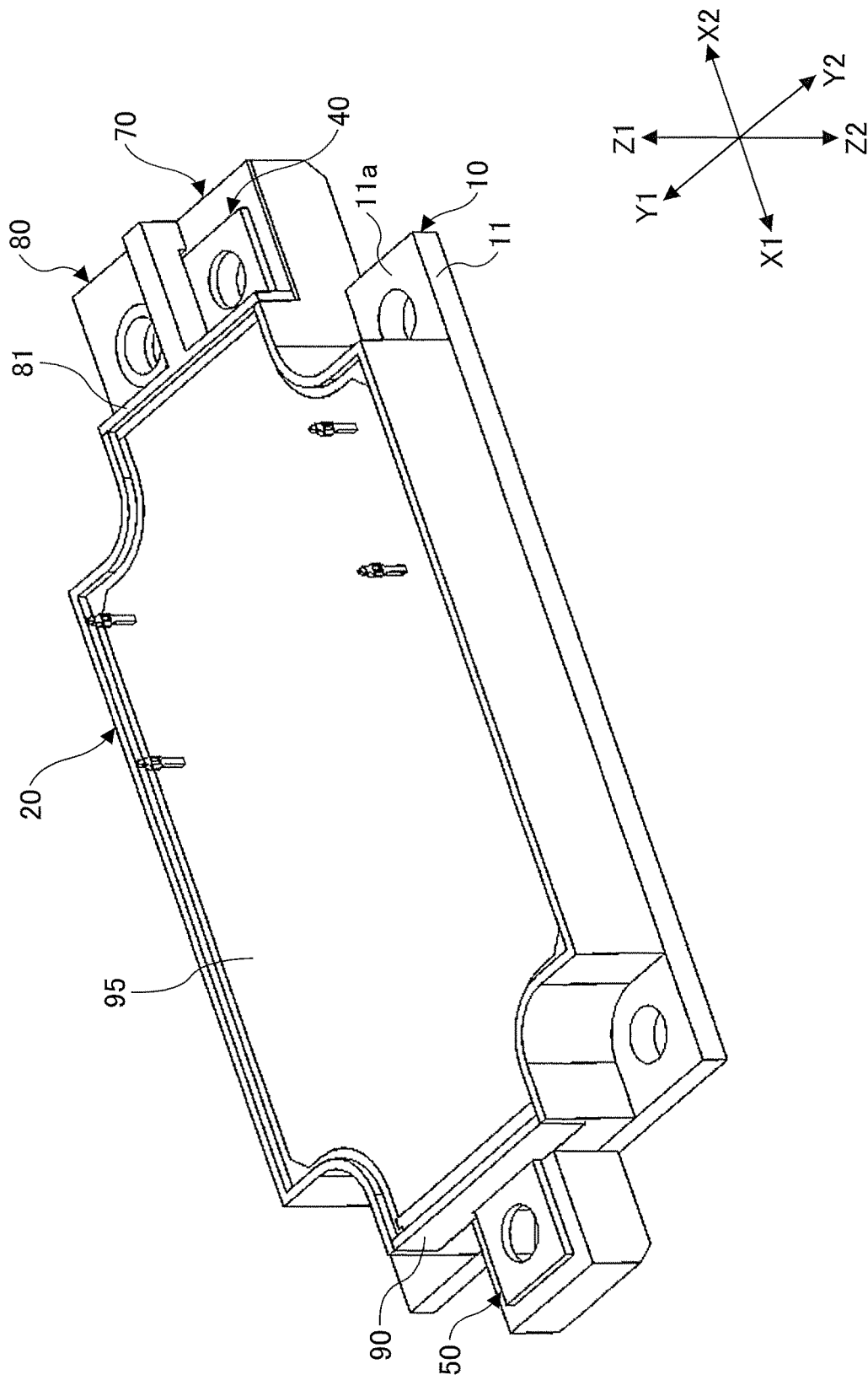
FIG. 28 is an explanatory drawing (11) of the process of manufacturing the semiconductor module of the first embodiment of the present disclosure.
Figure 29:
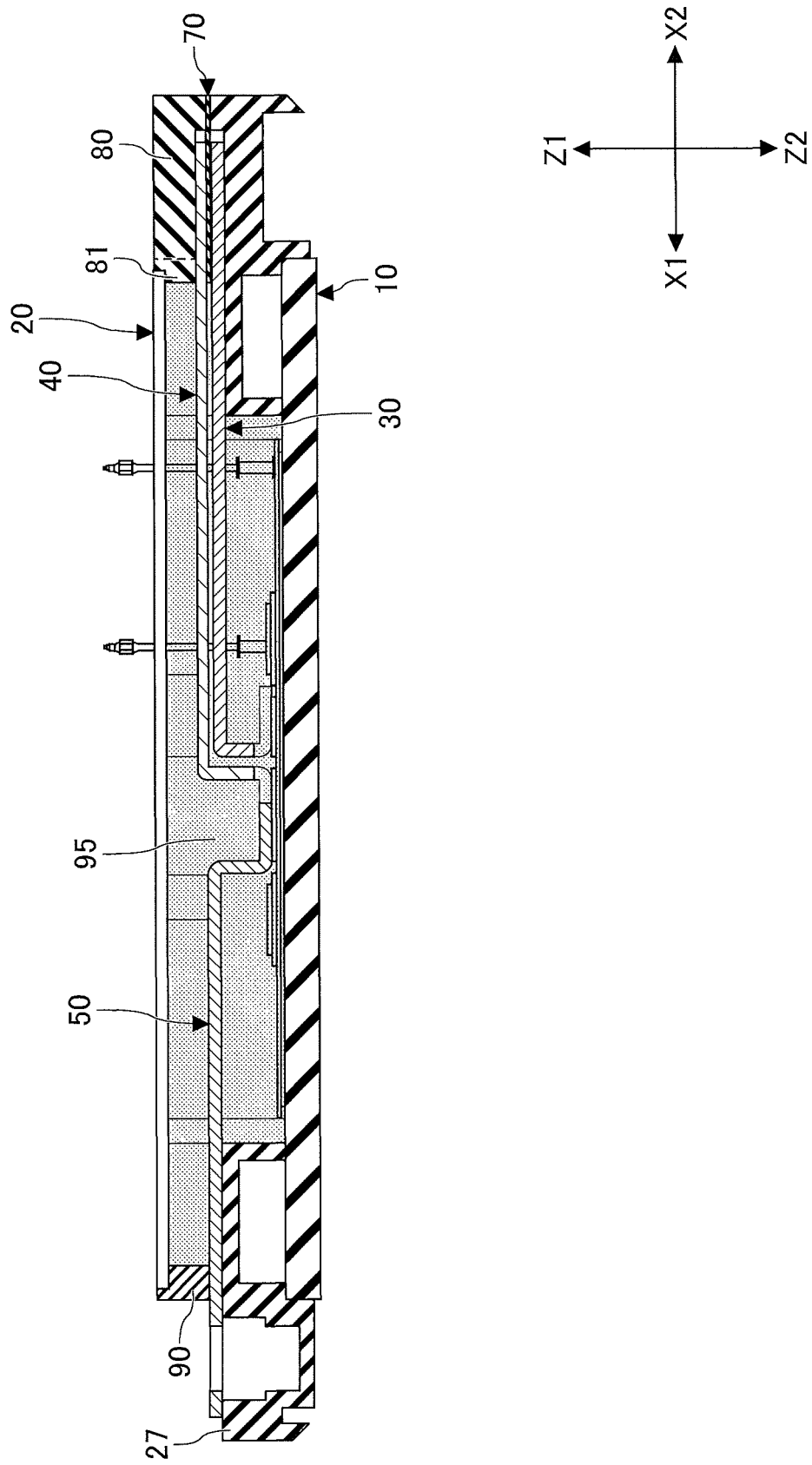
FIG. 29 is an explanatory drawing (12) of the process of manufacturing the semiconductor module of the first embodiment of the present disclosure.

Next, as illustrated in FIG. 28 and FIG. 29, the housing 20 is filled with an insulating resin material 95. FIG. 28 is a perspective view and FIG. 29 is a cross-sectional view in this process. When the resin material 95 is supplied into the housing 20, the resin material 95 expands as the resin material 95 flows in the housing 20. In the present embodiment, an open portion of the cutout portion 22 in which the P electrode plate 30 and the N electrode plate 40 are inserted is covered by the blocking portion 81 of the cover 80 being attached. Further, an open portion of the cutout portion 26 in which the O electrode plate 50 is inserted is covered by the blocking member 90 being attached. Therefore, when the resin material 95 is supplied into the housing 20, the resin material 95 does not leak to the outside of the housing 20 from the X1 side or the X2 side.

Figure 30:
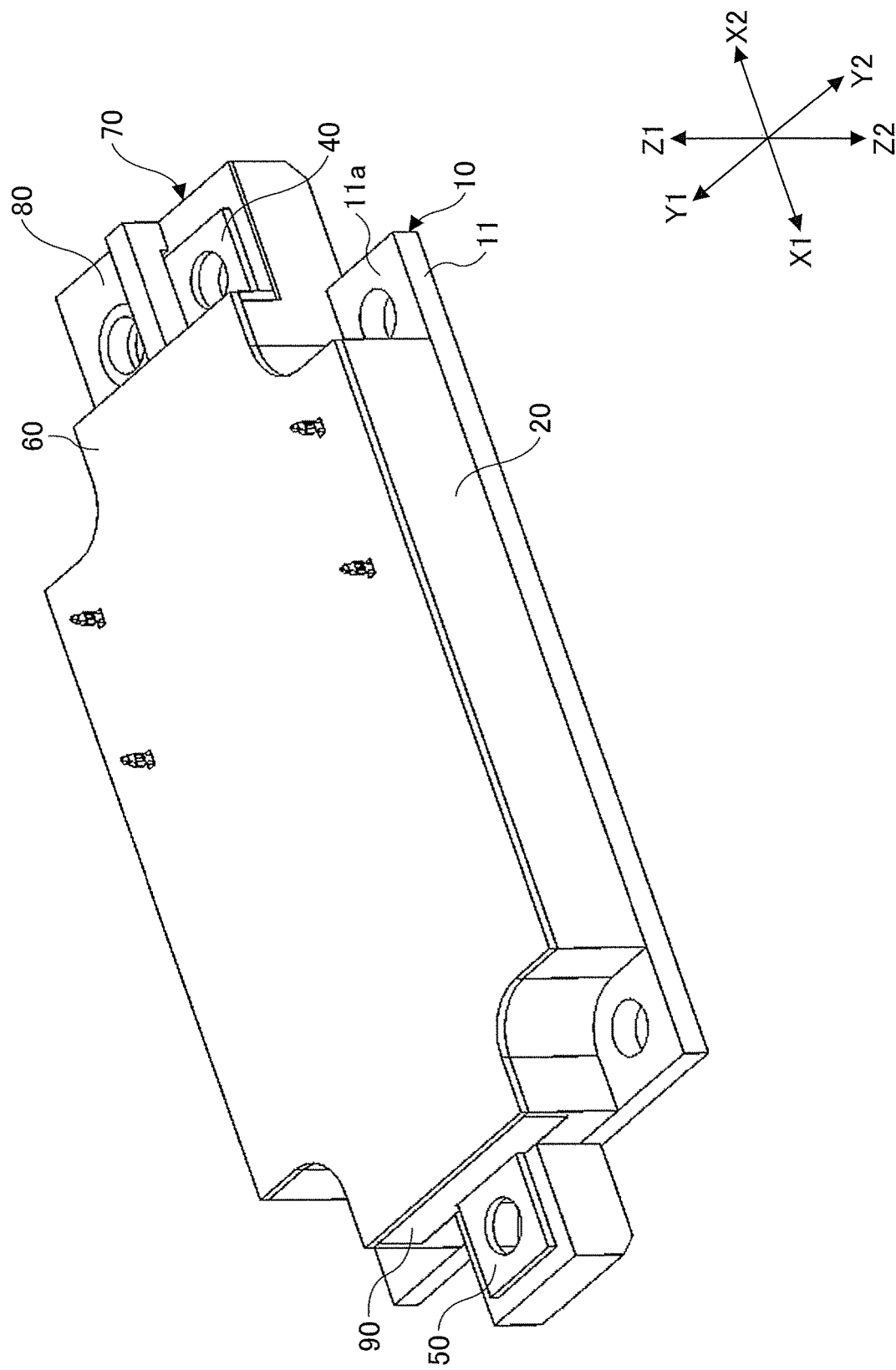
FIG. 30 is an explanatory drawing (13) of the process of manufacturing the semiconductor module of the first embodiment of the present disclosure.
Figure 31:
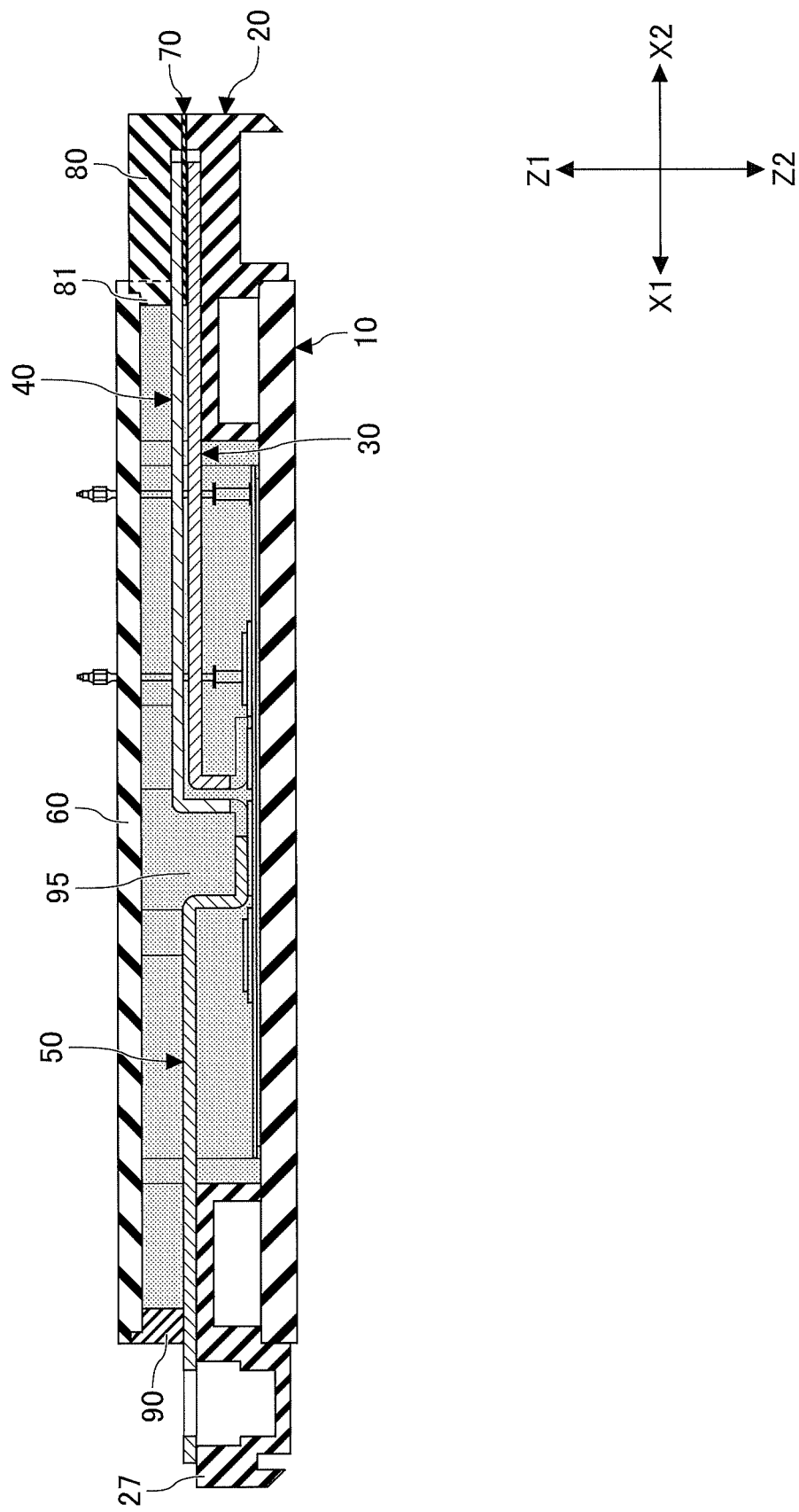
FIG. 31 is an explanatory drawing (14) of the process of manufacturing the semiconductor module of the first embodiment of the present disclosure.

Subsequently, as illustrated in FIG. 30 and FIG. 31, the resin material 95 is cured, and the lid 60 is placed on the resin material 95, i.e., on the Z1 side of the resin material 95. FIG. 30 is a perspective view and FIG. 31 is a cross-sectional view in this process. The semiconductor module of the present embodiment can be manufactured by the above process.

Figure 32:
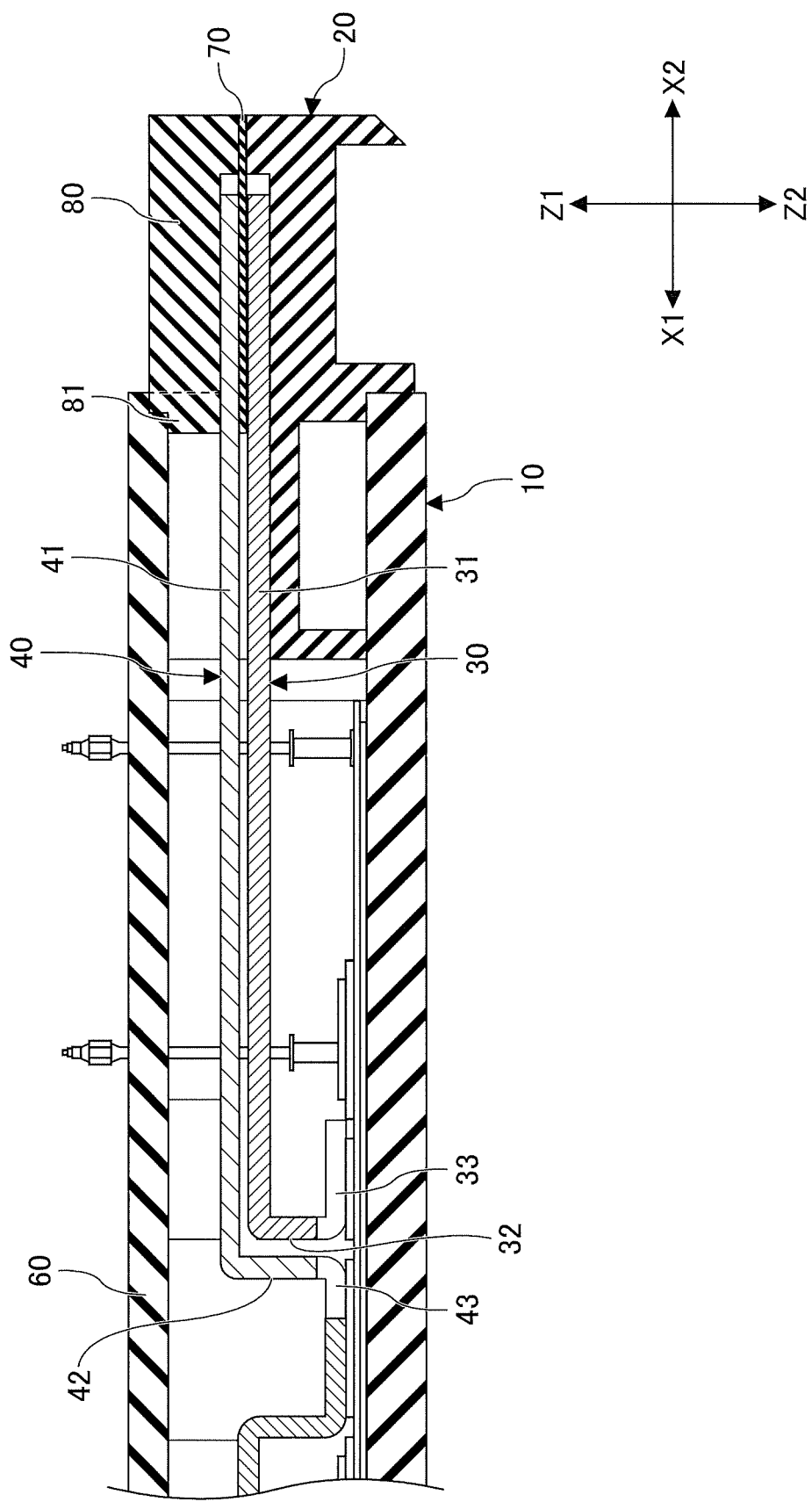
FIG. 32 is an enlarged view of the internal structure of the semiconductor module of the first embodiment of the present disclosure.

In the semiconductor module of the present embodiment, the spacer 70 is provided on the P electrode plate 30 and the N electrode plate 40 is provided on the spacer 70, as illustrated in FIG. 32. Thus, a predetermined space between the flat plate portion 31 of the P electrode plate 30 and the flat plate portion 41 of the N electrode plate 40 is maintained by the spacer 70. The space is, for example, 0.5 mm. As described above, the flat plate portion 31 of the P electrode plate 30 and the flat plate portion 41 of the N electrode plate 40 are arranged in a parallel-plate configuration, so that large mutual inductance can be generated between the flat plate portion 31 of the P electrode plate 30 and the flat plate portion 41 of the N electrode plate 40. This can reduce the inductance between P and N of the semiconductor module.

Specifically, when self-inductance of the P electrode plate 30 is $L_1$, self-inductance of the N electrode plate 40 is $L_2$, and mutual inductance of the P electrode plate 30 and the N electrode plate 40 is $M_{12}$, inductance L between P and N of the semiconductor module is obtained by the equation expressed in (1) below.

$$L = L_1 + L_2 - 2M_{12} \qquad (1)$$

In the present embodiment, in order to increase the value of the mutual inductance M12, the flat plate portions 31 of the P electrode plate 30 and the flat plate portions 41 of the N electrode plate 40 are in a parallel-plate configuration not only within the housing 20 but also outside the housing 20. An area where the flat plate portion 31 of the P electrode plate 30 and the flat plate portion 41 of the N electrode plate 40 are in a parallel-plate configuration is increased, so that the value of the mutual inductance M12 is increased, thereby reducing the inductance L between P and N of the semiconductor module.

In the present embodiment, the vertical portion 32 of the P electrode plate 30 and the vertical portion 42 of the N electrode plate 40 are also in a parallel-plate configuration. This can further increase the mutual inductance $M_{12}$ and reduce the inductance L between P and N of the semiconductor module.

Figure 33:
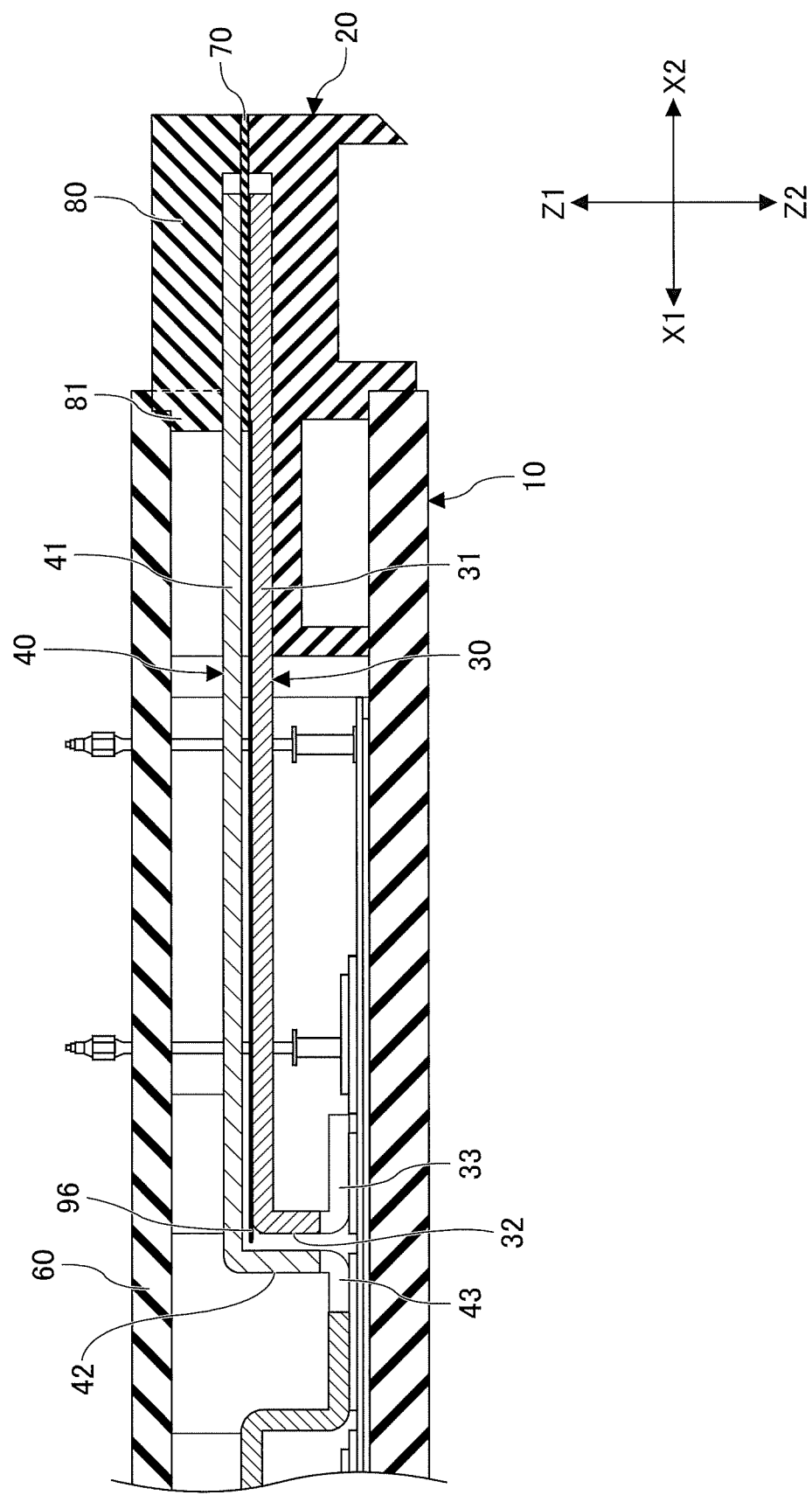
FIG. 33 is a first explanatory drawing of an insulation paper of the present disclosure.
Figure 34:
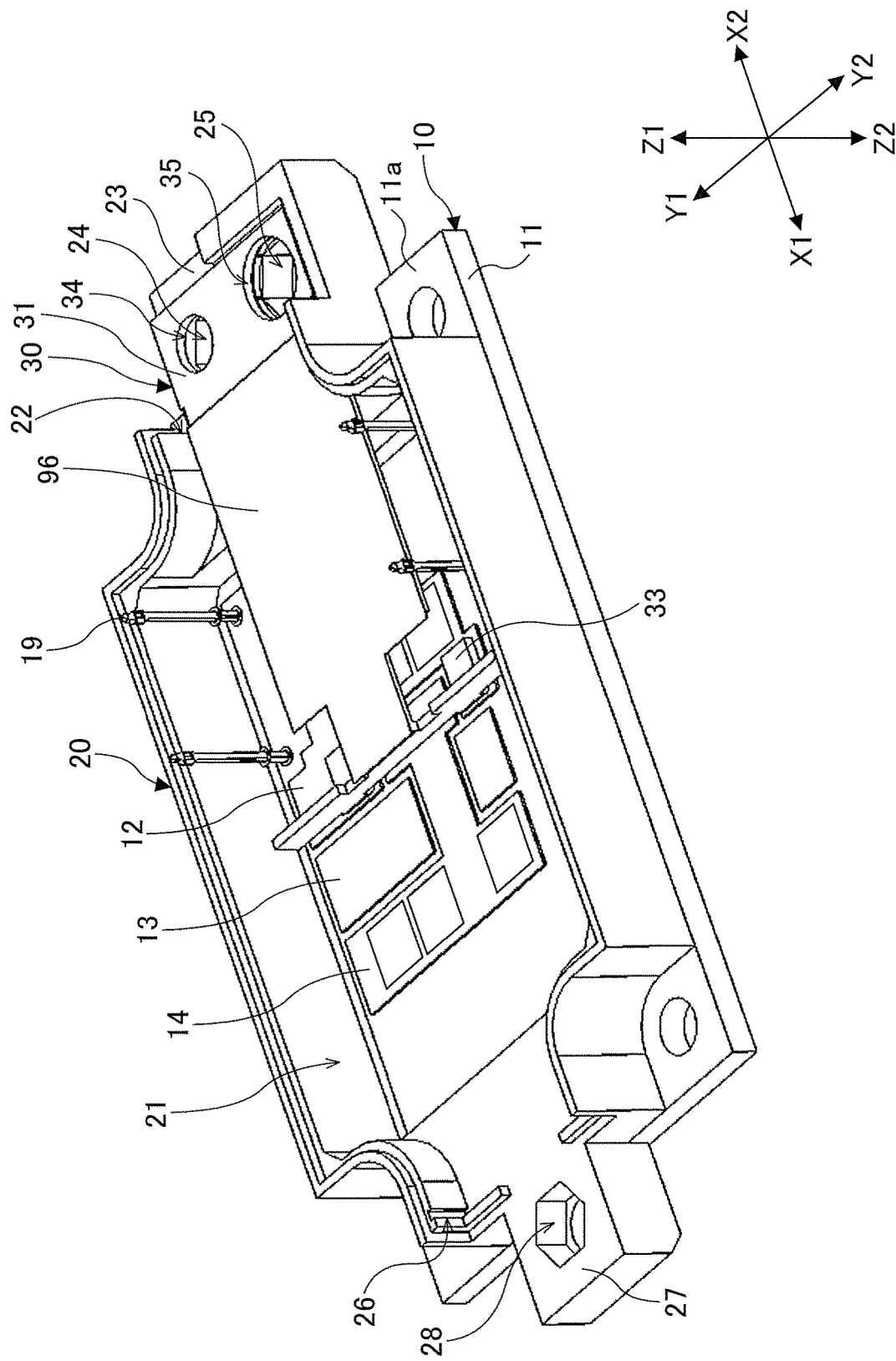
FIG. 34 is a second explanatory drawing of the insulation paper of the present disclosure.

As illustrated in FIG. 33, the semiconductor module according to the present embodiment may be also provided with an insulation paper 96 between the flat plate portion 31 of the P electrode plate 30 and the flat plate portion 41 of the N electrode plate 40. By providing the insulation paper 96 between the flat plate portion 31 of the P electrode plate 30 and the flat plate portion 41 of the N electrode plate 40, the insulation between the flat plate portion 31 of the P electrode plate 30 and the flat plate portion 41 of the N electrode plate 40 can be achieved with certainty. Additionally, the withstand voltage between the flat plate portion 31 of the P electrode plate 30 and the flat plate portion 41 of the N electrode plate 40 can be increased, and the space between the flat plate portion 31 of the P electrode plate 30 and the flat plate portion 41 of the N electrode plate 40 can be narrowed. FIG. 34 illustrates a state in which the insulation paper 96 is disposed on the flat plate portion 31 of the P electrode plate 30. In the present disclosure, the insulation paper 96 may be described as an insulating member.

Figure 35:
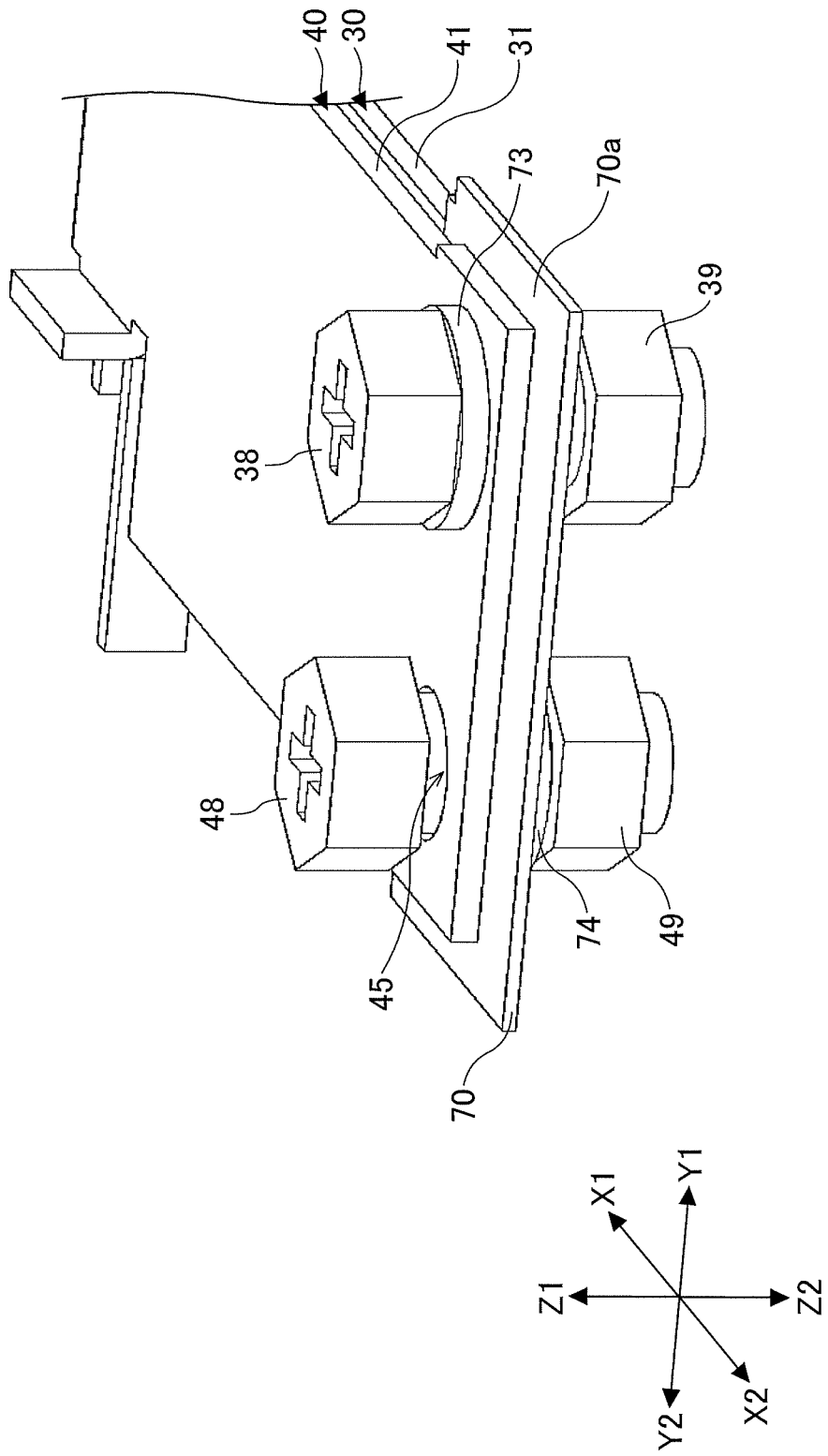
FIG. 35 is a first explanatory drawing of the spacer of the first embodiment of the present disclosure.
Figure 36:
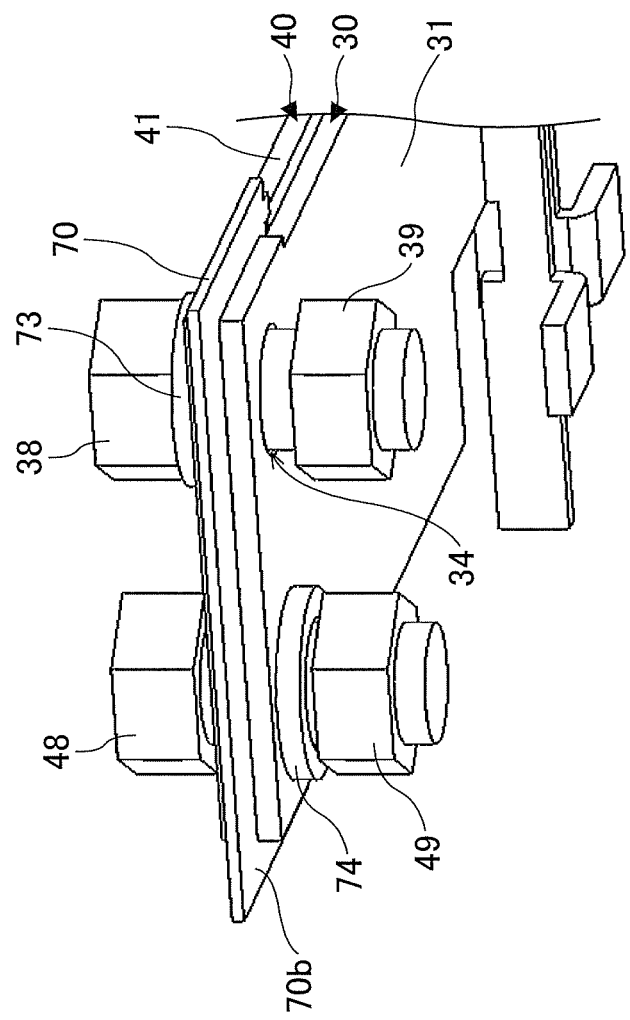
FIG. 36 is a second explanatory drawing of the spacer of the first embodiment of the present disclosure.

As illustrated in FIG. 35 and FIG. 36, in the semiconductor module according to the present embodiment, the P electrode plate 30 and the N electrode plate 40 are insulated by the spacer 70 provided between the P electrode plate 30 and the N electrode plate 40. The insulation separating portion 74 provided on the surface 70b of the spacer 70 on the Z2 side is inserted into the second through-hole 35 of the P electrode plate 30, and the insulation separating portion 73 provided on the surface 70a of the spacer 70 on the Z1 side is inserted into the first through-hole 44 of the N electrode plate 40.

In the present embodiment, the P electrode plate 30 and a P busbar (which is not illustrated) are fixed by a bolt 38 and a nut 39 and are connected. Specifically, the bolt 38 for connecting the P electrode plate 30 to the P bus bar (which is not illustrated) is fixed by the nut 39 provided on the Z2 side from the N electrode plate 40 side through the first through-hole 71 of the spacer 70, the first through-hole 34 of the P electrode plate 30, and a through-hole of the P bus bar. The P electrode plate 30 and the P busbar are in contact on a surface on the Z2 side around the first through-hole 34 of the flat plate portion 31 of the P electrode plate 30 and are electrically coupled. The bolt 38 and the nut 39 are typically formed of a metallic material and are electrically conductive. In the present embodiment, the insulation separating portion 73 of the spacer 70 that is formed of the insulator is inserted into the first through-hole 44 of the N electrode plate 40. Thus, in a state in which the electrically conductive bolt 38 is inserted into the first through-hole 71 of the spacer 70, there is the insulation separating portion 73 of the spacer 70 between the bolt 38 and the N electrode plate 40, so that the insulation between the bolt 38 and the N electrode plate 40 is maintained.

The N electrode plate 40 and an N bus bar (which is not illustrated) are fixed by a bolt 48 and a nut 49 and are connected. Specifically, the bolt 48 for connecting the N electrode plate 40 to the N bus bar (which is not illustrated) passes through a through-hole of the N bus bar (which is not illustrated), the second through-hole 45 of the N electrode plate 40, and the second through-hole 72 of the spacer 70, and is fixed by the nut 49 provided on the Z2 side. The N electrode plate 40 and the N bus bar are in contact on a surface on the Z1 side around the second through-hole 45 of the flat plate portion 41 of the N electrode plate 40 and are electrically coupled. The bolt 48 and the nut 49 are typically formed of a metallic material and are electrically conductive. In the present embodiment, the insulation separating portion 74 of the spacer 70 that is formed of the insulator is inserted into the second through-hole 35 of the P electrode plate 30. Thus, in a state in which the electrically conductive bolt 48 is inserted into the second through-hole 72 of the spacer 70, there is the insulation separating portion 74 of the spacer 70 between the bolt 48 and the P electrode plate 30, so that the insulation between the bolt 48 and the P electrode plate 30 is maintained.

As described above, in the semiconductor module according to the present embodiment, the flat plate portion 31 of the P electrode plate 30 and the flat plate portion 41 of the N electrode plate 40 are in a parallel-plate configuration not only within the housing 20 but also outside the housing 20. This can increase the mutual inductance $M_{12}$ and reduce the inductance L between P and N of the semiconductor module.

Figure 37:
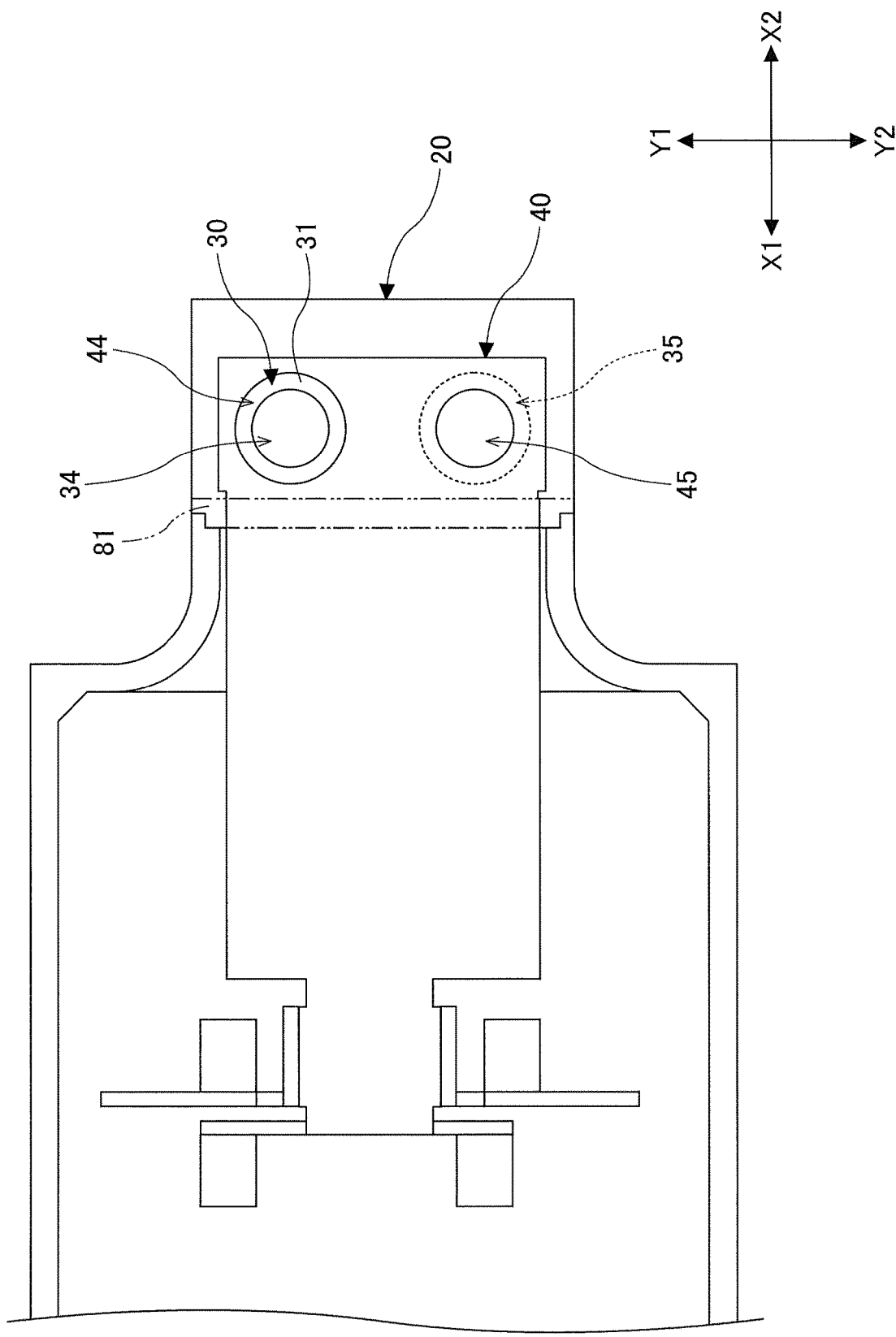
FIG. 37 is an explanatory drawing of a positional relation between the P electrode and the N electrode of the first embodiment of the present disclosure.

That is, as illustrated in FIG. 37, in planar view from the Z1 side, the flat plate portion 31 of the P electrode plate 30 and the flat plate portion 41 of the N electrode plate 40 are mostly overlapped inside and outside the housing 20, and are in a parallel-plate configuration.

As illustrated in FIG. 35 and FIG. 36, in the present embodiment, the width of the spacer 70 in the Y1-Y2 direction is formed to be wider than the width of the P electrode plate 30 in the Y1-Y2 direction and the width of the N electrode plate 40 in the Y1-Y2 direction outside the housing 20. Additionally, in the X2 direction in the spacer 70, the spacer 70 is formed to be longer to the X2 side from the end of the P electrode plate 30 in the X2 direction and the end of the N electrode plate 40 in the X2 direction. By forming the spacer 70 in such a manner, the creepage distance along the surface of the spacer 70 from the P electrode plate 30 to the N electrode plate 40 can be increased, thereby improving the withstand voltage.

Second Embodiment

Figure 38:
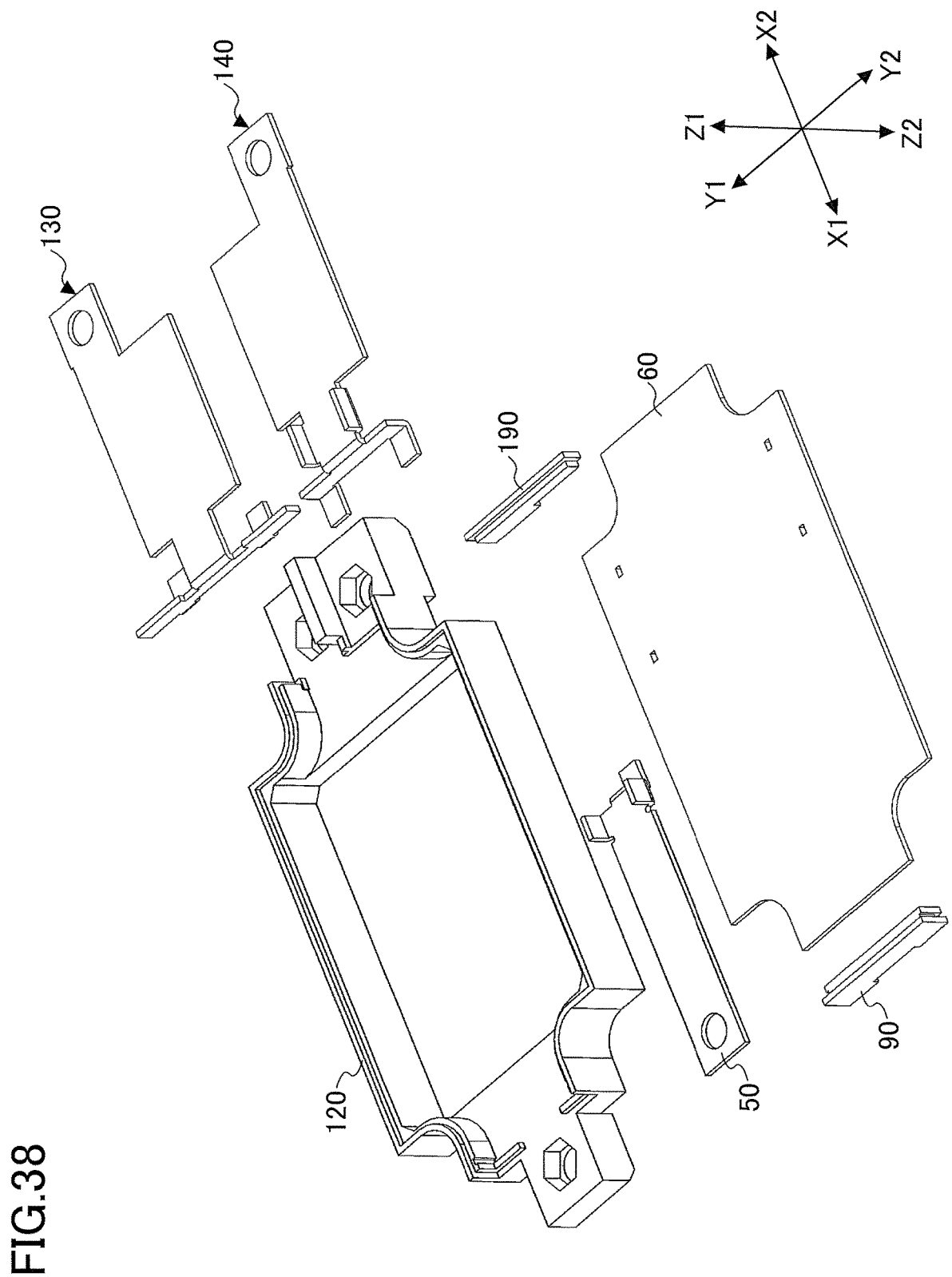
FIG. 38 is an explanatory drawing of members constituting a semiconductor module of a second embodiment of the present disclosure.
Figure 39:
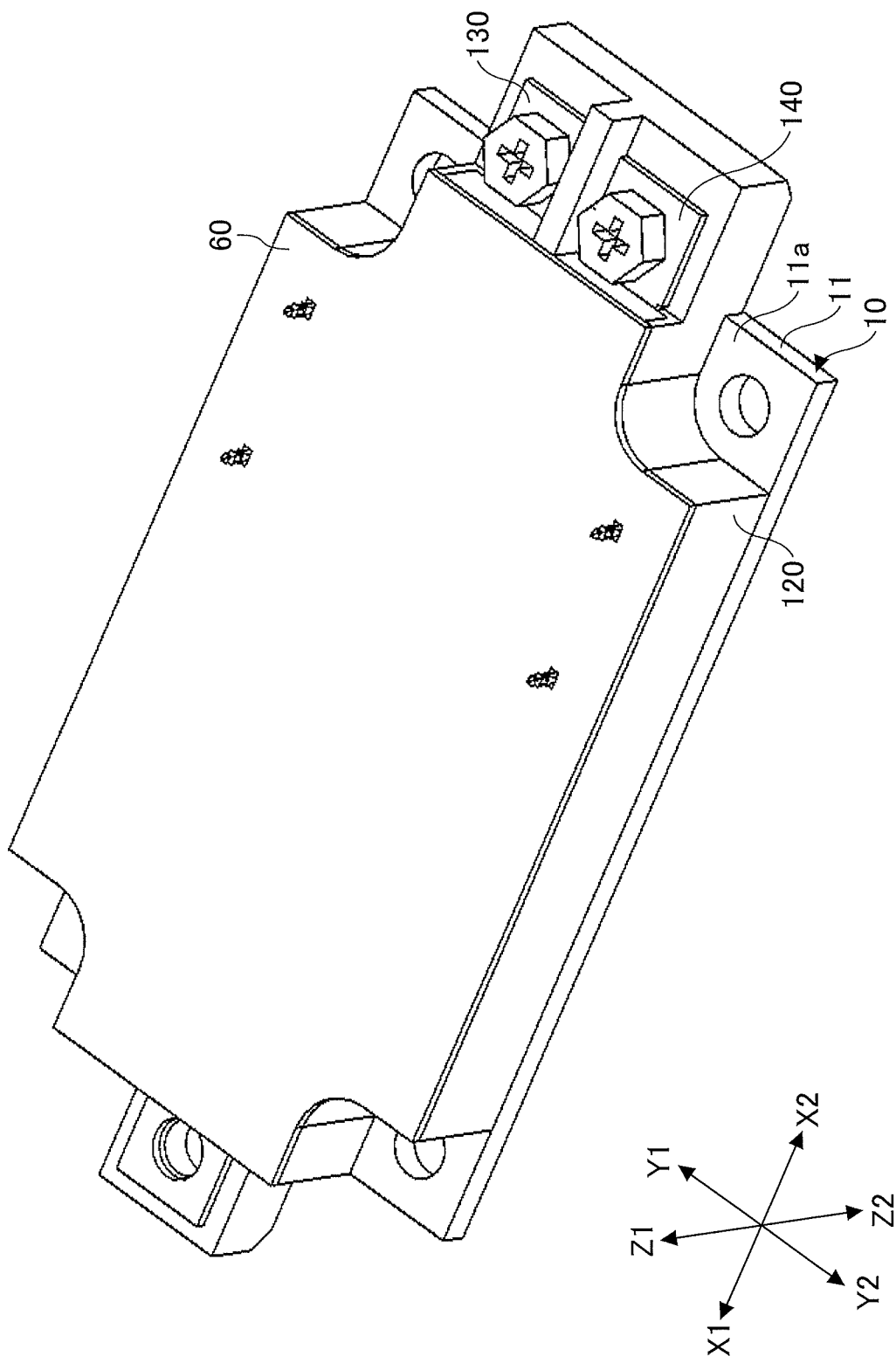
FIG. 39 is a perspective view of the semiconductor module of the second embodiment of the present disclosure.

Next, a semiconductor module according to a second embodiment will be described. The semiconductor module according to the present embodiment includes the base member 10 illustrated in FIG. 1, a housing 120 illustrated in FIG. 38, a P electrode plate 130, an N electrode plate 140, the O electrode plate 50, the lid 60, the blocking member 90, a blocking member 190, and the like. The semiconductor module according to the present embodiment is formed of these members. FIG. 39 is a perspective view of the semiconductor module in the present embodiment. In the semiconductor module according to the present embodiment, a circuit configuration is similar to the circuit configuration of the semiconductor module in the first embodiment, and the equivalent circuit of the main part is illustrated in FIG. 5.

Figure 40:
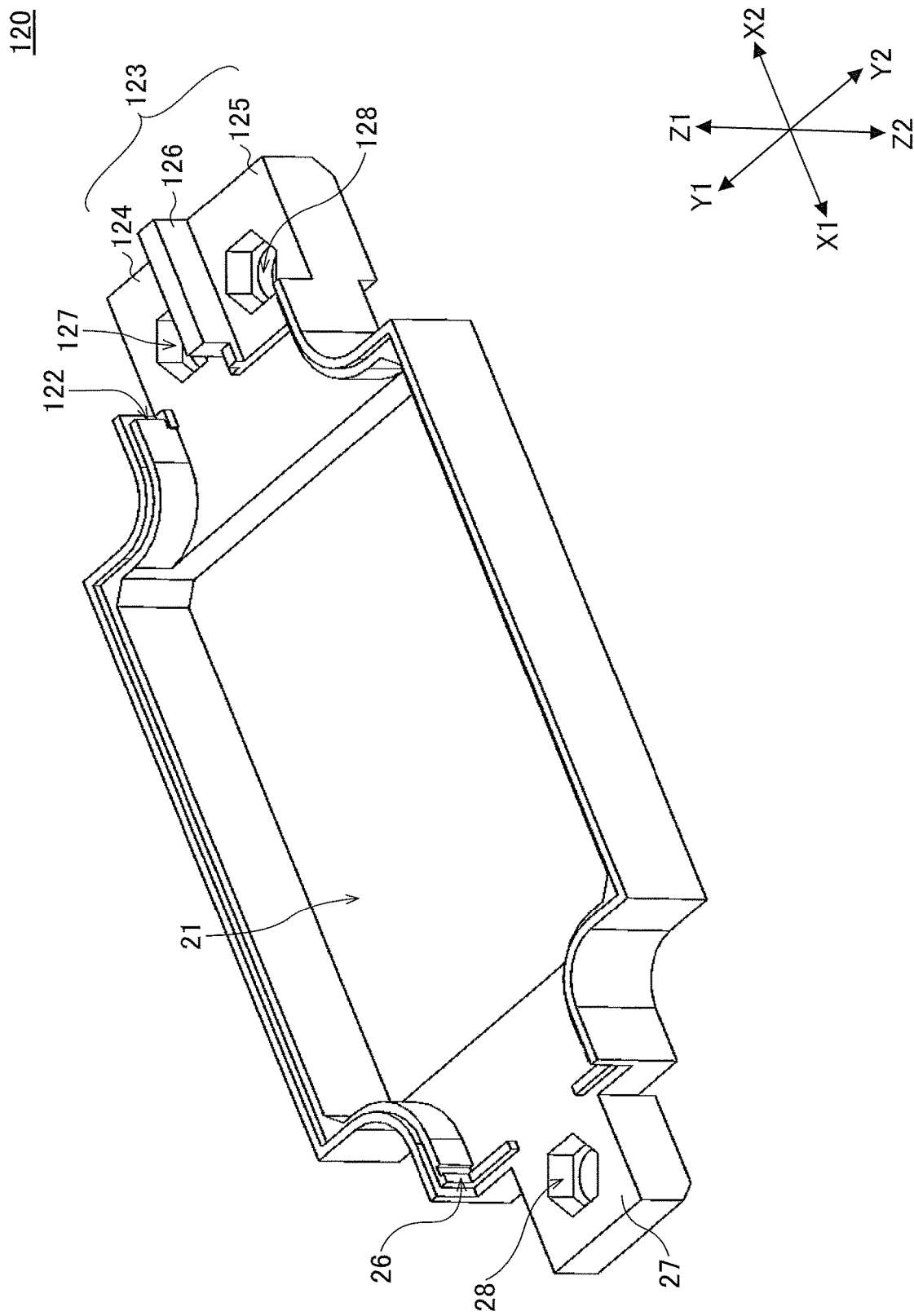
FIG. 40 is a perspective view of a housing of the second embodiment of the present disclosure.

As illustrated in FIG. 40, the housing 120 has a frame shape with the opening 21 passing through the central portion in the Z1-Z2 direction and is enclosed in the Y1-Y2 direction and the X1-X2 direction. A cutout portion 122 is formed in the housing 120 on the X2 direction side by cutting out a portion of the frame, and a supporting portion 123 extending in the X2 direction is provided on the X2 side from the cutout portion 122. A first extended region 124 is formed on the supporting portion 123 on the Y1 side, a second extended region 125 is formed on the Y2 side, and the second extended region 125 is higher to the Z1 side than the first extended region 124. A separation portion 126 that protrudes to the Z1 direction is formed between the first extended region 124 and the second extended region 125, and the first extended region 124 and the second extended region 125 are separated by the separation portion 126. In the first extended region 124 positioned on the Y1 side, a hexagonal hole 127 into which a nut (which is not illustrated) is to be inserted is provided, and in the second extended region 125 positioned on the Y2 side, a hexagonal hole 128 into which a nut (which is not illustrated) is to be inserted is provided. On the X1 direction side, a cutout portion 26 is formed by cutting out a portion of the frame. The supporting portion 27 extending in the X1 direction is provided on the X1 direction side from the cutout portion 26, and a hexagonal hole 28 into which a nut (which is not illustrated) is to be inserted is provided in the supporting portion 27.

Figure 41:
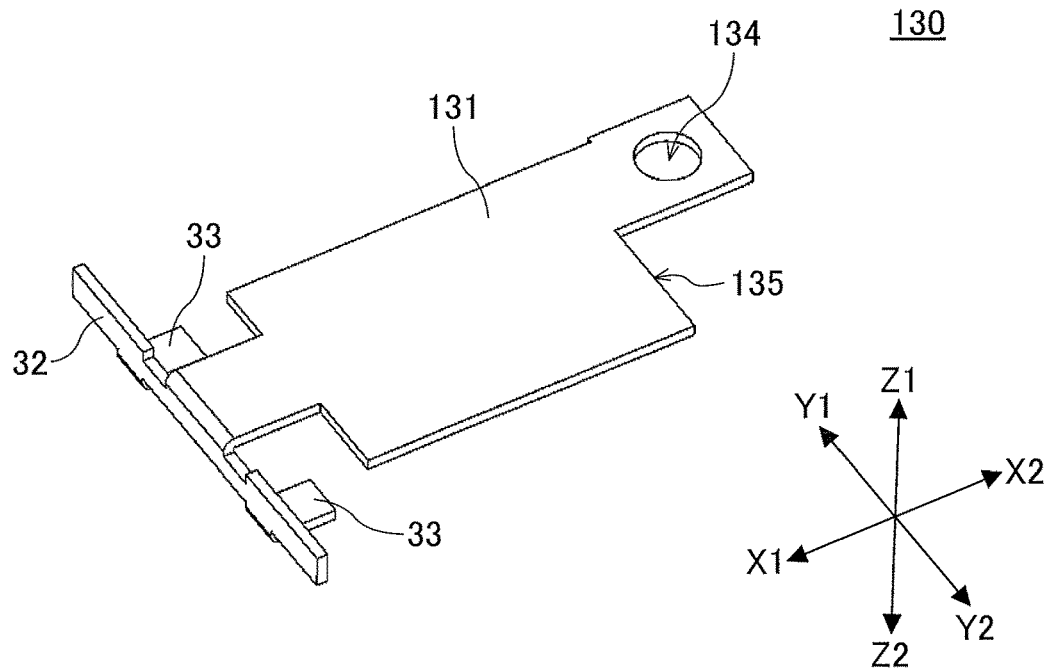
FIG. 41 is a perspective view of a P electrode of the second embodiment of the present disclosure.

As illustrated in FIG. 41, the P electrode plate 130 is formed by machining a metal plate such as copper having a thickness of approximately 1 mm, and the X1-X2 direction is a longitudinal direction of the P electrode plate 130. The P electrode plate 130 has a flat plate portion 131 parallel to the XY plane, and an end portion of the P electrode plate 130 on the X1 direction side is bent twice substantially at a right angle along the Y1-Y2 direction, so that the vertical portion 32 and the connecting portions 33 are formed in this order. The connecting portions 33 are substantially parallel to the flat plate portion 131, and the vertical portion 32 is formed between the flat plate portion 131 and the connecting portions 33. In the P electrode plate 130, a direction in which the vertical portion 32 is bent with respect to the flat plate portion 131 and a direction in which the connecting portion 33 is bent with respect to the vertical portion 32 is the same. In the flat plate portion 131 on the X2 direction side, a through-hole 134 is provided on the Y1 side, and an electrode cutout portion 135 is famed on the Y2 side by cutting out a portion of the flat plate portion 131. The through-hole 134 is a through-hole passing through the flat plate portion 131 in the Z1-Z2 direction and is circular.

Figure 42:
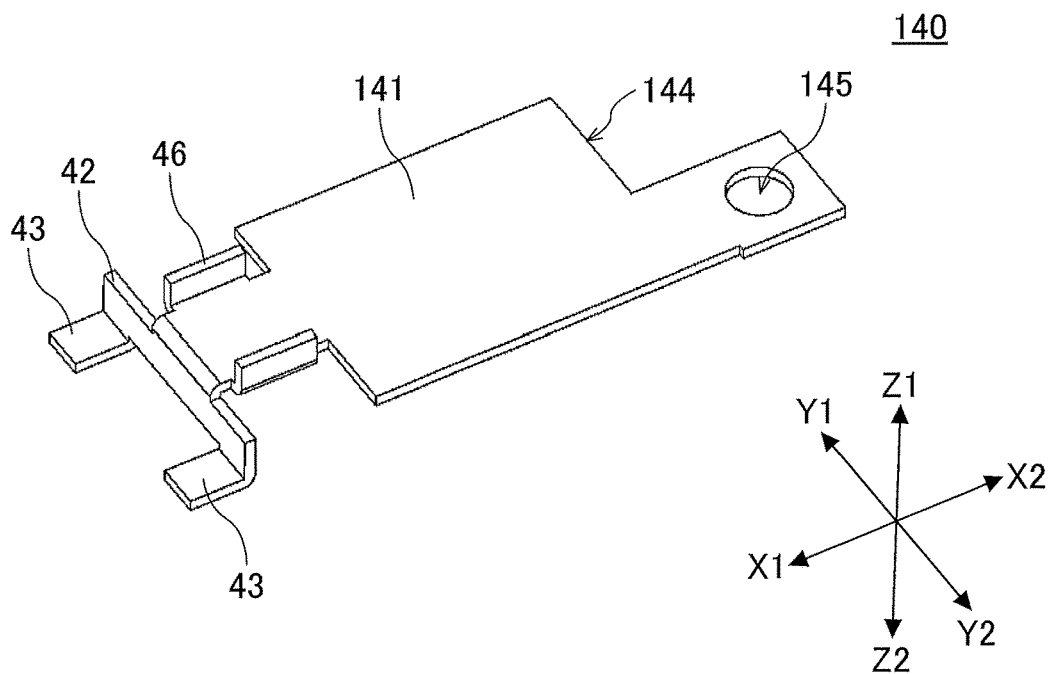
FIG. 42 is a perspective view of a N electrode of the second embodiment of the present disclosure.

As illustrated in FIG. 42, the N electrode plate 140 is formed by machining a metal plate such as copper having a thickness of approximately 1 mm, and the X1-X2 direction is a longitudinal direction of the N electrode plate 140. The N electrode plate 140 has a flat plate portion 141 parallel to the XY plane, and an end portion of the N electrode plate 140 in the X1 direction side is bent twice substantially at a right angle along the Y1-Y2 direction, so that the vertical portion 42 and the connecting portions 43 are formed in this order. The connecting portions 43 are substantially parallel to the flat plate portion 141, and the vertical portion 42 is formed between the flat plate portion 141 and the connecting portions 43. In the N electrode plate 140, a direction in which the vertical portion 42 is bent with respect to the flat plate portion 141 and a direction in which the connecting portion 43 is bent with respect to the vertical portion 42 are opposite. In the flat plate portion 141 on the X2 direction side, a through-hole 145 is provided on the Y2 side, and an electrode cutout portion 144 is formed on the Y1 side by cutting out a portion of the flat plate portion 141. The through-hole 145 is a through-hole passing through the flat plate portion 141 in the Z1-Z2 direction and is circular. Bent portions 46 bent in the Z1 direction by using the X1-X2 direction as an axis are formed on the Y1 direction side and the Y2 direction side of the flat plate portion 141 of the N electrode plate 140.

Figure 43:
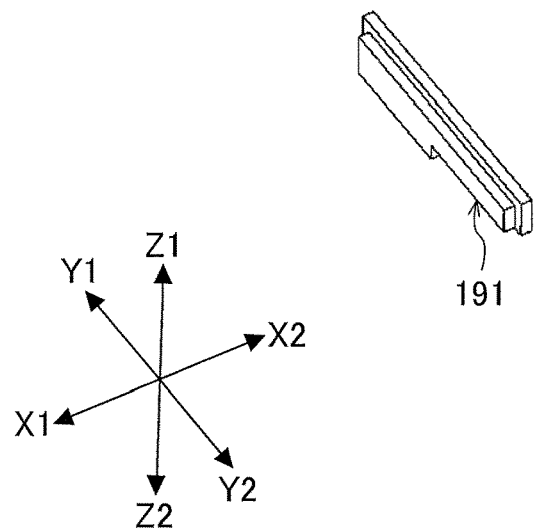
FIG. 43 is a perspective view of a blocking member of the second embodiment of the present disclosure.
Figure 44:
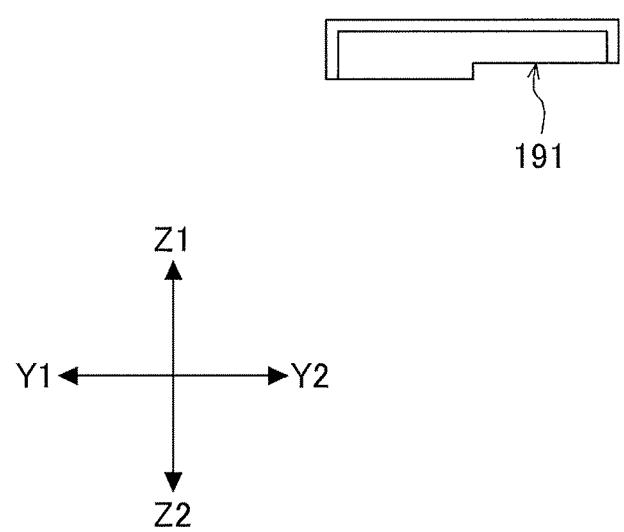
FIG. 44 is a side view of the blocking member of the second embodiment of the present disclosure.

As illustrated in FIG. 43 and FIG. 44, the blocking member 190 is formed of an insulating resin material and is formed in a plate shape so as to be inserted in the cutout portion 122 in a state in which the P electrode plate 130 and the N electrode plate 140 are inserted. FIG. 43 is a perspective view of the blocking member 190 and FIG. 44 is a plan view of the blocking member 190. The blocking member 190 is recessed on the Y2 side in the Z2 direction and a blocking member cutout portion 191 is provided. In the present disclosure, an area surrounded by the frame of the housing 120, the blocking member 90, and the blocking member 190 is described as the inside of the housing 120, and an area outside the frame of the housing 120, the blocking member 90, and the blocking member 190 is described as the outside of the housing 120.

(Manufacturing Process)

The semiconductor module in the present embodiment will be described based on a process of manufacturing the semiconductor module illustrated in FIGS. 45 to 50.

Figure 45:
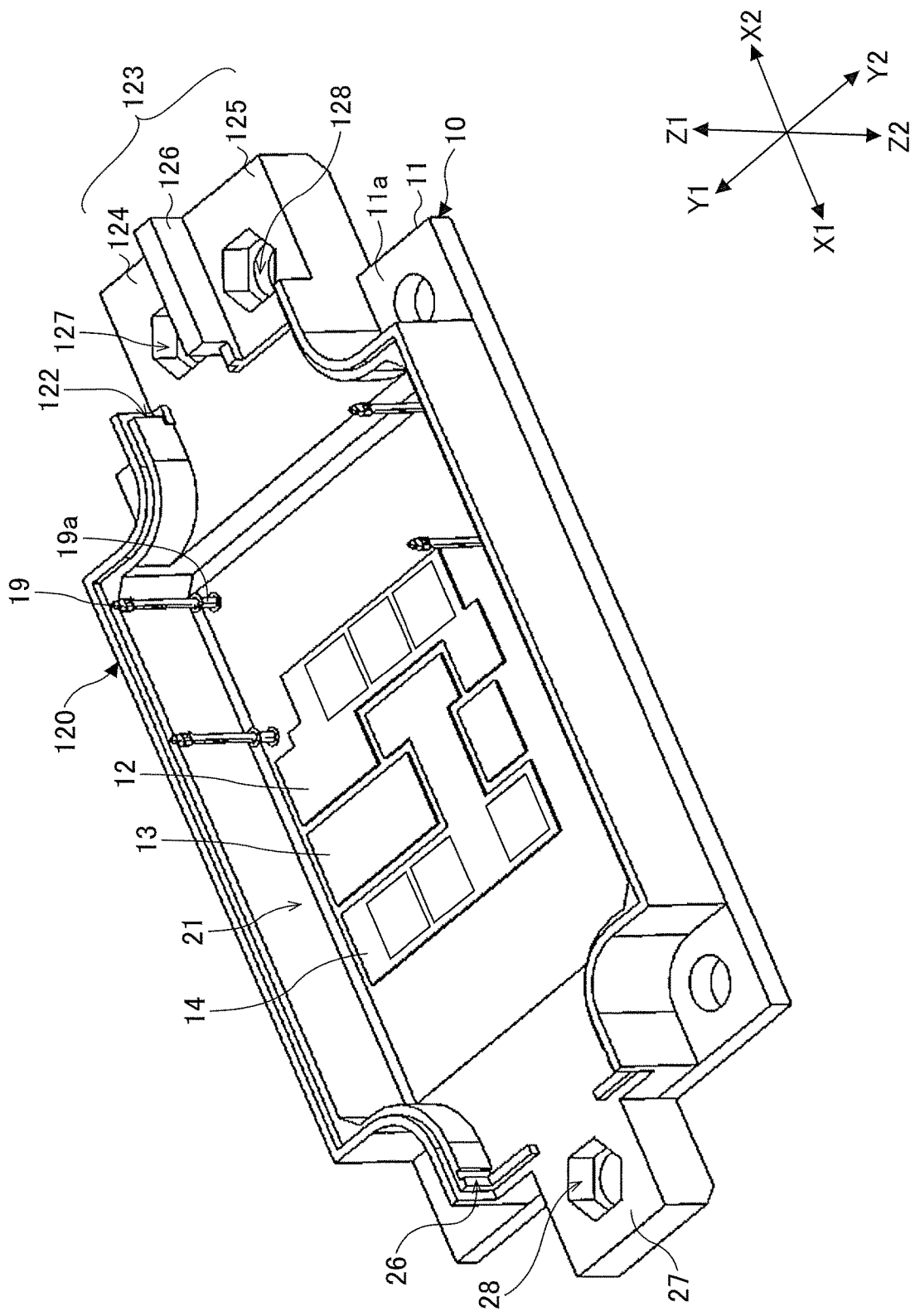
FIG. 45 is an explanatory drawing (1) of a process of manufacturing the semiconductor module of the second embodiment of the present disclosure.

First, as illustrated in FIG. 45, the housing 120 is bonded to the front surface 11a of the base plate 11 with an adhesive. The housing 120 is bonded to the front surface 11a of the base plate 11 such that the P electrode pad 12, the N electrode pad 13, the O electrode pad 14, the interconnect pattern, the press-fit pin 19, and the like are inside the opening 21 of the housing 120.

Figure 46:
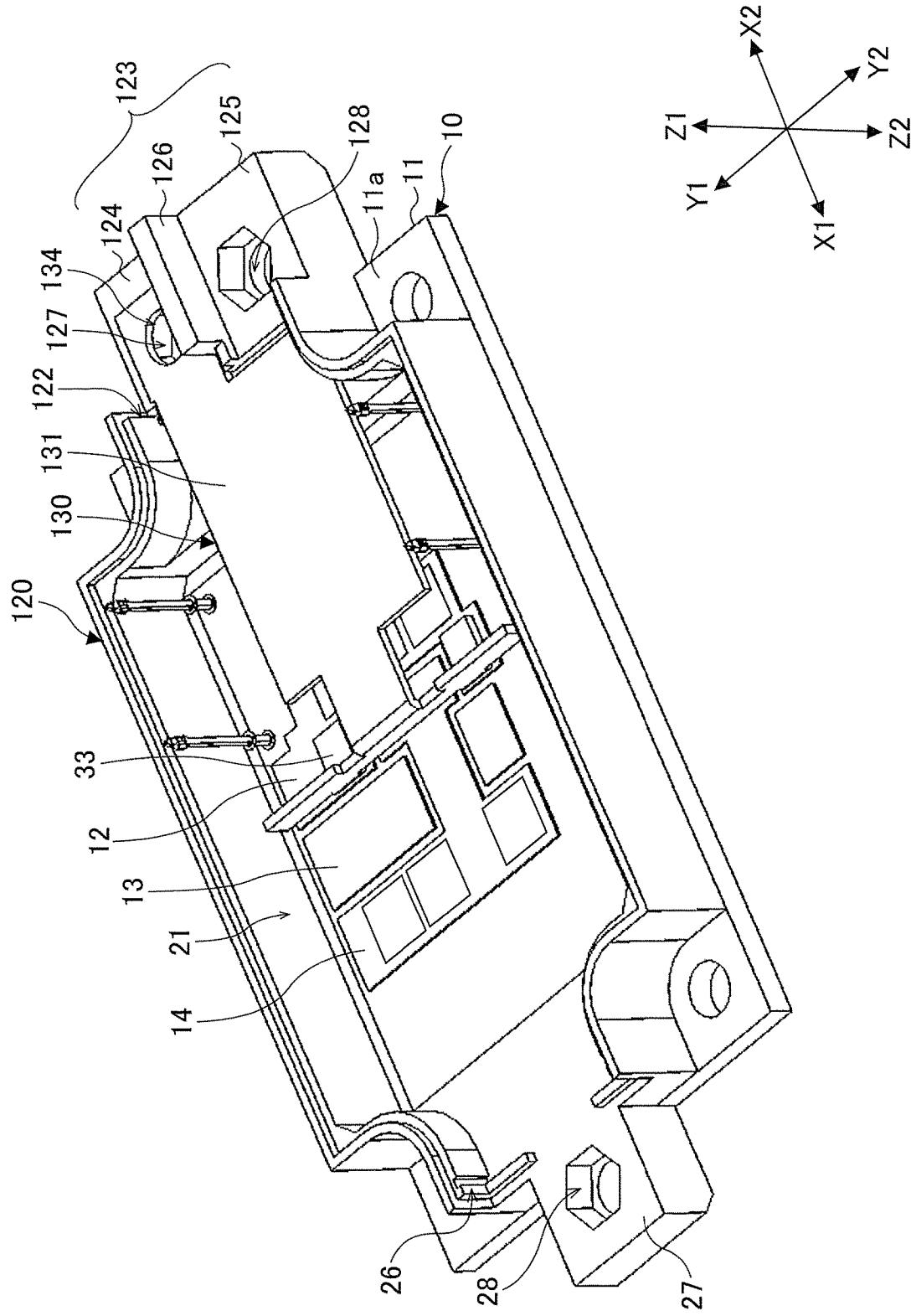
FIG. 46 is an explanatory drawing (2) of the process of manufacturing the semiconductor module of the second embodiment of the present disclosure.

Next, as illustrated in FIG. 46, the connecting portions 33 of the P electrode plate 130 are joined to the P electrode pad 12 by ultrasonic welding. The flat plate portion 131 of the P electrode plate 130 is provided so as to pass through the cutout portion 122 of the housing 120 on the Y1 side and extend from the inside of the housing 120 to the outside in the X2 direction, and a portion of the flat plate portion 131 on the X2 direction side is attached to the first extended region 124 of the supporting portion 123. In the present embodiment, the through-hole 134 of the P electrode plate 130 is positioned outside the housing 120, and the center of the hole 127 of the first extended region 124 of the supporting portion 123 is aligned with the center of the through-hole 134.

Figure 47:
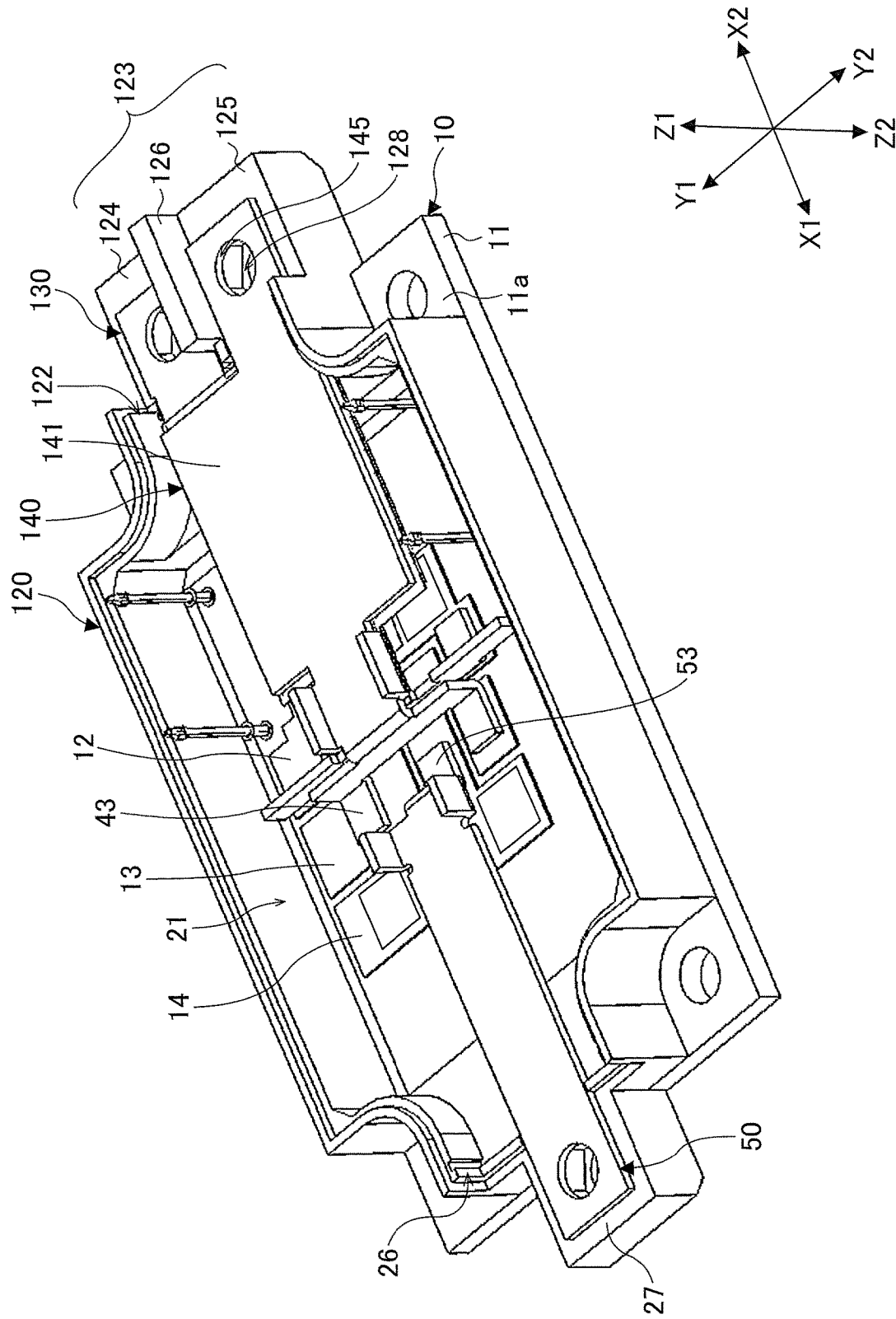
FIG. 47 is an explanatory drawing (3) of the process of manufacturing the semiconductor module of the second embodiment of the present disclosure.

Next, as illustrated in FIG. 47, the connecting portions 43 of the N electrode plate 140 are joined to the N electrode pad 13 by ultrasonic welding, and the connecting portion 53 of the O electrode plate 50 is joined to the O electrode pad 14 by ultrasonic welding. The flat plate portion 141 of the N electrode plate 140 is provided so as to pass through the cutout portion 122 of the housing 120 on the Y2 side and extend from the inside of the housing 120 to the outside in the X2 direction, and a portion of the flat plate portion 141 in the X2 direction side is attached to the second extended region 125 of the supporting portion 123. The second extended region 125 is higher to the Z1 side than the first extended region 124, and this height is equivalent to the sum of the thickness of the P electrode plate 130 and a space between the P electrode plate 130 and the N electrode plate 140, and is, for example, about 1.5 mm.

In the present embodiment, the through-hole 145 of the N electrode plate 140 is positioned outside the housing 120 and the center of the hole 128 of the second extended region 125 of the supporting portion 123 is aligned with the center of the through-hole 145.

Figure 48:
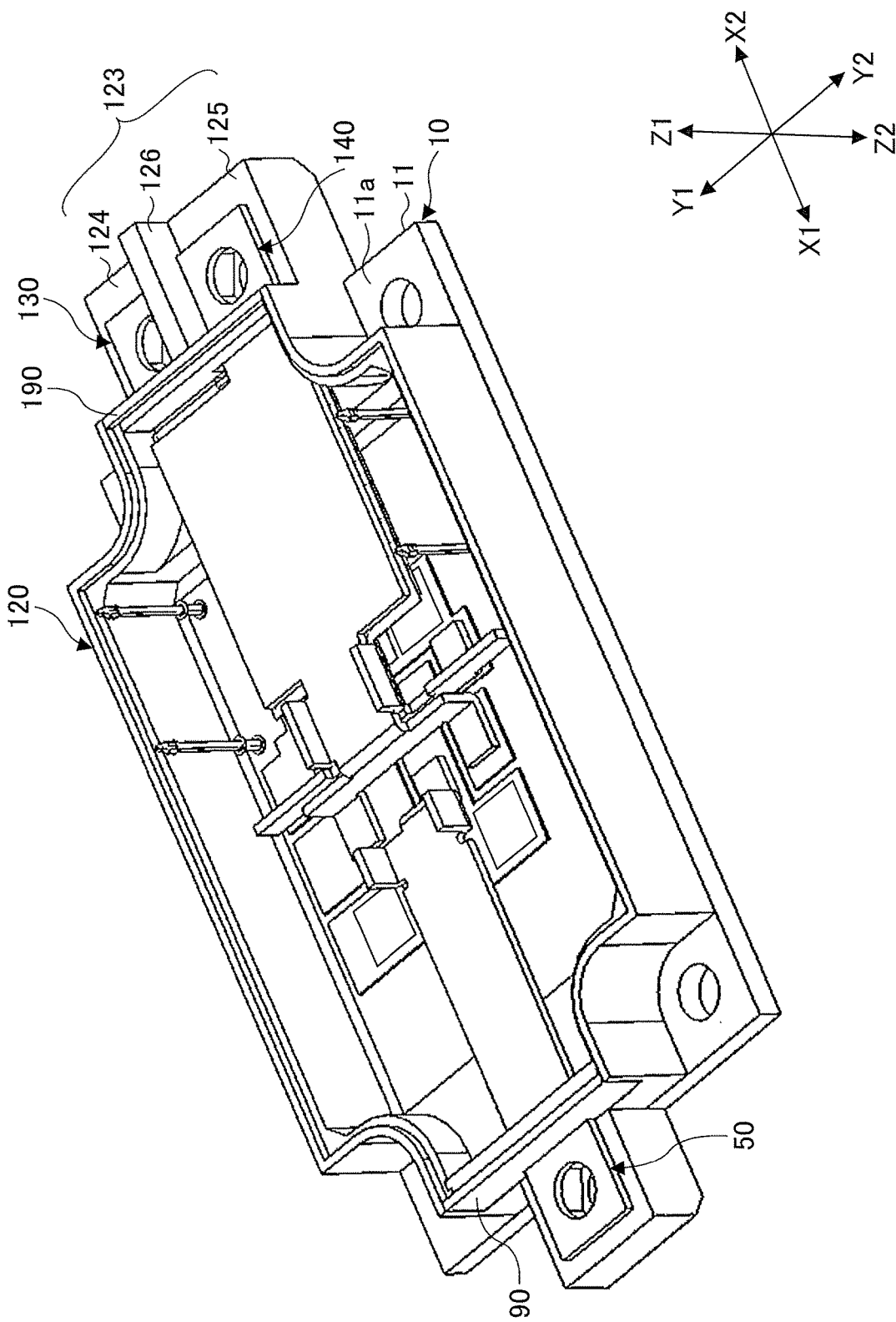
FIG. 48 is an explanatory drawing (4) of the process of manufacturing the semiconductor module of the second embodiment of the present disclosure.

Next, as illustrated in FIG. 48, the blocking member 190 is attached on the P electrode plate 130 and the N electrode plate 140 at the cutout portion 122 of the housing 120, and the blocking member 90 is attached on the O electrode plate 50 at the cutout portion 26 of the housing 120.

The blocking member 190 is bonded to the housing 120 by an adhesive and is in contact with the P electrode plate 130 and the N electrode plate 140 so as to cover the cutout portion 122 of the housing 120 in which the P electrode plate 130 and the N electrode plate 140 are inserted. The blocking member 90 is bonded to the housing 120 by an adhesive and is in contact with the O electrode plate 50 so as to cover the cutout portion 26 of the housing 120 in which the O electrode plate 50 is inserted.

Figure 49:
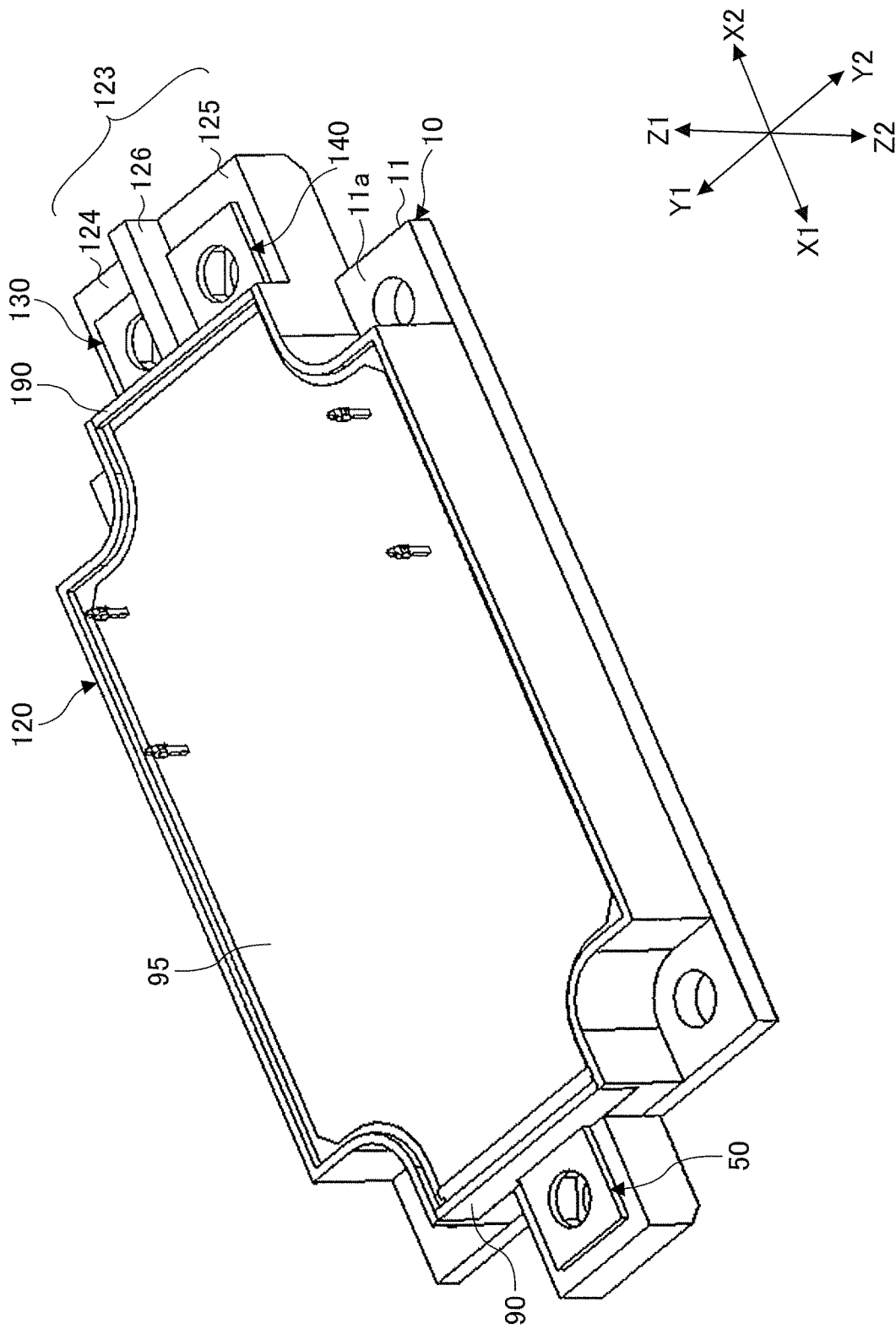
FIG. 49 is an explanatory drawing (5) of the process of manufacturing the semiconductor module of the second embodiment of the present disclosure.

Next, as illustrated in FIG. 49, the housing 120 is filled with the insulating resin material 95. When the resin material 95 is supplied into the housing 120, the resin material 95 expands as the resin material 95 flows through the housing 120. In the present embodiment, an open portion of the cutout portion 122 in which the P electrode plate 130 and the N electrode plate 140 are inserted is covered by the blocking member 190 being attached. An open portion of the cutout portion 26 in which the O electrode plate 50 is inserted is covered by the blocking member 90 being attached. Therefore, when the resin material 95 is supplied into the housing 120, the resin material 95 does not leak to the outside of the housing 120 from the X1 side or the X2 side.

Figure 50:
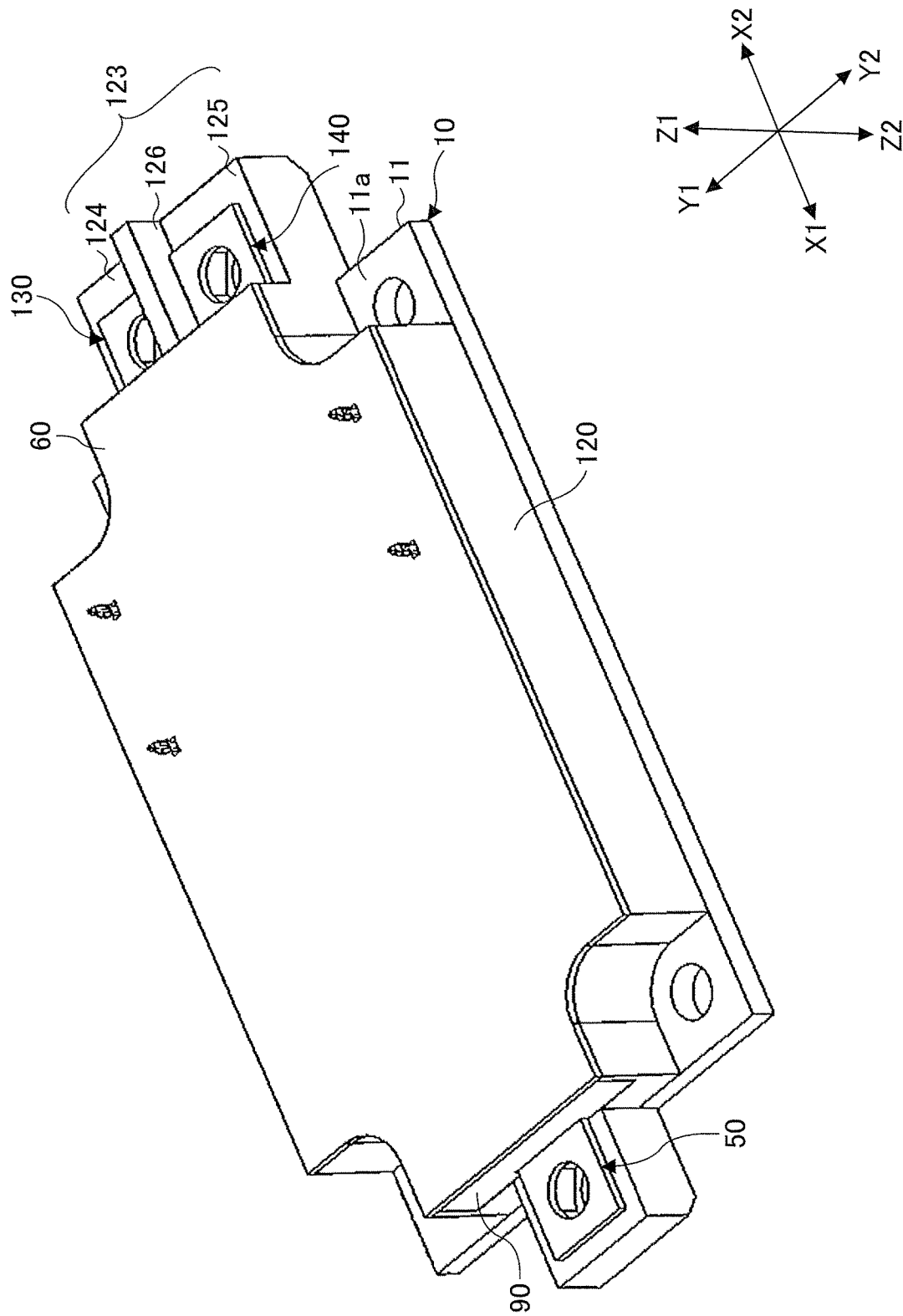
FIG. 50 is an explanatory drawing (6) of the process of manufacturing the semiconductor module of the second embodiment of the present disclosure.

Subsequently, the resin material 95 is cured, and the lid 60 is placed on the resin material 95, i.e., on the Z1 side of the resin material 95, as illustrated in FIG. 50.

In the semiconductor module according to the present embodiment, the P electrode plate 130 is connected to the P electrode pad 12, and the N electrode plate 140 is connected to the N electrode pad 13. In the present embodiment, as illustrated in FIG. 51, the flat plate portion 131 of the P electrode plate 130 and the flat plate portion 141 of the N electrode plate 140 are in a parallel-plate configuration within the housing 120, and a parallel-plate configuration is not formed outside the housing 120. That is, in an area on the X1 side from the blocking member 190, which is the inside of the housing 120, the flat plate portion 131 of the P electrode plate 130 and the flat plate portion 141 of the N electrode plate 140 are largely overlapped to be in a parallel-plate configuration. However, in an area on the X2 side from the blocking member 190, which is the outside of the housing 120, the flat plate portion 131 of the P electrode plate 130 and the flat plate portion 141 of the N electrode plate 140 do not overlap and are not in a parallel-plate configuration in a top view. In the present disclosure, the top view indicates being viewed from the Z1 side, which is a direction perpendicular to the XY plane.

In the present embodiment, the second extended region 125 is higher to the Z1 side than the first extended region 124 by a predetermined height, so that a space between the flat plate portion 131 of the P electrode plate 130 and the flat plate portion 141 of the N electrode plate 140 can be set as a predetermined space. This can reduce a component corresponding to the spacer in the first embodiment and reduce the cost of manufacturing the semiconductor module. In the present embodiment, the P electrode plate 130 and the P busbar (which is not illustrated) are connected on a surface of the P electrode plate 130 on the Z1 side, and the N electrode plate 140 and the N busbar (which is not illustrated) are connected on a surface of the N electrode plate 140 on the Z1 side. Therefore, the surfaces on which the P electrode plate 130 and the N electrode plate 140 are respectively connected to the corresponding P busbar and N busbar are on the same side, which is on the Z1 side, and it is easy to connect to the busbars.

Contents other than the contents described above are the same as the contents of the first embodiment.

Although the embodiments have been described in detail above, the embodiments are not limited to particular embodiments. Various alterations and modifications can be made within the scope of the subject matter recited in the claims.

DESCRIPTION OF THE REFERENCE NUMERALS 10 base member
11 base plate
11a front surface
12 P electrode pad
13 N electrode pad
14 O electrode pad
19 press-fit pin
20 enclosure
21 housing
22 cutout portion
23 supporting portion
24 hole
25 hole
26 cutout portion
27 supporting portion
28 hole
30 P electrode plate
31 flat plate portion
32 vertical portion
33 connecting portion
34 first through-hole
35 second through-hole
38 bolt
39 nut
40 N electrode plate
41 flat plate portion
42 vertical portion
43 connecting portion
44 first through-hole
45 second through-hole
46 bent portion
48 bolt
49 nut
50 O electrode plate
51 flat plate portion
52 vertical portion
53 connecting portion
54 through-hole
55 bent portion
60 lid
61 through-hole
70 spacer
70a a Z1 side surface
70b a Z2 side surface
71 first through-hole
72 second through-hole
73 insulation separating portion
74 insulation separating portion
80 cover
81 blocking portion
82 cover portion
83 through-hole
90 blocking member
95 resin material
96 insulation paper
100 circuit board
100a front surface
101 first transistor
102 second transistor
122 cutout portion
123 supporting portion
124 first extended region
125 second extended region
126 separation portion
127 hole
128 hole
130 P electrode plate
131 flat plate section
134 through-hole
135 electrode cutout portion
140 N electrode plate
141 flat plate portion
144 electrode cutout portion
145 through-hole
190 blocking member
191 blocking member cutout portion

The invention claimed is:

1. A semiconductor module comprising:
a base member including a circuit board on which a positive electrode pad and a negative electrode pad are provided and on which a semiconductor device is mounted to be electrically coupled to the positive electrode pad and the negative electrode pad;
a housing that is attached to the base member so as to surround the positive electrode pad and the negative electrode pad, the housing being formed in a frame shape;
a first electrode plate that is electrically coupled to the positive electrode pad, the first electrode plate having a flat plate portion; and
a second electrode plate that is electrically coupled to the negative electrode pad, the second electrode plate having a flat plate portion,
wherein the flat plate portion of the first electrode plate and the flat plate portion of the second electrode plate are arranged in a parallel-plate configuration within the housing.

2. The semiconductor module as claimed in claim 1, wherein the flat plate portion of the first electrode plate and the flat plate portion of the second electrode plate extend outside of the housing, and the flat plate portion of the first electrode plate and the flat plate portion of the second electrode plate are also arranged in a parallel-plate configuration outside the housing.

3. The semiconductor module as claimed in claim 2, wherein an insulating spacer is provided between the flat plate portion of the first electrode plate and the flat plate portion of the second electrode plate outside the housing.

4. The semiconductor module as claimed in claim 3,
wherein the housing is filled with an insulating resin material,
wherein a cutout portion is provided in the housing,
wherein the first electrode plate and the second electrode plate extend to the outside of the housing through the cutout portion, and
wherein a blocking member is attached to the housing, the blocking member covering the cutout portion into which the first electrode plate and the second electrode plate are inserted and blocking a flow of the resin material supplied into the housing.

5. The semiconductor module as claimed in claim 2,
wherein the housing is filled with an insulating resin material,
wherein a cutout portion is provided in the housing,
wherein the first electrode plate and the second electrode plate extend to the outside of the housing through the cutout portion, and
wherein a blocking member is attached to the housing, the blocking member covering the cutout portion into which the first electrode plate and the second electrode plate are inserted and blocking a flow of the resin material supplied into the housing.

6. The semiconductor module as claimed in claim 5, wherein an insulating member is provided between the flat plate portion of the first electrode plate and the flat plate portion of the second electrode plate within the housing.

7. The semiconductor module as claimed in claim 5, wherein the semiconductor device is formed of a material including silicon carbide.

8. The semiconductor module as claimed in claim 1, wherein the flat plate portion of the first electrode plate and the flat plate portion of the second electrode plate extend outside of the housing, and the flat plate portion of the first electrode plate and the flat plate portion of the second electrode plate do not overlap outside the housing in a top view.

9. The semiconductor module as claimed in claim 8,
wherein the housing is filled with an insulating resin material,
wherein a cutout portion is provided in the housing,
wherein the first electrode plate and the second electrode plate extend to the outside of the housing through the cutout portion, and
wherein a blocking member is attached to the housing, the blocking member covering the cutout portion into which the first electrode plate and the second electrode plate are inserted and blocking a flow of the resin material supplied into the housing.

10. The semiconductor module as claimed in claim 8,
wherein an insulating member is provided between the flat plate portion of the first electrode plate and the flat plate portion of the second electrode plate within the housing.

11. The semiconductor module as claimed in claim 8, wherein the semiconductor device is formed of a material including silicon carbide.

12. A semiconductor module comprising:
a base member including a circuit board on which a positive electrode pad and a negative electrode pad are provided and on which a semiconductor device is mounted to be electrically coupled to the positive electrode pad and the negative electrode pad;
a housing that is attached to the base member so as to surround the positive electrode pad and the negative electrode pad, the housing being formed in a frame shape;
a first electrode plate that is electrically coupled to the positive electrode pad, the first electrode plate having a flat plate portion; and
a second electrode plate that is electrically coupled to the negative electrode pad, the second electrode plate having a flat plate portion,
wherein the flat plate portion of the first electrode plate and the flat plate portion of the second electrode plate are arranged in a parallel-plate configuration within the housing,
wherein the flat plate portion of the first electrode plate and the flat plate portion of the second electrode plate extend outside of the housing, and the flat plate portion of the first electrode plate and the flat plate portion of the second electrode plate are also arranged in a parallel-plate configuration outside the housing,
wherein an insulating spacer is provided between the flat plate portion of the first electrode plate and the flat plate portion of the second electrode plate outside the housing, and
wherein an insulating member is provided between the flat plate portion of the first electrode plate and the flat plate portion of the second electrode plate within the housing.

13. A semiconductor module comprising:
a base member including a circuit board on which a positive electrode pad and a negative electrode pad are provided and on which a semiconductor device is mounted to be electrically coupled to the positive electrode pad and the negative electrode pad;
a housing that is attached to the base member so as to surround the positive electrode pad and the negative electrode pad, the housing being formed in a frame shape;
a first electrode plate that is electrically coupled to the positive electrode pad, the first electrode plate having a flat plate portion; and
a second electrode plate that is electrically coupled to the negative electrode pad, the second electrode plate having a flat plate portion,
wherein the flat plate portion of the first electrode plate and the flat plate portion of the second electrode plate are arranged in a parallel-plate configuration within the housing,
wherein the flat plate portion of the first electrode plate and the flat plate portion of the second electrode plate extend outside of the housing, and the flat plate portion of the first electrode plate and the flat plate portion of the second electrode plate do not overlap outside the housing in a top view,
wherein the housing is filled with an insulating resin material,
wherein a cutout portion is provided in the housing,
wherein the first electrode plate and the second electrode plate extend to the outside of the housing through the cutout portion,
wherein a blocking member is attached to the housing, the blocking member covering the cutout portion into which the first electrode plate and the second electrode plate are inserted and blocking a flow of the resin material supplied into the housing, and wherein an insulating member is provided between the flat plate portion of the first electrode plate and the flat plate portion of the second electrode plate within the housing.

\* \* \* \* \*